(12) United States Patent
Nyström et al.

(10) Patent No.: US 6,949,954 B2
(45) Date of Patent: Sep. 27, 2005

(54) METHOD AND APPARATUS FOR AN ASYNCHRONOUS PULSE LOGIC CIRCUIT

(75) Inventors: Mika Nyström, Pasadena, CA (US);
Alain J. Martin, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 10/693,543

(22) Filed: Oct. 24, 2003

(65) Prior Publication Data

US 2005/0007151 A1 Jan. 13, 2005

Related U.S. Application Data

(62) Division of application No. 10/269,255, filed on Oct. 11, 2002, now Pat. No. 6,732,336.
(60) Provisional application No. 60/328,647, filed on Oct. 11, 2001.

(51) Int. Cl.[7] ............................................. H03K 19/01
(52) U.S. Cl. .......................... 326/93; 326/26; 326/27; 326/83
(58) Field of Search ......................... 326/86, 83, 82, 326/26, 27, 59–60; 327/115, 118, 113, 202, 203, 208

(56) References Cited

U.S. PATENT DOCUMENTS

| | | | | |
|---|---|---|---|---|
| 5,559,453 A | * | 9/1996 | Covino et al. | 326/93 |
| 5,793,226 A | * | 8/1998 | Park et al. | 326/86 |
| 5,936,429 A | * | 8/1999 | Tomita | 326/82 |
| 6,152,613 A | * | 11/2000 | Martin et al. | 712/33 |
| 6,229,357 B1 | * | 5/2001 | Nair et al. | 327/115 |
| 6,356,117 B1 | * | 3/2002 | Sutherland et al. | 326/93 |
| 6,433,601 B1 | * | 8/2002 | Ganesan | 327/202 |

* cited by examiner

*Primary Examiner*—Vibol Tan
(74) *Attorney, Agent, or Firm*—Brown Raysman Millstein Felder & Steiner, LLP

(57) ABSTRACT

The present invention is a class of circuits named asynchronous pulse logic (APL) circuit and designing methods for such circuits. APL replaces two of the four-phase handshakes in QDI circuits with pulses, thus breaking the timing dependencies that cause performance problems in QDI circuits. Since the pulse length in APL varies so little, it can be assumed constant. This assumption frees designers from needing to consider the effects of the inputs and outputs on the pulse length, which means timing properties can be verified locally. One embodiment of the present invention is a class of circuit design called the single-track-handshake-asynchronous-pulse-logic (STAPL), which serves as a new target for the compilation of CHP (Communication Hardware Process) programs. In one embodiment, a five-stage pulse generator is used to create a 10 transition count cycle circuit. Advantages of STAPL include a simplified solution to the charge-sharing problem and less loading from p-transistors.

27 Claims, 41 Drawing Sheets

METHOD AND APPARATUS FOR AN ASYNCHRONOUS PULSE LOGIC CIRCUIT

This application is a divisional application of U.S. patent application Ser. No. 10/269,255, filed Oct. 11, 2002, now U.S. Pat. No. 6,732,336, which claims priority to U.S. Provisional Patent Application titled "Asynchronous Pulse Logic", No. 60/328,647, filed on Oct. 11, 2001, and is hereby fully incorporated by reference.

The invention was made by an agency of the United States Government or under a contract with an agency of the United States Government. The name of the U.S. Government agency is DARPA and the Government contract numbers DAAH 04-94-G-0274 and F29601-00K-0184.

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

1. Field of the Invention

The present invention relates to logical circuit design, and in particular the invention is directed to an asynchronous pulse logic circuit.

2. Background Art

VLSI (Very Large Scale Integration) system design is the process of implementing and realizing a system specification, the architecture, as an electronic circuit. We shall assume that the architecture is given to us and that the fabrication is not our concern. Longtime tradition divides the design process into two stages beyond computer architecture: implementation of the architecture by a micro-architecture and realization of the micro-architecture by a physical circuit design. The border is an artificial demarcation drawn for political purposes. The VLSI border traditionally serves to separate high-level logical reasoning from electronic-circuit design, tasks usually performed by different people, or at least by different software systems.

From Physics to Computer Science

It has slowly been realized that, as Carver Mead suggested, VLSI system design contains aspects of both software design and electrical engineering. In VLSI, the imagination of the mathematician and enthusiasm of the programmer finally meet with the pragmaticism of the engineer. c, we are told, is the speed limit; λ is the accuracy that we can build things with. But most of us would rather ignore the problems of others. So when we imagine and program a VLSI system, we do not allow c and λ to constrain our imagination or to damp our enthusiasm. We design our systems as if c and λ did not exist, and then we tell the engineer, "Implement this." When the wafers return, we say that the poor performance is not our fault: we cannot be blamed for any failure to deal with c and λ since we left this task to our friend, the engineer.

Asynchronous Digital Design

Poor performance is usually unacceptable for a VLSI system. Optimists have long studied asynchronous design techniques, hoping that they have found at least a partial solution to the design problem. While it is true that proponents of asynchronous design like claiming that asynchronous circuits offer speed and power advantages, the main advantage of asynchronous design is more subtle than these: it is the designer's ability of easily composing circuits that operate at different points in the design space (characterized by speed, power, and design effort) without destroying the beneficial properties of any of the circuits.

A system is asynchronous if, in short, it does not use a clock for sequencing its actions. What unites all methods of asynchronous circuit design is that they all strive for making the speed of computing dependent on the operations that are being carried out. A slow operation is allowed to take longer than a fast one; the system continues to the next operation only once the previous one is completed. It is as if we could assemble a troika consisting of an Arabian, a Shetland pony, and a draught horse, without losing the useful qualities of the individual horses. If we should try this with real horses, the harness would act much as the clock does in a synchronous system and render the exercise pointless. But the asynchronous troika may be able to pull its load better than even a well-matched synchronous team, because the horses are not harnessed together by the clock—the draught horse does not have to keep up with the Arabian, and we do not have to feed the big horses if we only have need for the pony. By allowing us to divide up a system into smaller, more independent pieces, the asynchronous design technique simplifies the large-system design problem.

Asynchronous Design-styles

In a synchronous system, it is easy to know when a computation is done. When the clock edge arrives, we read out the results of the computation. If it is not finished by then, we say that the system is wrong and throw it on the trash heap. (Or—less violently—adjust the clock speed.) The computation must necessarily be done by the time the clock edge arrives, or else the synchronous model would not make sense.

In contrast, the chief difficulty in asynchronous design is knowing when a specific computation is done. If we encode data in the same way as in a synchronous system, e.g., using two's—complement numbers, and start an operation, and the number "5" should appear on the result bus of our asynchronous system, how are we to know that it signifies the result of the present computation, and not of the previous? Worse, might it not be the bitwise combination of the results of the previous and current computations?

Bundled-data Design

The early asynchronous computers were designed in what we shall call the bundled-data style. Designing in this style, the designer assumes that he can build a delay that matches whatever the delay is of the computation that he is really interested in. This matched delay is used as an "alarm clock" that is started when $f(x)$ is started and that rings when we can be sure that $f(x)$ has been completely computed. The design style is called bundled data because the data travels in a "bundle" whose timing is governed by the control signal that we called the "alarm clock." As one might guess, arranging for the matched delay is the Achilles' heel of the bundled-data style. If the delay is too short, the system will not work; if too long, then it will work slowly. Especially if computation times are data-dependent, the matched delay can easily become a designer's nightmare. The matched delay mechanism's working rests on a form of a priori knowledge of relative timing; we shall call making use of such knowledge a timing assumption.

Delay-insensitive Design-styles

Originally conceived of at about the same time as the bundled-data design-style, delay-insensitive logic design attempts using the data bits themselves for sequencing. By making every input transition (change in logic level) cause, either in itself or within a cohort of input transitions, an output transition or a detectable pattern of output transitions, we can at least make interfaces between processes delay-insensitive.

Systems built using the delay-insensitive philosophy range from the speed-independent investigated by D. E. Muller in the 1950's, which work under the assumption that all wire delays are negligible compared with the operator delays (which may be of any length), to the truly delay-insensitive, in which both operator delays and wire delays may be arbitrary. Martin has shown that, using a reasonable operator model, truly delay-insensitive systems are of little use; the work in our research group has mainly been within the quasi delay-insensitive (QDI) model, which is essentially Muller's speed-independent model with information added for distinguishing between wires whose delays must be short compared with the operator delays and wires whose delays may be arbitrarily long.

Assembling a working system out of QDI parts is almost frighteningly easy: start from a correct sequential program, decompose it into communicating processes, compile these processes into circuits, put the pieces together, and everything works. The chief advantage of this design method is that once we have decomposed, the design style is completely modular: there is no implicit use of global information (i.e., no clock), and the different parts can be designed independently.

There is one difficulty with QDI design: the requirement that the circuits work properly even if all operator delays were to vary unboundedly is a difficult one to satisfy; our satisfying it involves inserting much circuitry whose only purpose is checking for the occurrences of transitions that we may know would in any case take place. We should say that QDI systems must still be designed "within reason": it is possible to make things not work by designing them very poorly; likewise, it still takes considerable work and skill to achieve good performance.

SUMMARY OF THE INVENTION

The present invention is a class of circuits named asynchronous pulse logic circuit (APL) and methods for designing such circuits.

The present invention is a design style that allows making use of limited amounts of timing information, i.e., limited use of timing assumptions, without destroying the most important, system-simplifying property of QDI design, namely that of the data's carrying its own timing information. The present invention does this by replacing two of the four-phase (return-to-zero) handshakes in a QDI circuit with pulses, thus breaking the timing dependencies that are the source of the performance problems of QDI circuits. One object of the present invention is that of improving the performance of modular asynchronous systems so much that it becomes possible to use asynchronous techniques for implementing large systems that perform well, yet are easy to design.

The APL scheme of the present invention takes a simple approach: we use a single-track external handshake, and we minimize the number of timing assumptions at the interfaces between processes; internally, in contrast, we design the circuits so that they generate predictably timed internal pulses. This is a separation of concerns: most of the variable parts of an APL circuit (i.e., those parts that vary depending on what CHP is being implemented) are arranged so that their delays do not matter much for the correct operation of the circuit; conversely, the pulse generator, whose internal delays do matter for the correct operation of the circuit, does on the other hand not vary much.

This is a great benefit from the invariability of the pulse length: since the pulse length varies so little (this is a different way of saying that the pulse repeater has a high length-gain), we commit only a minor infraction if we assume that the length is constant. The simplifying power of this assumption can hardly be overstated: once we have assumed that the pulse length is given, we need only verify that the circuitry generating the pulse and the circuitry latching the pulse work properly given that pulse length, and—this is the important part—we need not consider the effects of the inputs and outputs on the pulse length. This means that we can verify our timing properties locally. In effect, we have reduced a problem consisting of verifying the properties of the solution to a system of N coupled nonlinear equations into one involving N uncoupled nonlinear equations: we have gone from a task that seems insurmountable to one that is (in theory at least) easy.

One embodiment of the present invention is a class of circuit design called the single-track-handshake-asynchronous-pulse-logic (STAPL) circuit. STAPL serves as a new target for the compilation of CHP (Communication Hardware Process) programs. In STAPL circuits, the acknowledgement and data reset phases of the four-phase handshake protocol are removed. In place of these two phases is pulse generating circuitry that regulates timing assumptions that ensure the proper functioning of the circuits without these two phases. STAPL circuits have requirements that set the maximum single-track hold time and minimum single-track setup time of nodes in the circuits and guarantee that the minimum single-track setup time is greater than or equal to the maximum single-track hold time. In one embodiment, a five-stage pulse generator is used to create a 10 transition count circuit.

Embodiments of the present invention include essential circuitry such as arbiter, state-holding circuitry, buffers, conditional and unconditional communication components, all implemented in accordance to the STAPL design style.

An object of the present invention is to improve the ease of design in circuits. In terms of ease of design, STAPL circuits are shown to be as easy to design as their QDI counterparts. STAPL circuits are more sensitive to sizing. It is not clear how important this is for the designer, since QDI sizing must also be verified before fabrication.

Another object of the present invention is improved circuit performance. In terms of speed, STAPL circuits are undoubtedly faster than QDI circuits. An embodiment of the present invention is a microprocessor, called the SPAM processor, which demonstrates the gain in performance that can be achieved by using STAPL circuits. The embodiment shows that something as large as a microprocessor can be designed with circuits that all run at 10 transitions per cycle, whereas it would be very difficult to do so in less than 18 with only QDI circuits. The reason for the difference is that STAPL circuits remove many waits that are necessary for maintaining QDI protocols and replace them with timing assumptions. Furthermore, STAPL circuits load their inputs less than do QDI circuits, because they generally do not need the completion circuitry that is needed in QDI circuits. The SPAM processor parts that we have simulated run three times as fast as similar parts from the MiniMIPS, a well-known prior art microprocessor.

In terms of energy consumption, STAPL circuits have most of the paths that are present in QDI circuits. This is because the logic is the same and much of the output completion is the same. There is no input completion, nor are there acknowledge wires, but on the other hand, the QDI circuits do not have pulse generators. One metric of evaluation is to compare STAPL and QDI circuits using the $Et^2$ metric. This metric captures the fact that by our varying the supply voltage of a CMOS circuit, any speed improvement can be traded for roughly twice that improvement in energy. Hence, conservatively estimating on testing circuits shows ($E \mapsto 2E$, $t \mapsto t/3$) the improvement in $Et^2$ of STAPL circuits by a factor of about five. To first order, the change in $At^2$ would be about the same, where A is the area of the circuit.

Other advantages of STAPL circuits include a simplified solution to the charge-sharing problem and less loading from p-transistors (no input-completion circuitry in most cases, and even when it is present, it has no p-transistors).

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

Figure 1:
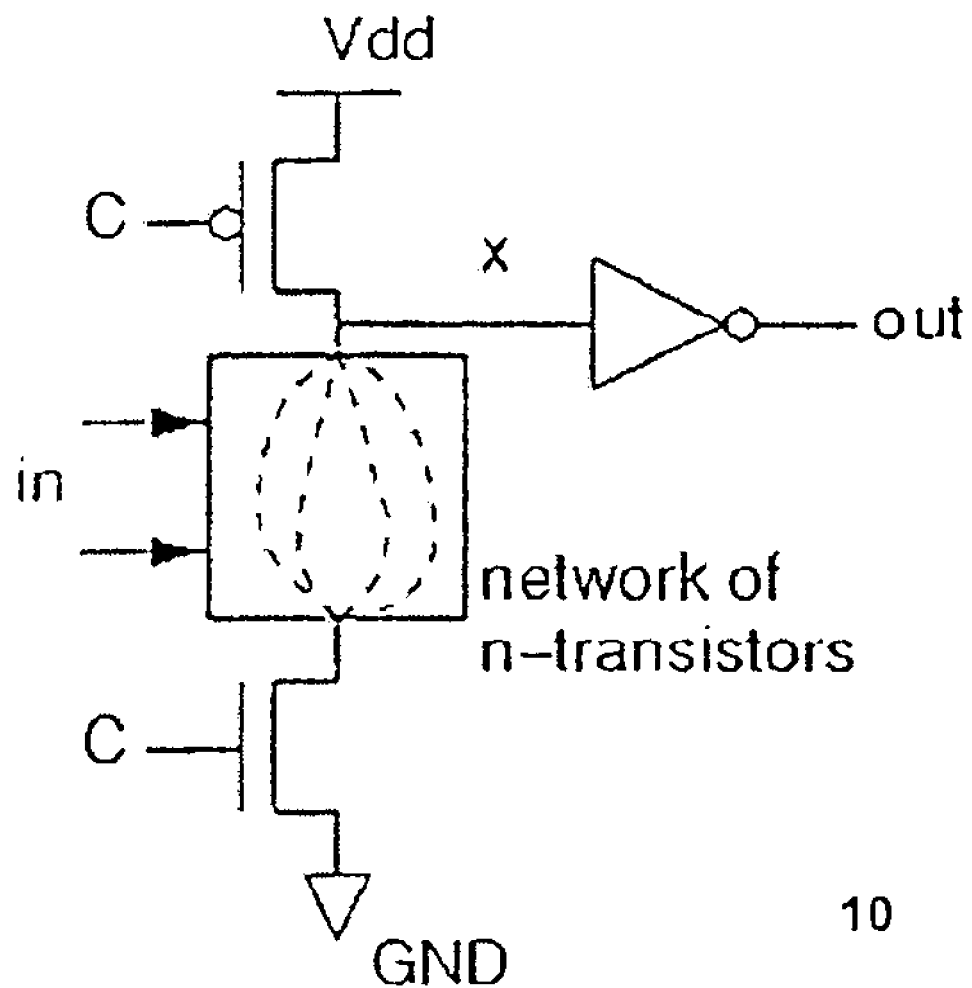
FIG. 1 is an example one-stage domino logic.

The present invention is an asynchronous pulse logic circuit and methods of designing such a circuit. Embodiments of the present invention comprise of a family of circuit design called the single-track-handshake-asynchronous-pulse-logic (STAPL) circuit. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

The present invention aims at establishing a new target for hardware designers. Embodiments are circuits designed according to an asynchronous, pulsed-logic design-style that depends on timing assumptions for working properly, which quasi delay-insensitive (QDI) circuits do not.

To describe the present invention, we shall use much of the same terminology and notation as QDI designers do. To wit, we shall compile circuits in the present invention starting from the Communicating Hardware Processes (CHP) language. We shall describe our communication protocols using the notation of the Handshaking Expansion (HSE) language used by QDI designers. We shall describe our transistor networks using the Production-Rule Set (PRS) notation.

Embodiments of the present invention are described in details in the following main sections:

1. Section 1 contains an embodiment that describes a theoretical basis that accounts for the proper functioning of pulsed asynchronous circuits. Some simple circuits are presented to illustrate properties of the theory.

2. Section 2 further illustrates properties of pulsed asynchronous circuits. In particular, the idea of asynchronous circuit using logic computations to carry timing information is discussed. The requirements of designing single-track asynchronous pulse circuits are presented. 6

3. Section 3 presents some simple embodiments of single-track-handshake-asynchronous-pulse-logic (STAPL) circuit. A bit generator and a bit bucket are presented first to show how internal pulses can be implemented. Then the bit generator and the bit bucket are combined into a left-right buffer, which forms the basis of the STAPL circuitry that has a complete cycle including sending and resetting pulses.

4. Section 4 further presents more advanced STAPL circuit components that are based on the template of the left-right buffer introduced in Section 3. Embodiments such as input/output channels, state holding apparatus and conditional communication components are described. These circuit embodiments serve as the essential components in a more complex circuit design.

5. Section 5 presents a 32-bit microprocessor design embodiment consisting of STAPL circuits. The design shows how to take advantage of the capabilities of the STAPL circuit family. In particular the idea of byte-skewing and a novel approach to building an incrementer is described.

Each main section also consists smaller sections that detail the finer specification of the circuit embodiments as well as the theoretical basis for such circuits.

Before the first section is presented, a few preliminary terminologies and methodologies are given to aid understanding of the present invention. They are: (1) High-Speed CMOS-circuits, (2) Asynchronous Protocols and Delay-Insensitive Codes, (3) Production Rules and (4) the Min-iMIPS processor.

High-Speed CMOS-circuits

With regard to this topic, we shall only cover a few issues in nomenclature. A basic CMOS domino-logic "stage" 10 is shown in FIG. 1. The part on the left of the figure is the "precharged domino" part of the circuit. When the control signal C goes low, the stage precharges—the node x rises and the output out falls. When C next goes high, depending on the values on the in wires, the domino may or may not "fall" (i.e., x may or may not fall to GND). The name "domino logic" comes from these circuits' ability of being cascaded within a single clock-phase in a synchronous system. Confusingly, while FIG. 1 depicts a single "domino stage," the same structure can also be called two "stages of logic"—the domino block plus the inverter. In the design style that we use, a block like this also implements an entire "pipeline stage"; i.e., cascaded dominos cycle independently (to an extent determined by the "reshuffling" of the handshake).

The important features of domino logic are as follows. There are few p-transistors; because of the much higher mobility in silicon of electrons compared with holes, this means that domino logic will usually be much faster than combinational logic, where pulling up the outputs has to be handled by the inputs. Furthermore, if we wish to cascade the dominos, each computation stage takes two logic transitions (one for the domino, one for the inverter)—this we call the forward latency of the stage; alternating "n-dominos" with "p-dominos" is possible, but the performance gain, if any, compared with standard domino logic, is small; owing to the many p-transistors in the p-dominos, this style can indeed be slower. An important drawback of domino logic is that it is more sensitive to different kinds of noise than combinational logic is.

In asynchronous circuits, the control transistor gated by C is sometimes replaced with several control transistors; this is necessary for accomplishing the more complicated synchronization that can be required by asynchronous data-transfer protocols.

Asynchronous Protocols and Delay-insensitive Codes

Asynchronous systems are based on handshaking protocols; i.e., two processes wishing to transfer data between each other synchronize the data transfers with signals that the processes themselves generate. It is most straightforward for us first to envision the handshake itself and then to add the data transfers in later. This way of designing things allows transferring data using conceptually simple protocols. One property that must be satisfied by the data is that it is encoded using a delay-insensitive code.

This means informally that the data encoding contains the same information that was present in the original "bare" handshake (i.e., data present or not-present) and that the data is encoded so that transitioning between the data present and not-present states is free from timing assumptions (i.e., it does not matter in which order the transitions are received). The most basic encoding that satisfies these conditions is the dual-rail encoding of a single bit

TABLE 1

Dual-rail encoding of one bit of data.

| Rail | Value | | | |
|---|---|---|---|---|
| x.0 | false | true | false | true |
| x.1 | false | false | true | true |
| Meaning | No data | x = 0 | x = 1 | Illegal | shown in Table 1; one that will also be seen often in the present invention is the 1-of-4 encoding of two bits.

Production Rules

In the present invention, we shall not generally describe circuits at the level of transistor netlists; this would be unnecessarily much detail. Instead, we shall use production rules. A production rule (PR) is a statement of the form G→x:=c where G is a boolean expression called the guard and the assignment x:=c is the command. In a production rule, c can only be true or false; nothing more complicated is allowed. We abbreviate x:=true as x↑ (read as "x up") and x:=false as x↓ (read as "x down"). At the circuit level, the effect of such an elementary assignment is a transition on x from a low to a high or from a high to a low voltage.

In a given system, we must necessarily have rules for the setting of each node x that transitions more than once both to true and to false; the combination of the two rules is called an operator In other words, an operator is a device with one or more inputs and a single output. The mapping from operators to circuit gates is fairly direct, but we do not consider it in detail in this work; nor do we consider layout issues in detail.

Before proceeding, it must be pointed out that although we use the same notation, our using timing assumptions means that we cannot ascribe quite the same semantics to HSE and PRS as we can in QDI designs. We shall have more to say about this later; in short, we disallow "stuttering" in HSE and we shall use a timed execution model for production rules instead of the weakly-fair-interleaving model that can be used for QDI circuits.

The MiniMIPS Processor

The MiniMIPS processor, designed by the Caltech group during 1995–1998, represents the state of the art in QDI asynchronous design today.

The MiniMIPS processor consists of two million transistors; it has been fabricated in 0.6-$\mu$m CMOS, and in this technology, it runs approximately 170 MHz at the nominal process voltage (3.3 V).

A few notable features of the MiniMIPS processor are the following:

Almost complete reliance on QDI circuits. (The exceptions are the low-level implementation of the cache-write mechanism and the off-chip bundled-data asynchronous interface.)

Extensive use of 1-of-4 data-encoding to minimize completion delays and save switching power.

Use of pipelined completion to minimize completion delays. Using pipelined completion results in a processor that can be thought of as an array of byte-slice processors, with a minimum of synchronization between the byte slices. The QDI model, which we used to verify that the design is correct, refuses to deal in delays; hence we know that the processor would work for a wide range of delays, and we simply try to pick those delays that shall result in the most efficient (i.e., the fastest) implementation. Thus the byte-slice processors nevertheless operate in synchrony most of the time, and we receive the benefits of a highly concurrent design with short, well-matched delays without paying the price of having to impose unwanted synchronization throughout our design model.

Universal use of precharged, pseudo-static domino-logic.

A deeply pipelined design with buffering in every domino stage. The processor can execute many programs at an average speed of 18⅔ logic transitions per fetch cycle.

With these preliminary methodologies in place, we move section 1 to describe the theory behind asynchronous pulse logic.

1 Asynchronous Pulse Theory

The barrier that prevents QDI circuits from achieving higher performance lies in the QDI handshake. By insisting on the four-phase handshake, e.g.,

*[. [$l_i$]; (compute outputs); $l_o$↑; [¬$l_i$]; $l_o$↓], we demand that any process in our system shall, after it has acknowledged receipt of its inputs, wait for those inputs to reset to neutral. This is expensive because checking inputs' neutrality is done in p-transistors: hence it must be decomposed into several stages, and it also loads the inputs heavily. (Of course, switching to inverted logic does no good since then computing the outputs and checking the validity of the inputs must instead be done in p-transistors, which would be even worse than before.) The most trivial four-phase-handshaking QDI circuit takes ten transitions per cycle, and anything nontrivial takes 14; inescapably, the complicated control-processes take 18. (These numbers are taken from the MiniMIPS specification and Andrew Lines's work.)

What is desired is a design style that combines the straightforward logic of four-phase QDI with the timing of two-phase logic. It turns out that most QDI circuits that have been designed can be sped up considerably by introducing weak timing-assumptions, without having to rethink the high-level design. The reason for this is simple: while using a four-phase handshake for implementing two synchronization actions is certainly possible (indeed, this technique is used in some special circuits), this is not commonly done. In the data processes used in the MiniMIPS, it is never done. Hence, out of the four phases of the four-phase handshake, only two are used: send and acknowledge. The remaining two, resetting the data and resetting the acknowledge, are not used for synchronization. These phases are entirely super from the point of view of the specification.

Thus embodiments of the present invention are constructed based on the following premise. In a four-stage handshake, each phase consists of two actions: an assignment and the wait for that assignment. The present invention makes use of the phases' being super by eliminating the waits, even though it keeps the assignments. By removing the waits, the synchronization behavior of two-phase handshaking is obtained; but by keeping the assignments, the encoding properties of four-phase is kept intact.

What is being implemented is a protocol that allows communicating circuits to reset their interface nodes in parallel. In other words, once an input is acknowledged, it is assumed it will reset "quickly." This achieves the desiderata: the inputs may still always be in positive logic, yet their synchronization behavior will have many of the characteristics of two-phase signaling, since we only wait for the first phase of the inputs. Waiting for the first phase of the inputs is anyway normally required for computing the outputs, so what remains will definitely be closer to optimal.

Embodiments of the present invention accomplish the timing requirement by using pulsed circuits. This section presents a few simple pulsed circuits to illustrate the basis of a theory that is used to account for the proper functioning of a wide class of pulsed circuits.

1.1 The Pulse Repeater

The first pulsed asynchronous circuit that is presented is the "pulse repeater." A pulse repeater copies input pulses to its output. While this function could be performed by a wire or an open-loop amplifier, the pulse repeater has feedback; using the feedback, it restores the quality of the signals, both in the time domain and the voltage domain.

Figure 2:
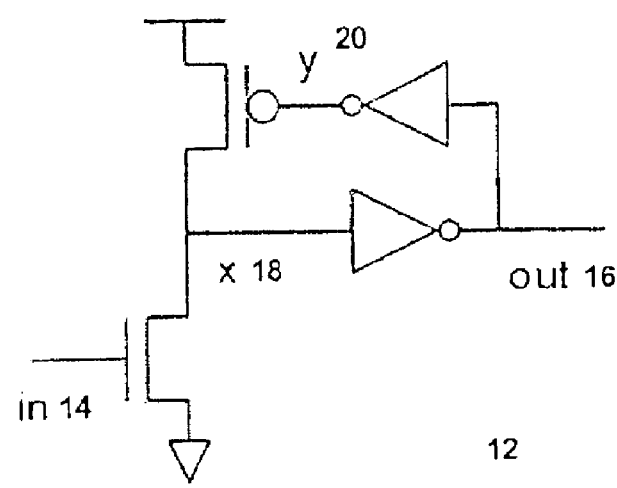
FIG. 2 is an example three-stage pulse repeater.

The circuit in FIG. 2 is a simple three-stage pulse repeater 12. In its idle state, both the input and the output are at a logic zero, and the internal node x 18 is at a logic one; this is the only stable state of the circuit. When the input voltage is raised towards a logic one, the voltage on x 18 begins to fall; which then causes out 16 to rise, and finally, at least if in 14 has meanwhile returned to zero, x 18 to rise back to the idle state. The circuit can misbehave if in 14 remains at a logic one for too long. Embodiments of the present invention in this section are directed at (1) characterizing this misbehavior and (2) finding ways of avoiding it.

In the three-stage pulse repeater, the node out 16 (when repeaters are cascaded, in 14 is a neighbor's out 16) is driven by an inverter, as is the node y 20. We shall see that, even as we introduce more and more dynamic nodes for handling complicated protocols, there will be nodes that shall remain driven by combinational logic. These nodes do not offer much opportunity for computing, so we shall direct our attention to the node x.

Figure 3:
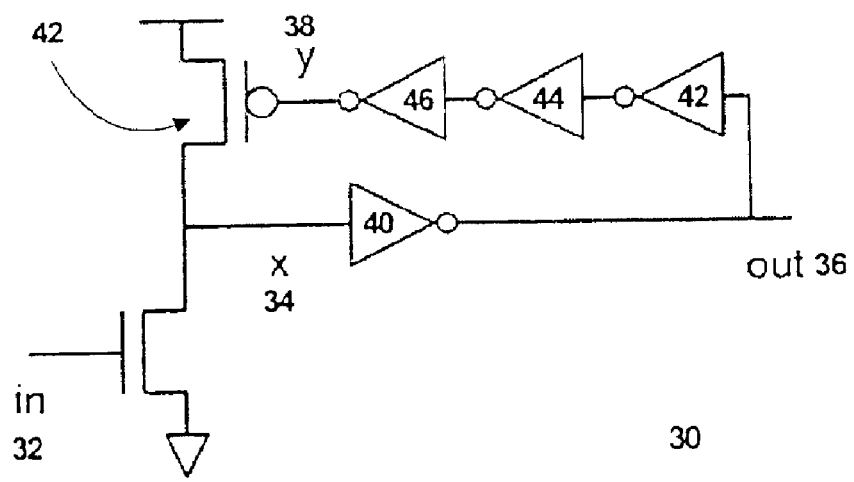
FIG. 3 is an example five-stage pulse repeater.

A few variants of the pulse-repeater design, as described above, has been simulated with input pulses of varying lengths and heights applied. These simulations illustrate the timing margins of the pulse repeater. The repeaters that were simulated are similar to the simple three-stage version described above. The differences are that the input and output were negative-logic (i.e., the input transistor is a p-transistor) and that "keeper" resistors were used on the x nodes. We shall see the results for two separate circuit designs: a three-stage version, and a five-stage pulse-repeater 30 that differs only in two extra inverters' being used in the feedback path from x to y, shown in FIG. 3. FIG. 3 is an example five-stage pulse repeater. We have nodes x 32, y 38. Inverters 40, 42, 44 and 46 ensure we have a five-stage count.

1.2 Timing Constraints in the Pulse Repeater

The pulse repeater is a difficult circuit to get working reliably, owing to the timing assumptions that are necessary for verifying its correctness. If we will ensure that a pulse on in is noticed by the repeater, we must arrange that its length exceed some minimum. On the other hand, the pulse must not be too long; if it is, then the circuit may produce multiple outputs for a single input. (Depending on device strengths, it may instead stretch the output pulse.

Figure 4:
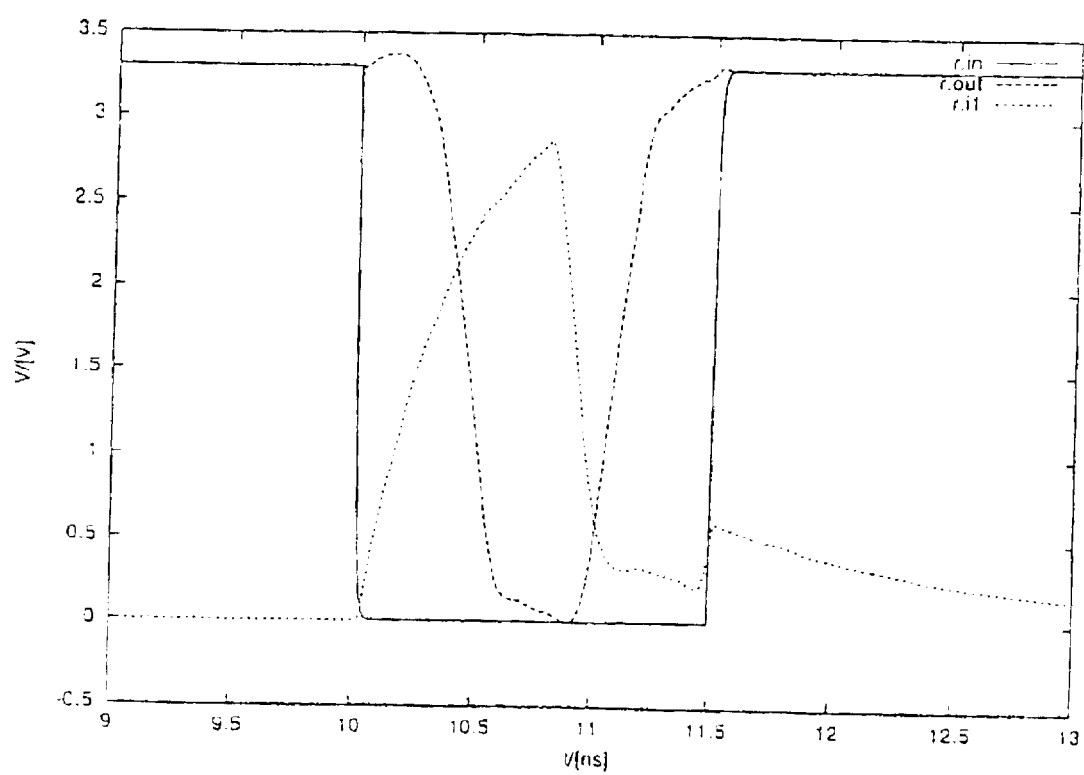
FIG. 4 is a voltage graph that shows how a long pulse almost triggers a pulse repeater twice.

Two things can go wrong with the pulse repeater. The input pulse can be too weak for the circuit to detect it, or the input pulse can be of such long duration that it is detected as multiple pulses. An example of a pulse repeater on the verge of misbehaving owing to a too-long input pulse is shown in FIG. 4, which is a voltage graph. The nodes are labeled as follows: input, r.in; internal node, r.i1; output, r.out; their senses are inverted compared with the pulse repeaters in the text. Here the input pulse is 1.5 ns long, beginning at t=10 ns.

As we can see from the graph, the internal node r.i1 starts rising almost instantly, causing the output to fall about 200 ps later. At t=11 ns, the internal node rises again, thus re-arming the circuit. Slightly before t=11.5 ns, the re-armed circuit starts detecting the input—which has by now overstayed its welcome—as a second pulse, but the detecting transistor is cut off by the input, which falls back to GND barely in time to avoid being double-latched.

Figure 5:
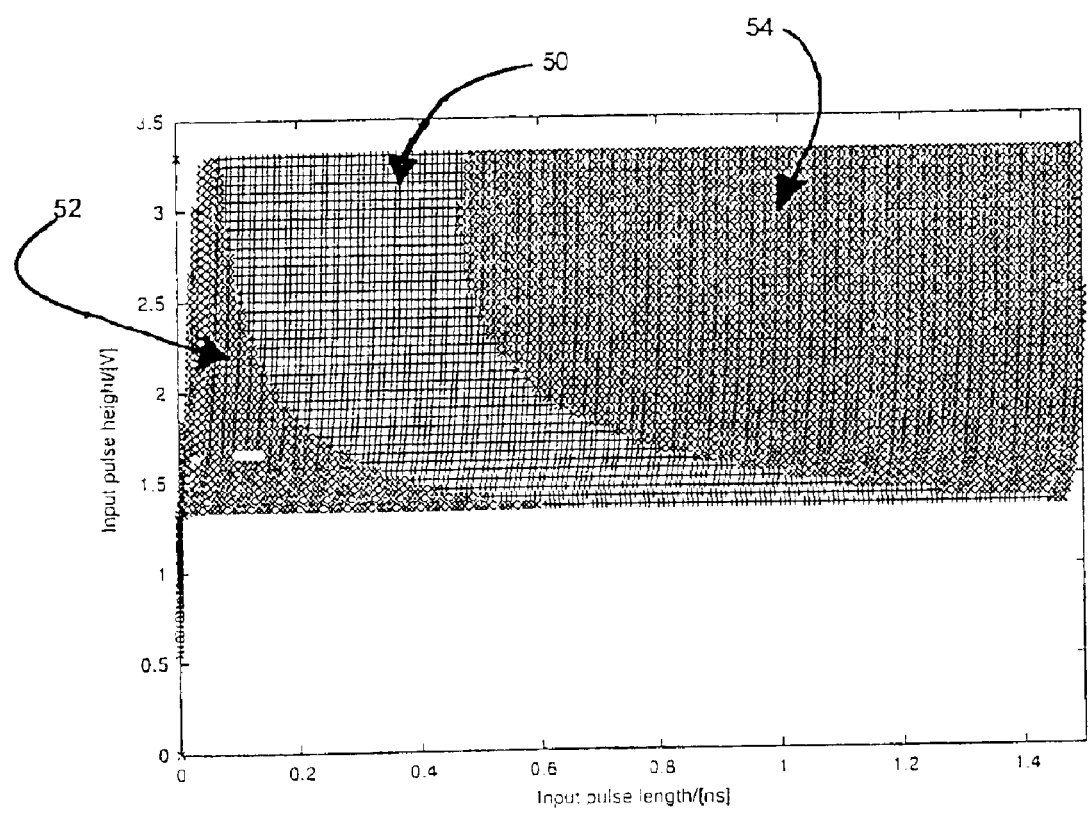
FIG. 5 is a Shmoo plot for three-stage pulse repeater.

FIG. 5 is a Shmoo plot for three-stage pulse repeater. FIG. 5 shows the results of applying pulses of varying lengths and heights to the three-stage pulse repeater. The pipe-shaped region 50 shows when a single input pulse results in a single output pulse, as desired. The other two regions (52 and 54) correspond to forms of misbehavior: the region to the right of the pipe (54) shows when a single input pulse results in several output pulses, i.e., when the input pulse is too long to be properly detected as a single pulse; the region to the left of the pipe (52) shows when the input pulse is too feeble to elicit any response at all. (The gaps in the plot are due to irrelevant practical difficulties with the simulations.)

Figure 6:
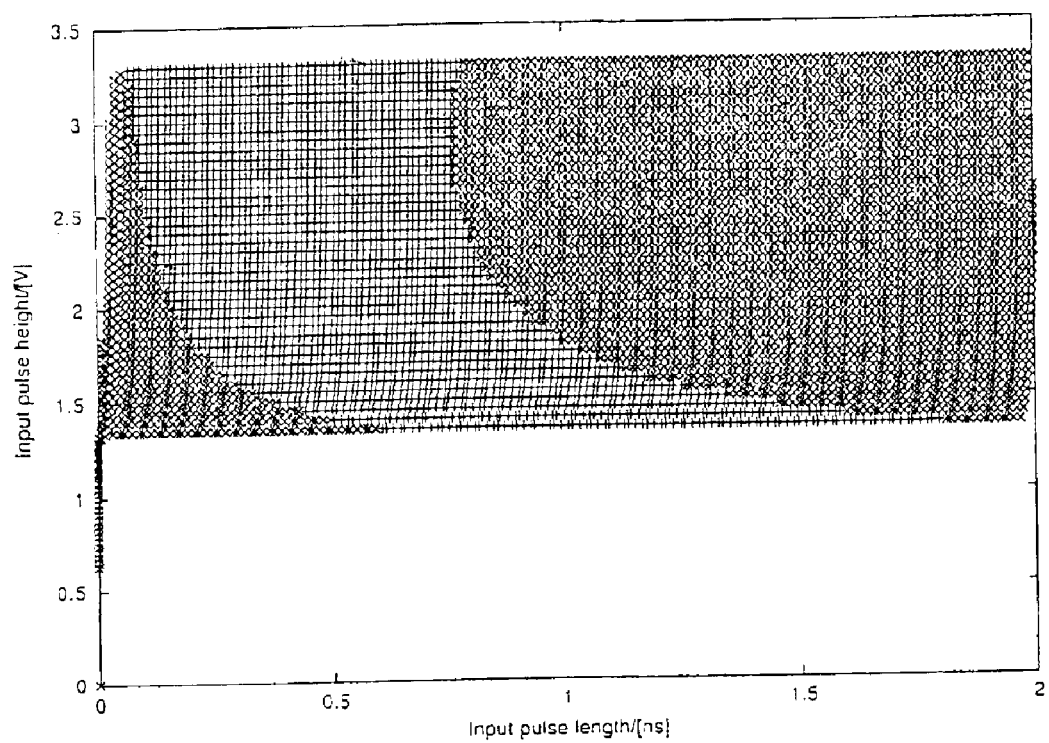
FIG. 6 is a Shmoo plot for five-stage pulse repeater.
Figure 7:
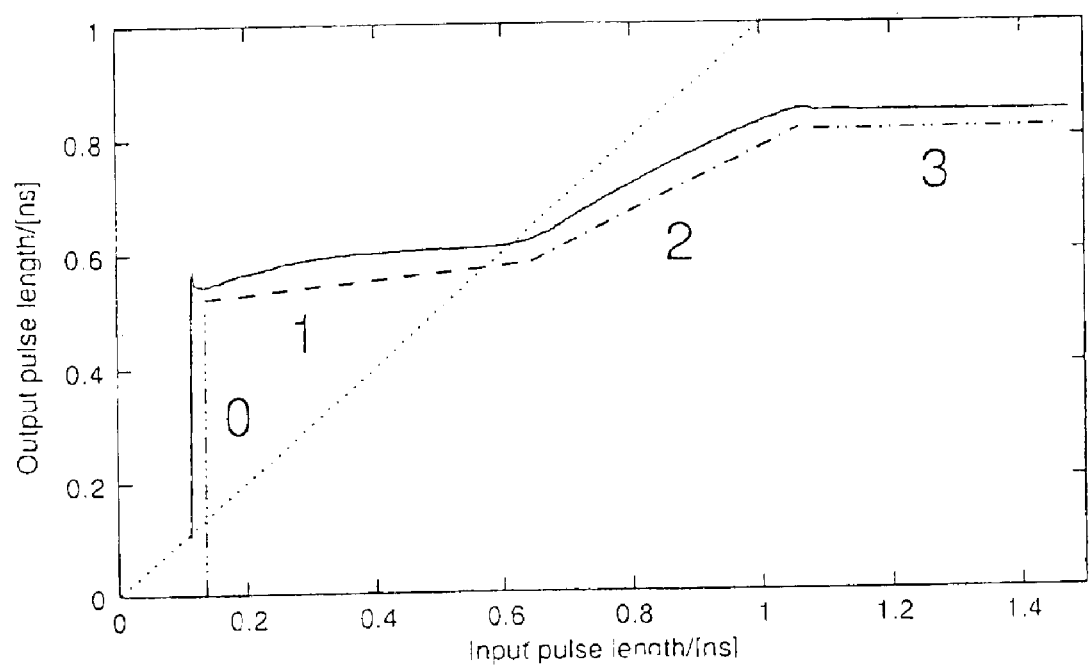
FIG. 7 is a voltage graph that shows the input-output relationship of pulse lengths for five-stage pulse repeater.

FIG. 6 is a Shmoo plot for five-stage pulse repeater. FIG. 6 shows the results for the five-stage pulse repeater. FIG. 7 is a plot that shows the input-output relationship of pulse lengths for five-stage pulse repeater. It shows a plot for the five-stage pulse repeater of the length of the output pulse for different lengths of the input pulse, the input swing here being from GND to Vdd. This particular circuit stops working for input pulses longer than 1.47 ns. The solid line shows the data; "0," "1," "2," and "3" indicate operating regions explained below. The diagonal dashed line in FIG. 7 denotes the stability constraint that the output pulse is as long as the input pulse; we should expect that in an infinite chain of pulse repeaters, the pulses will eventually have the parameters implied by the intersection of the input-output curve and the stability constraint.

1.3 Analysis of Pulse Repeater Data

Figure 8:
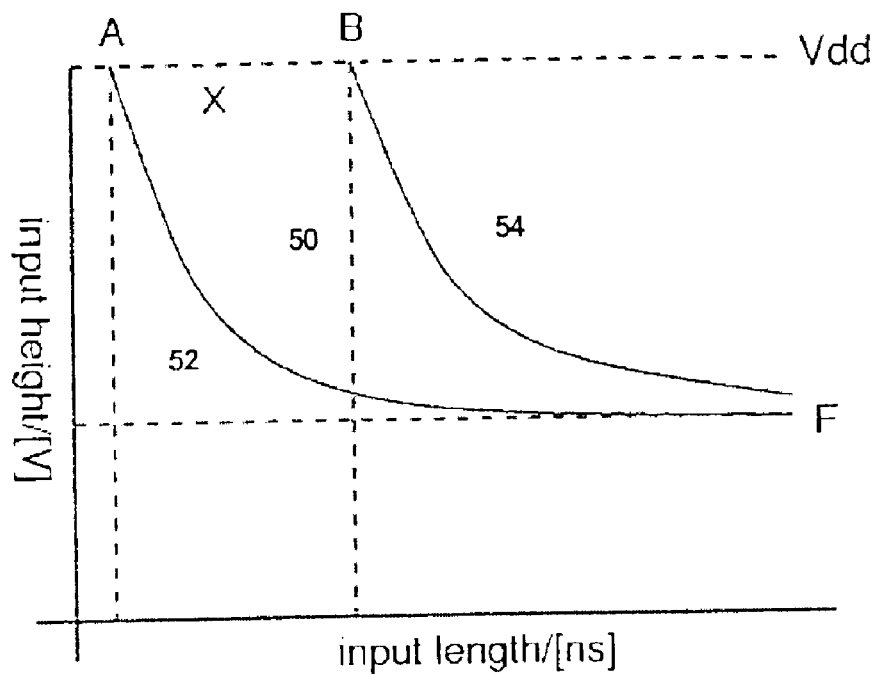
FIG. 8 is a qualitative interpretation of shmoo plots of FIG. 5 and FIG. 6.

The "shmoo" plots, FIG. 5 and FIG. 6, are caricatured in FIG. 8, which is a qualitative interpretation of the two shmoo plots. Normally, if the input pulse is of a reasonable height and length, then the gain of the pulse repeater will force the output pulse to be approximately characterized by the point marked "X" in the caricature. Furthermore, the line "A" describes the minimum pulse length that can be detected by the pulse repeater. This is set by circuit parameters, mainly by the strength of the input transistor and the load on its output. The other line, "B," marks the longest pulse length that will lead to a single output pulse.

The reason there is a maximum length that the repeater will not work properly beyond is that the repeater "double-latches" when the input pulse is so long that it is still present when the repeater has gone through the entire cycle x↓; ... y↓; x↑; ... y↑; furthermore, the up- and down-going behaviors of the pulse repeater are roughly similar; the same number of transitions is exercised, through roughly similar circuitry. Taken together, this means that the interval x↓; y↓; x↑ (approximately the same length as the output pulse) is about the same length as the interval x↑; y↑; x↓, where the final x↓ is the misfiring resulting from the too-long input pulse. Hence, the pulse length along "B" will be about twice the length of the normal pulse "X."

1.4 Digital-analog Correspondence

If we restrict ourselves to the digital domain, we can understand the pulse repeater's behavior for different input pulse lengths by considering the input pulse as two transitions in↑; in↓. The length of the input pulse is the length of the time interval between in↑ and in↓. in↑ begins the operation of the pulse repeater; leaving out in↓, the sequence of transitions is in↑; x↓; out↑; y↓; x↑; out↓; y↑.

Changing the input pulse length amounts to changing the position of in↓ in this trace (we are here assuming that the sequence continues even in the absence of in↓; i.e., in the presence of interference). There are five main possibilities:

0. in↓ occurs so early that the pulse on in is too short to trigger the pulse repeater—then there will be no sequence x↓; out↑; etc. The repeater fails.
1. in↓ occurs long enough after in↑ that the input pulse is noticed, but it occurs before y↓. This is the ideal situation. There is no interference. The repeater works perfectly.
2. in↓ occurs during y↓. There is some interference, but because the input behavior is monotonic (the inputs tend to drive x strictly more towards Vdd as time goes by), the interference is fairly harmless—a slightly lengthened output pulse may result. The repeater still works.
3. in↓ occurs after y↓ but not long enough after it to trigger the repeater again. The repeater still works, but it draws a great deal of short-circuit current.

4. in↓ occurs long enough after y↓ that x↑ has already occurred; x↓ is triggered again, and the repeater generates a second output pulse. The repeater fails.

1.5 The Cascaded Repeater

Now we shall justify the location of the point marked "X" in FIG. 8. It is true that the output pulse will have the characteristics implied by the location of X, almost regardless of the characteristics of the input pulse. We can see this from FIG. 7. This figure shows that, in this fabrication technology, for input pulse lengths in the wide range from 0.12 to 1.47 ns, the output pulse lengths range only from 0.57 to 0.85 ns. (Note that the scale along the abscissa is not the same as that along the ordinate.) Since five transitions take about 0.61 ns here, we can say that in technology-neutral terms, the input pulse lengths may vary from about 1.0 normal transition delays to about 12 delays for an output variation from 4.7 to 7.0 delays.

Since the range of input pulse lengths comfortably contains the range of output pulse lengths, we should have to add considerable load, or we should have to fall victim to extreme manufacturing variations to make the pulse either die out or double up as it travels down a pipeline of pulse repeaters of this kind. Since, further, the input-output relationship of the pulse lengths is almost entirely monotonic, we can summarize the behavior of the pulse repeater thus: an input pulse of length between about 1.0 and 12 transition-delays will generate a single legal output pulse; the length gain averages 4.8.

Figure 9:
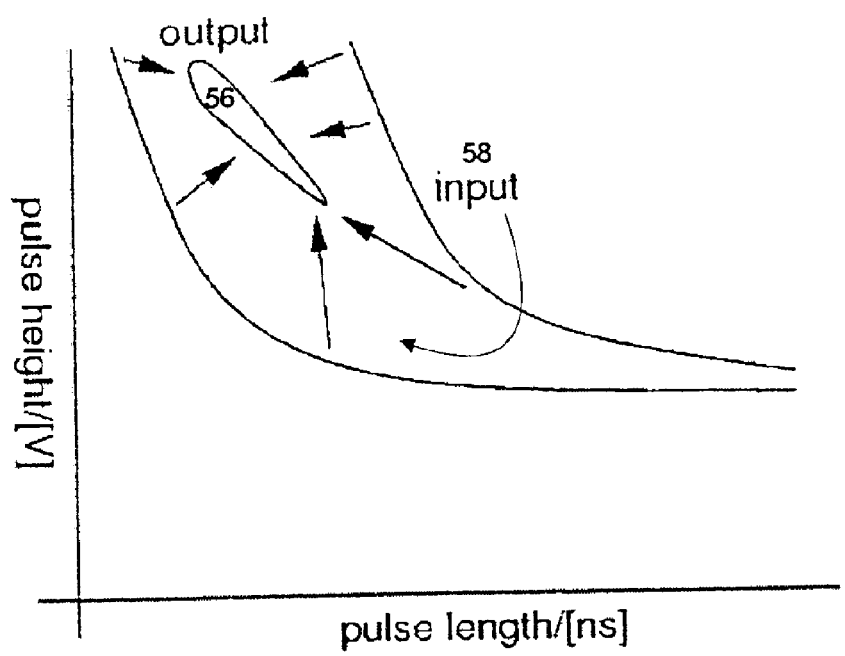
FIG. 9 is a caricature mapping of input to output pulse parameters.

FIG. 9 is another caricature of the operation of pulsed circuits. This figure maps the input to the output pulse parameters. The input pulses within the input pipe lead (region 58) to output pulses within the indicated (by arrows) output region 56.

1.6 Correctness

As shown in the simulation, pulse width and pulse height of a circuit do not suffice for completely describing the shape of the output waveform for that circuit. What is needed is a formal justification of the pulse circuitry used in the present invention. A formal justification is provided in Chapter 3 of the provisional patent application "Asynchronous Pulse Logic," (No. 60/328,647, Oct. 11, 2001). The reference is hereby fully incorporated into this application.

In summary, the justification is based on a generalized version of a one-dimensional model that usually describes synchronous digital logic. The correctness of synchronous digital logic is justified by a familiar two-part model. The first part explains what it means to be a valid logic-level by dividing the possible analog voltages of a digital circuit into a few ranges with the right properties to guarantee that noise is rejected. This division is called digital logic-level-discipline, and or logic discipline for short. The second part introduces a synchronous timing-discipline. The timing discipline can be introduced in several ways, which all rely on defining the times when circuit elements are allowed to inspect the analog voltages and defining the times when the circuit may change the voltages.

Based on this generalization, the correctness of the correlation between the input and output values as shown in FIG. 9 is established. The generalization defines legal input and output ranges in the two-dimensional space required by the introduction of pulses. The two dimensions now are time and voltage. The reference shows that, in pulsed circuits, pulses that have clear digital interpretations will be maintained throughout a circuit as long as the noise that is present is less than the noise margins.

The generalization of such a one-dimensional model itself involves considering uncountably infinite sets of waveforms instead of the simple voltage-ranges used by the synchronous argument. By specifying the sets of waveforms as "the set of all functions $f(t)$ such that each $f(t)$ is bounded below by the function $j(t)$ and above by $k(t)$," we reduce the argument to one where $j(t)$ and $k(t)$ play the leading roles instead of the much more cumbrous infinite sets of functions.

Figure 10:
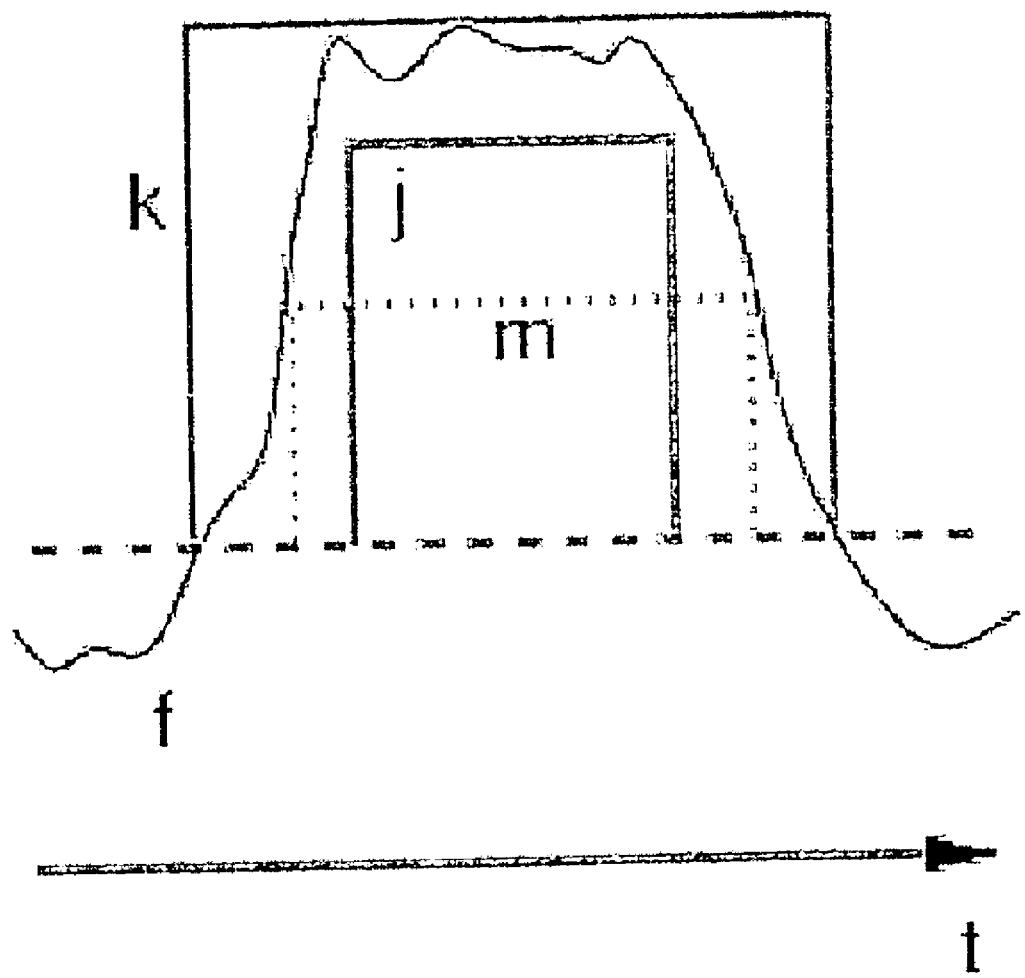
FIG. 10 is a plot showing the function $f$ and two members $j, k \in P(\mathcal{P})$, with $j \leq f \leq k$.

FIG. 10 is a plot showing the function $f$ and three rectangular functions j, k and m. The junction j dominates $f$ and $f$ dominates k and m. The proof in the reference shows that instead of than having to consider every possible intermediate voltage such as $f$ separately, we can establish the correctness of the model by considering only the boundaries between the voltage ranges. Specifically, the reference recognizes that, given certain desirable properties of the circuits, establishing the correctness of an asynchronous-pulse-logic family can be done entirely in terms of functions $j(t)$ and $k(t)$.

Based on the justification detailed in the incorporated reference, it is assumed that the pulse repeaters presented in this section have the properties that satisfy the conditions allowing the simplification.

2 Asynchronous Pulse Circuits

The previous section laid down the theoretical foundation to the development of the pulse circuit. Presented in this section are more circuit embodiments to illustrate the properties of asynchronous pulsed circuits in the present invention. In particular, the idea of asynchronous circuit using logic computations to carry timing information will be further explored. This section also aims to build out further properties of the present invention and describe the reasoning behind them.

2.1 A Simple Logic Example

The first circuit we shall examine is what we call a "pulse merge." We can think of this as the implementation of the CHP program

*[L0, L1; R], where L0, L1, and R are ports (i.e., the mention of L0 etc. in the program signifies a communication on that channel). The synchronization of L0 and L1 is here explicit in the CHP program, but the kinds of circuit structures required for this explicit synchronization are also used for implementing data computations, where implicit synchronizations capture the fact that output values of a logical function cannot be computed until inputs are available. For instance, the program *[A?a, B?b; C!(a+b)] explicitly synchronizes at the explicit semicolon and at the "loop semicolon" between loop iterations, and it also implicitly synchronizes the data because producing a value on C is impossible before inputs have arrived on A and B. The explicit synchronizations are mainly for the convenience of human understanding—they could, and should, eventually be removed; the data dependencies cannot be—the real task of the system designer lies in minimizing the need for data synchronization.

Figure 11:
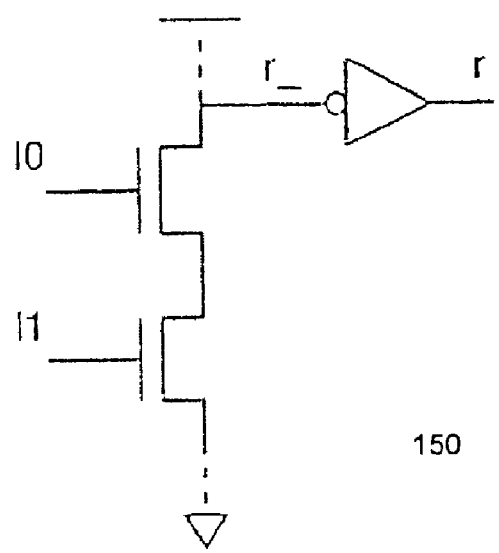
FIG. 11 shows how input transistors are implemented in QDI merge.

For the time being, let us keep pretending that the circuits we design will only have to be used once. It should right away be obvious that a QDI-inspired structure for the merge such as the one seen in FIG. 11 (where l0, l1, etc. signify the circuit implementations of the channels—i.e., the corresponding electrical nodes) and described by the PRS . . . ∧l0∧l1→r__↓ r__→r↓

¬r__→r↑, will not do. The QDI merge 150 behaves like a C-element; in other words, it waits until both inputs have become asserted and then asserts its output. This will not work for pulses because the pulses are ephemeral: the high voltage-level signifying a positive pulse is only present for a short time. Unless we are willing—and we are not—to insist that outside agents shall synchronize the arrivals of l0 and l1, attempting to work with coincident pulses will get us nowhere.

Figure 12:
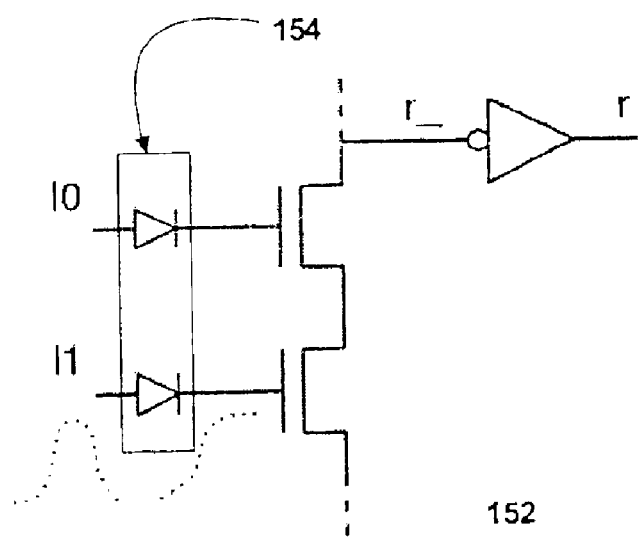
FIG. 12 shows an embodiment of APL circuit with diodes.

If we are to design circuits that generate outputs computed from pulse inputs that can arrive at different times, we shall have to capture the pulses somehow and "remember" them. The APL circuit 152 with diodes 154 in FIG. 12 is a conceptual solution to the problem. Incoming pulses on l0 and l1 are captured by the diodes 154; the maximum voltage during the pulse is stored on the gate capacitance of each transistor.

Figure 13:
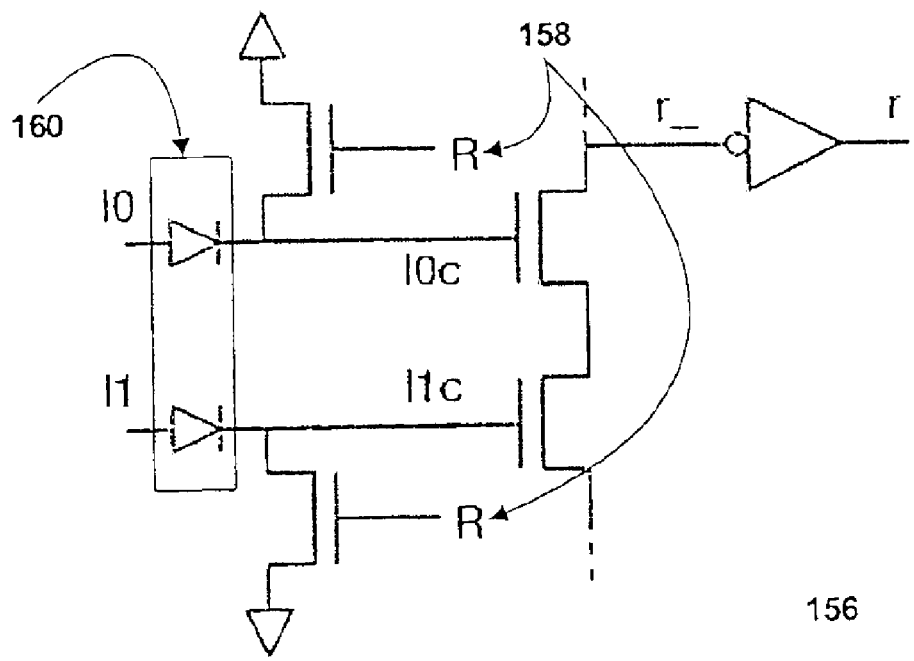
FIG. 13 shows an embodiment of APL circuit with diodes and reset transistors.

The diode-transistor combination captures pulses by turning them into voltage levels. This is enough for using the circuit just once, but we seem to have pushed part of the problem ahead of us; if we capture a pulse by converting it into a voltage level with a one-way device, how do we reset the circuit so that we can use it again? A straightforward way of doing this is shown in FIG. 13. In this APL circuit 156, we have added reset transistors 158 that are exercised by a separate reset pulse—the gates of the reset transistors 158 are marked R in the figure. Diodes 160 remain. Presumably, the generation of the reset pulse is contingent on the circuit's having produced its outputs, thus ensuring that the inputs are no longer required. (Of course, we shall have to explore this presumption later.) In simple circuits, the reset signal can often be the same for all inputs, as shown. In the case of data, the reset signal can also fan out to all the data rails, i.e., to inputs that have not necessarily been asserted, since vacuously (an assignment x:=a is called vacuous if x already has the value a before the assignment; else it is effective) resetting a data rail that was not previously set by an incoming pulse is harmless. When we reuse the circuit, we shall have to arrange things so that the pulse on R avoids interfering with the input pulses on l0 and l1, or chaos will ensue.

Figure 14:
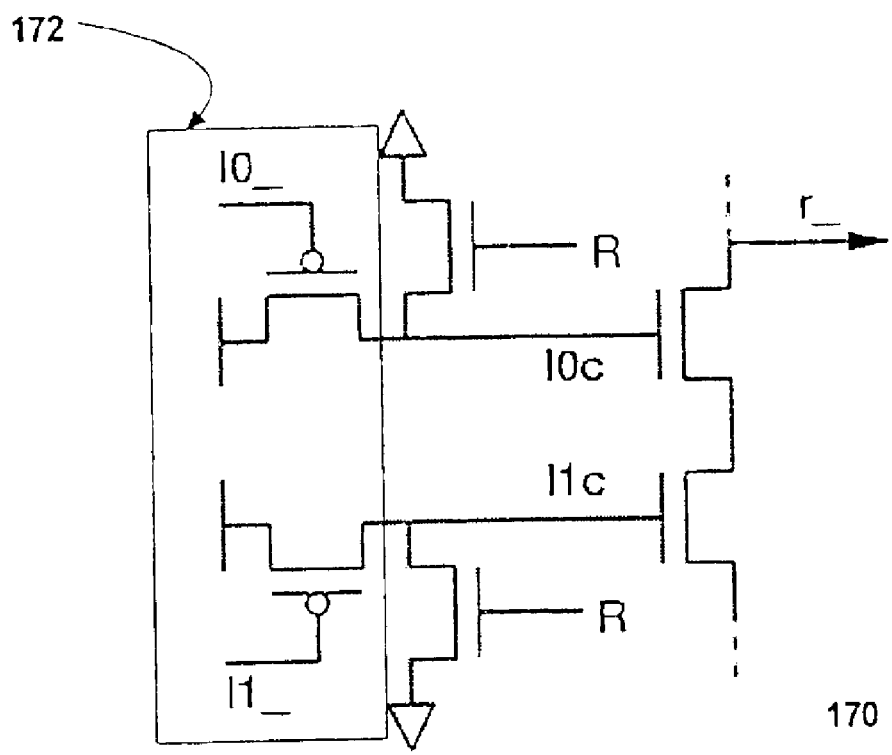
FIG. 14 shows an embodiment of APL circuit with diodes implemented with transistors.

Now we must get our signal senses in order. For simplicity, we have so far preferred discussing positive (i.e., from a stable low value: up, then down back to low) pulses. This turns out to be the wrong choice. We shall not discuss all the reasons why this is so; instead, we justify our choice of signaling senses by observing that in our example circuit, r_ will certainly be in the negative sense; i.e., it goes to false rather than to true when it produces an output. The obvious choice is to make the logic-gate signals, l0c and l1c in FIG. 13, positive logic; and r_ negative logic, as indicated by the figure. Furthermore, we can see that the minimum number of stages of logic that we can use is two—one for implementing ... ∧l0c∧l1c→r_↓ and one for the diode; this means that we shall have to design the circuit so that r_ is pulsed. While we might entertain the idea of using an actual diode (a substrate diode or a transistor with the drain and gate tied), normally using a transistor will be better; the transistor has gain, and foundries optimize CMOS processes for producing good transistors, not diodes. FIG. 14 shows the modified APL circuit 170, with diodes implemented with transistors 172 and 174.

In the form of a PRS, then, we may write the asynchronous-pulse-logic implementation of *[L0, L1; R] as ¬l0_ →l0c↑

¬l1_ →l1c↑

... ∧l0c∧l1c→r_↓

... →r_↑

R→l0c↓

R→l1c↓.

Here, the p-transistors denoted by ¬l0_ →l0c↑ and ¬l1_ →l1c↑ are implementations of inverting diodes. The inversion at the "diode" means that we may (or must) merge the diode with the inverter of FIG. 13; removing the inverter completely is usually preferable to adding another. There remains filling in the implementation of the ellipses, but the general form of this circuit is what we shall see throughout the rest of this work: a negative pulse appears; a single p-transistor captures the pulse; the captured pulse, now a high voltage-level, gates a transistor in a logic network, which computes the desired function and produces an output pulse, negative like the original pulse; the output pulse having been produced, a suitably generated reset pulse removes the original, captured pulse.

2.2 Pulse-handshake Duty-cycle

Let us now consider two repetitive processes, named P and Q, that synchronize once per iteration by means of a channel. We refer to the nodes used for implementing the channel as interface nodes when necessary for distinguishing them from other nodes in the system (e.g., nodes that are private to the implementations of P and Q).

The standard QDI handshake is

P: *[[re]; rd↑; [¬re]; rd↓]‖Q: *[re↑; [rd]; re↓; [¬rd]].

Here we have written the handshake with an inverted acknowledge, called the enable. This choice of senses improves circuit implementations; while this is admittedly a weak reason for choosing the sense at the HSE level, there is really no reason at all except convention itself for choosing the conventional sense for the acknowledge. Perhaps also the term "enable" is more suggestive of a pipeline with "flow control" than of an orderly handshake between two otherwise independent processes.

This handshake in theory has two synchronization points (e.g., the up- and down-going phases on rd), but the difficulties attached to designing circuits that compute on a down-going transition are enough to convince us that using the handshake for more than a single synchronization is usually a bad idea.

We first consider a simple adaptation of the QDI handshake to the pulsed world by writing the pulse generation on a node x as x↧ (read "x pulse down") and x↥ (read "x pulse up"). If a process executes x↥, x will from then on evaluate to true, until some process executes x↧. This corresponds directly to the "diode-capacitor-transistor" model we used in the previous sub-section.

Now we can write a pulse handshake corresponding to the QDI handshake thus:

P: *[[re]; rd↥, re↧]‖Q: re↥; *[[rd]; rd↧, re↥].

(Note that already this handshake is not delay-insensitive; unless we add timing constraints, there may be interference.) But, secondly, we should realize that if we allow P's directly detecting that Q has executed rd↧, then the pulse re↥ is unnecessary, since simply by knowing that rd↧ has completed, P may know it can safely send another rd↥. P can glean the necessary knowledge by monitoring rd (at the perhaps significant cost of using p-transistors in series).

By thus eliminating the communicating on re, we go further than the QDI designer; he had the freedom to release and leave floating his nodes early but could choose not to use that freedom—we shall require the nodes' early release. We call the resulting protocol the single-track handshake. The name single-track handshake was coined by van Berkel and Bink.

The removal of the acknowledgment wire and pulse does somewhat reduce the flexibility of the allowable family of pulsed circuits, because one extra means for flow control has been removed: in the example, delaying P further is not possible once rd↕ has been executed, because no further notice will be given that it is all right for P to send another datum; rd↕ is now the only signal to notify P, whereas we previously both removed the old datum and acknowledged it, either of which could have been used by P for determining that Q is ready for more input. But the flexibility that we thus remove is actually unfamiliar: for instance, it does not even exist in QDI systems, since these usually also have only one mechanism for flow control (the acknowledge).

Hence we shall in what follows restrict our attention to circuits that use the same wires for sending data as they do for receiving acknowledges and the same wires for receiving data as they do for sending acknowledges. The single-track handshake may be written in terms of HSE:

P: *[[¬rd]; rd↑]‖Q: *[[rd]; rd↓].

Note, however, that even though the syntax for the pulsed program looks similar to that used in the HSE describing ordinary QDI circuits, the semantics may be quite different. In QDI-HSE, it does not matter whether the driver for rd has three states (driving up, not driving, driving down) or two (driving down, driving up) in the implementation of the program *[[re]; rd↑; [¬re]; rd↓]. The driver could, e.g., be implemented with an inverter, in which case rd is always driven (a combinational node). In general, what this means is that in QDI-HSE, a process that executes a sequence of commands S; rd↑; T; rd↓, where S and T are arbitrary program parts, may choose to stop driving up rd and leave it floating at any time after rd↑ has completed, i.e., before T, during T, or after T, as long as the rd↓ action has not yet begun. This is no longer allowed in the present invention.

This is a big freedom. The conservative would say that this freedom should be approached with respect, because he thinks that it is difficult to design the state-holding circuits that must be used if any appreciable amount of time is allowed between the abandonment of rd↑ and the start of rd↓. (The electrical engineer refers to the state of the circuit during this period of time as "high-impedance" or "high-Z"; we shall call it floating.) On the other hand, the designer of traditional QDI circuits is apt to use this freedom to great effect for simplifying many aspects of his design; the freedom might perhaps allow his inserting inverters in convenient places without violating the rules of the QDI game. What this means is explained in detail in the QDI literature, e.g., by Martin, who explains the need for having such freedoms under the heading "bubble reshuffling." Martin also uses a technique called "symmetrization," which involves replacing x↑; ... ; x↓ with the "stuttering" x↑; ... ; x↑; ... ; x↓ when this simplifies the circuit realization.

In the present invention, we shall take the following complementary specifications as given:

Definition 1 (Maximum single-track hold time (maximum impulse)) If a process P begins driving an interface node to a new value v at time t, then P must have stopped driving the node at time t+$\sigma_v$, where $\sigma_v$ is a (system-wide) global constant, P may not again drive the node to v until it has detected that the node has left v (see Definition 2).

Definition 2 (Minimum single-track setup time (minimum inertia)) If a process P detects that an interface node has switched to a new value v at time t, then P must not drive that node away from v until the time t+$\xi_v$, where $\xi_v$ is a (system-wide) global constant.

The circuit embodiments in the present invention are designed so that they satisfy:

Definition 3 (Single-track-handshake constraint) A set of processes S satisfies the single-track-handshake constraint if $\xi_v \geq \sigma_v$, for all v and all processes in S.

This property will guarantee that there shall never be interference between the two actions x↑ and x↓. We may in practice choose to be lax about this, allowing some interference (see Section 1.4). The rationale for allowing a different $\sigma$ and $\xi$ for each possible value of v (usually only true and false are allowable values for v) is that this allows implementing x↓ and x↑ differently. But because the constants are global, we must still implement x↓ similarly throughout a system, and likewise for x↑.

Careful analysis will reveal that we really only need to satisfy the constraints on each channel instance separately; there is in theory no need for making the constraints global. On the one hand, our making the constraints local would break the modularity of the design style, and this is reason enough for saying no. On the other hand, we could profitably take the view that: first, we should design systems as if the constraints were to be globally satisfied—thus ensuring that the digital design could be sized to operate properly; secondly, the final sizing should be done with only local constraints, local values of $\xi_v$ and $\sigma_v$—thus making best use of the silicon: this compromise should allow the design of formally modular systems without paying the practical price of complete modularity.

2.3 Single-track-handshake Interfaces

The adoption of the single-track handshake, while it appears to follow naturally from the pulsed version of the four-phase handshake, does not in itself involve exchanging pulses between communicating processes. One process sets x and another, having seen the activity, resets x as an acknowledgment. At this level, no pulses are visible, and the processes may defer the actions on x indefinitely, if they should prefer doing so. In this design style, we oblige no process to respond immediately to an input any more than we do a QDI process. What a single-track-handshake process may never do, on the other hand, is to drive one of its interface nodes for a long period of time (to either rail); it may also not drive one of its inputs too soon after it has changed.

The single-track processes use pulses internally for guaranteeing that the single-track-handshake constraint is satisfied. If we compare the single-track processes with the straight-forward translation of QDI handshakes into pulsed handshakes, the main change is that we have moved the "diode" transistors at the inputs of the "diode-capacitor-transistor" circuits to the transmitting process.

In the present invention, the requirement that single-track processes use pulses internally is fundamental. There is simply not enough information available to a process for it to implement *[[¬rd]; rd↑] quasi delay-insensitively.

2.4 Timing Constraints and Timing "Assumptions"

One of the great strengths of QDI circuits is their reliability when faced with uncertainties or variabilities in the timing characteristics of their constituent circuit elements. Unfortunately, the requirement that the circuits must have internal equipotential regions (isochronic forks) means that even QDI circuits are not immune to reliability problems that result from timing mismatches. While we should not normally consider a single operator to have internal isochronic forks, this is merely a convenient fiction resulting from a simplistic model for QDI circuits.

We consider implementing the inverting C-element:

a∧b→c↓
¬a∧¬b→c↑

Figure 15:
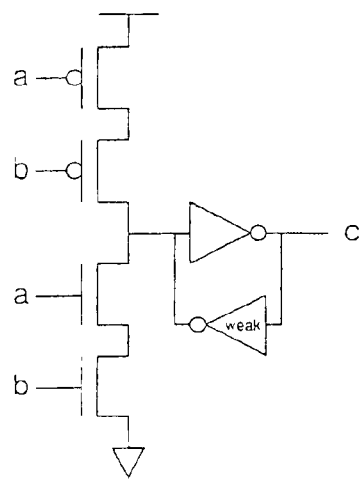
FIG. 15 is a diagram showing a pseudo-static C-element.

The simplest implementation of the C-element is the pseudo-static-version 174 shown in FIG. 15. (An operator U→x↑, D→x↓ is called static or combinational if U=¬D; if not, it is dynamic, but if a dynamic operator is realized with a staticizer (keeper), we call it pseudo-static.) The wire that connects the gate of an n-transistor with the corresponding p-transistor in the C-element can behave like an isochronic fork. For instance, we might have that the input a changes very slowly from a valid logic-zero to a valid logic-one. During the time when a is between the two legal logic levels, both the n-transistor and the p-transistor connected to that a will be turned on. As long as this situation persists, the C-element behaves like a slow inverter with respect to b; this behavior is not at all what we should like. If the transition on a is extremely slow with respect to the circuitry that acknowledges b, the circuit may misfire, which would likely result in a system failure.

The possibility that the circuit should misfire is especially menacing for the pseudo-static implementation that we have shown (and even more so for fully dynamic versions). The reason is that the switching thresholds of a pseudo-static operator are moved unsafely towards the power rails because there is no "fight" between the transistor that is just turning on and the one that in combinational logic would be about to turn off; i.e., the noise margins are reduced. We can remedy the situation either by making the staticizer larger or by changing the circuit so that it is fully or partially static, thus re-introducing the fight. In an extreme case, we can even make the C-element hysteretic. The reason we shall not do these things is that we should lose much of the performance advantage of the dynamic implementation. The energy dissipation would also increase compared to the dynamic implementation.

2.5 Minimum Cycle-transition-counts

We can say that a QDI circuit is correct only if each signal within it satisfies certain timing constraints. The rise time of the signal must be small compared with the delay of the cycle of transitions that invalidates that signal. As we have seen above, these constraints must be satisfied also by signals that are not on isochronic forks in the normal sense, i.e., those that are checked in both the up- and down-going directions. Since the delay of a cycle of transitions can be thought of as a linear combination of rise (and fall) times, the constraint is two-sided as stated: we cannot allow a transition to be slow compared with its environment, and we cannot allow a sequence of transitions to be fast compared with their environment. Because we are trying to keep a single transition faster than the sum of delays of a sequence of transitions, the difficulty in maintaining reasonable rise times becomes lesser if we design circuits so that every cycle has a minimum number of transitions before invalidating the input, e.g., five.

On the other hand, the number of transitions on a cycle acts as a minimum constraint on the cycle time of a system; in other words, the fewer the transitions on the cycles, the faster the circuits run. This suggests that we should decrease the number of transitions on the cycles to the minimum possible.

Summing up, we see that part of the reliability of a QDI circuit is determined by the minimum number of transitions on any cycle, and at the same time, the maximum speed of the circuit is determined by the maximum number of transitions on any cycle that is exercised frequently. A reasonable design approach in the face of this dichotomy is to aim at a roughly constant number of transitions in each cycle of the system. If the target number of transitions is small, then the circuits designed will be fast and unsafe (i.e., difficult to verify the correctness of); conversely, if the number is large, the circuits will be slow and safe.

2.6 Solutions to Transition-count Problem

Obviously, we must be careful when dealing with pseudo-static non-combinational circuits. The fact that the Min-iMIPS processor and other chips using the same circuit techniques were functional is evidence that timing assumptions involving isochronic forks in QDI circuits are manageable, even when the circuits involved are complex. In the APL circuits of the present invention, we shall take a different approach: the timing assumptions used in APL circuits depend on internal operator delays; thus, they are formally more restrictive. On the other hand, as we shall see, the timing assumptions appear under much more controlled circumstances than in QDI circuits; under certain circumstances APL circuits may be more reliable than QDI circuits because of the APL circuits' simpler internal timing relationships.

2.7 The APL Design-style in Short

The APL design method aims at describing how to compile CHP programs into circuits; it is thus similar to the QDI design method. But whereas we strive for designing circuits with a minimum of timing assumptions when designing QDI circuits, we use internal pulses for implementing the single-track handshake when designing APL circuits.

We could introduce timing assumptions in many different ways for the purpose of simplifying or increasing the performance of QDI circuits; several schemes have been mentioned already. The APL scheme of the present invention takes a simple approach: we use a single-track external handshake, and we minimize the number of timing assumptions at the interfaces between processes; internally, in contrast, we design the circuits so that they generate predictably timed internal pulses. This is a separation of concerns: most of the variable parts of an APL circuit (i.e., those parts that vary depending on what CHP is being implemented) are arranged so that their delays do not matter much for the correct operation of the circuit; conversely, the pulse generator, whose internal delays do matter for the correct operation of the circuit, does on the other hand not vary much.

We consider the implementation of some CHP as an APL circuit in 0.6-$\mu$m CMOS (the same technology that we used for the pulse repeater demonstrations). We should not expect to be able to say much about the delay from the inputs' arriving to the outputs' being defined; in contrast, we should expect that the internal pulses always are approximately 0.7 ns long. Before we fabricate a chip, we want to verify that there is a good chance that it will work as designed. This is when we benefit from the invariability of the pulse length: since the pulse length varies so little (this is a different way of saying that the pulse repeater has a high length-gain), we commit only a minor infraction if we assume that the length is constant.

The simplifying power of this assumption can hardly be overstated: once we have assumed that the pulse length is given, we need only verify that the circuitry generating the pulse and the circuitry latching the pulse work properly given that pulse length, and—this is the important part—we need not consider the effects of the inputs and outputs on the pulse length. This means that we can verify our timing properties locally. In effect, we have reduced a problem consisting of verifying the properties of the solution to a system of N coupled nonlinear equations into one involving N uncoupled nonlinear equations: we have gone from a task that seems insurmountable to one that is (in theory at least) easy.

3 Basic STAPL Circuits

Section 2 has established a number of constraints that STAPL circuits must obey. These constraints are inequalities, however, and there remains a great deal of freedom in our choosing the design parameters (e.g., $\xi_v$ and $\sigma_v$ in Definition 3). These parameters are somewhat arbitrary. It shall be shown that it is easier to make a convincing argument about the quality of the STAPL design style in terms of high-speed circuits rather than in terms of low-power circuits, because the speed advantage of STAPL is obvious compared with QDI, whereas the power advantage—if any—is harder to quantify. We shall compare the QDI and STAPL design-styles for speed and energy later; see Section 5.2.3.

3.1 Preliminaries

There are a few properties of STAPL that are discussed before circuit embodiments are presented. They pertain to transition counting, capabilities and design philosophy of STAPL circuits.

3.1.1 Transition Counting in Pipelined Asynchronous Circuits

When dealing with pipelined asynchronous circuits, transition counts are a useful delay measure, at least when the circuits are designed for maximum reasonable speed. We encountered many instances of circuits for computing some useful eight-bit operations, designed by someone reasonable and intended by him to operate at around 280–300 MHz according to our 0.6-$\mu$m parameter set. We saw almost universally that when such a circuit was implemented so that it cycled in 14 transitions (i.e., could accept a new input datum every 14 transitions), we had to size the transistors far larger than reasonable, compared with the transistors in an 18-transition-per-cycle implementation capable of running at the same speed. Increasing the transition count in the circuit to 22, we found that achieving the desired throughput becomes impossible. Only very carefully designed circuits (e.g., in the MiniMIPS, the register file) operating at 20 transitions per cycle could compete with the 18-transition-per-cycle implementations.

Secondly, to some extent also in explanation of the MiniMIPS results, asynchronous circuits by their nature mix computation and communication. While the logic delays of computation may vary greatly—even dynamically, depending on the data—the communication delays are often much more predictable. For example, an eight-bit QDI unit is difficult to implement in less than 18 transitions per cycle. Of these 18, only two are transitions of the logic, and one of these may even be masked by communication transitions (both transitions' being so masked would indicate a poor design). As a result, only a small part of the cycle time of a QDI unit will be affected by the delays of computation. One of our design objectives for pulsed circuits is to increase the proportion of the cycle that is the logic delay. As we shall see, however, we do not attempt bringing the cycle time for a complex system below ten transitions per cycle. Also, owing partly to our way of automating their compilation, the pulsed circuits will have more uniform completion-delays than the QDI circuits we are familiar with. We should keep in mind that the logic delay that is the largest and the most variable is the "falling domino" transition. Increasing the delay of this transition can only improve things so far as the circuit's satisfying the single-track-handshake constraint goes; in other words, if the uniform-delay model suggests that a pulsed circuit is correct, then the real circuit delays will only improve the operating margins if the logic-computation delay is increased compared with the other delays.

Thirdly but not least importantly, the equal transition-counts assumption can for several reasons be self-fulfilling. For instance, let us assume that we have decided to use a uniform implementation for pipeline stages, i.e., an implementation whose every stage runs at the same speed, counted in transitions per cycle. As we have seen, the completion circuitry will be similar from stage to stage. Thus, if a process is part of a pulsed pipeline, and the completion delays are uniform throughout the pipeline, then the designer will feel an urge for making the logic delays equal also, since the cycle time of the pipeline as a whole will be determined by the slowest stage.

In summary: the MiniMIPS experience shows that our assuming the transition delays to be equal can be a useful model; the general nature of pipelined asynchronous circuits suggests that equal transition-counts are not, as we might fear, an unnatural design corner for the circuits to be shoehorned into; on the contrary, a good designer's tending to equalize delays throughout an asynchronous pipeline will lead to a circuit with roughly equal transition delays. Hence equal transition delays are likely a natural endpoint in the design space.

If we consider circuits that are designed more with reducing energy dissipation in mind, not for maximum speed as we assumed above, the situation can become more difficult; we might not want to match equal transition counts. But this is not an essential difference: in either case, we shall eventually have to verify that the transistor implementations of the pulsed circuits have delays that satisfy the single-track-handshake constraint to an acceptable degree.

3.1.2 Transition-count Choices in Pulsed Circuits

The preceding section has made the case that transition counting can be an effective way of estimating delays in asynchronous circuits, with the caveat that the prophecy of equal delays for equal transition counts partly needs to be self-fulfilling. A corollary of our using transition counts for estimating delays is that when we should like particular delays to be equalized or ordered (i.e., in amount: we might always want the delay from transition a to transition c to be larger than that from transition b to transition d) in a circuit, a first-order approximation of the required delay-ordering is arrived at simply by requiring the corresponding ordering of the transition counts.

Figure 16:
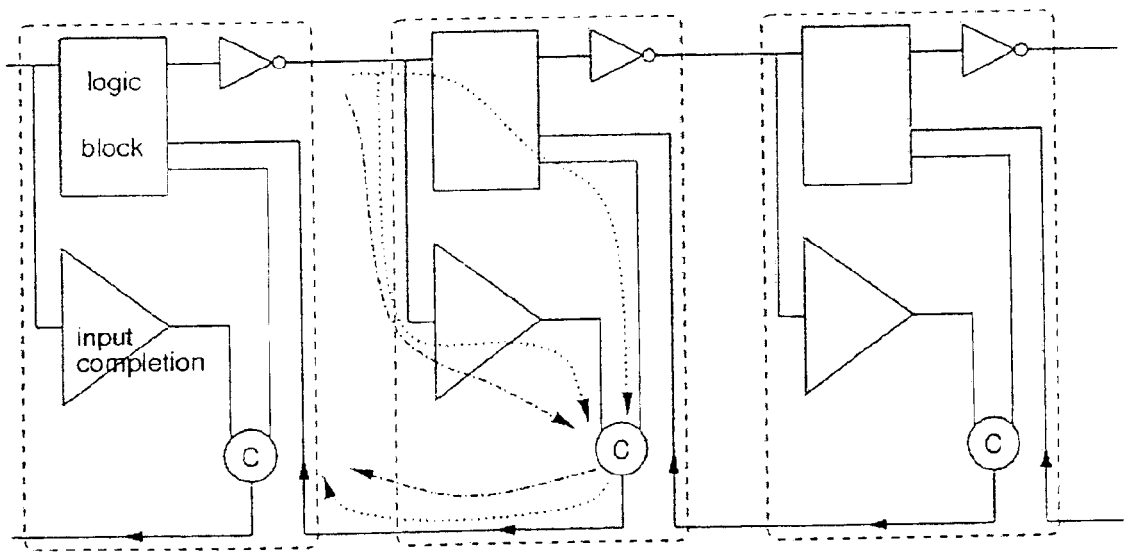
FIG. 16 shows the path from input's arriving to acknowledge in QDI circuit.
Figure 17:
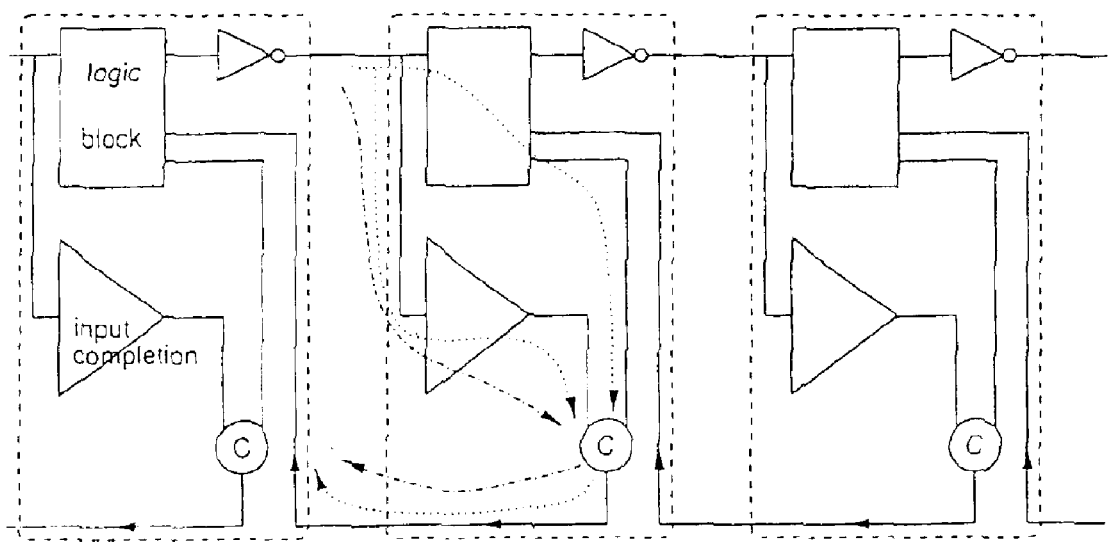
FIG. 17 shows the path from input's arriving to its being removed in STAPL circuit.

The inverting property of restoring CMOS logic implies that the number of transitions per execution cycle in the present invention must be even if we will ensure the possibility of a circuit's returning to its initial state (e.g., as in an execution cycle of a CHP program); furthermore, any circuit that is symmetric in the sense that up- and down-going transitions take similar paths—e.g., through the same circuit elements—must have a transition count per cycle of the form 4n+2. To see why this is so, consider the handshake [re]; rd↑; [¬re]; rd↓. Since the total effect of executing the path from rd↑ to rd↓ amounts to an inversion of rd (in addition to possibly many other activities), this path must consist of an odd number of stages of logic, e.g., 2n+1. If now the circuit is symmetric in the way described, then the path from rd↓ to rd↑ is the same length, so that the total cycle time $t_c = t_{rd\uparrow \to rd\downarrow} + t_{rd\downarrow \to rd\uparrow} = 4n+2$. While the simplest QDI circuits are symmetric in this sense, this is only one way to design things. And just as for the QDI circuits, it is not necessary for the pulsed circuits to have this kind of symmetry: on the contrary, one of the purposes of our developing pulsed circuits is that these circuits can be asymmetric; the asymmetry allows our avoiding a good deal of work due to the circuits' checking for the occurrence of transitions that we know must anyway occur. The asymmetry is illustrated by FIGS. 16 and 17. FIG. 16 shows the path from input's arriving to acknowledge in QDI circuits. The forward path is dotted while the backward path is dash-dotted. FIG. 17 shows the path from input's arriving to acknowledge in STAPL circuits. Again, the forward path is dotted while the backward path is dash-dotted. The fact that the up- and down-going transitions follow the same path in the QDI implementation in FIG. 16 is illustrated by the forward-path (for the QDI circuit, [$r_i$]; re↓, for the STAPL circuit, [$r_i$]; ...) and backward-path arrows (QDI, [¬$r_i$]; ret↑, STAPL, ...; $r_i$↓) in the middle process and [¬$r_o$]; ret↑ in the one on the left), which both go through the completion circuitry, whereas they do not in the STAPL implementation in FIG. 17.

If we want the single-track-handshake timing-constraint to be satisfied in terms of transition counts, we have the following choices: each $\sigma_y$ must be equal to the delay of an odd number of transitions, at least three (because a self-invalidating CMOS-gate does not work), and each $\xi_y$ must be given an odd number of transitions larger than the corresponding $\sigma_y$ (but see below).

In practice, a choice of $\xi_y \approx \sigma_y$ may lead to the single-track-handshake constraint's being violated. The result of this need not be disastrous, however. Because the violation persists for only a short period of time, and because the violation occurs during a "handoff" (the driving of the node is passed from the sender to the receiver; the sender becomes the receiver, and the receiver, the sender) that guarantees the inputs' being monotonic, the effect is merely some extra power consumption because a node is briefly being driven both to Vdd and to GND. If the timing mismatches are not too large, then this situation is no different from what occurs in normal combinational logic when the input switches through the forbidden region, during which time both the pull-up and pull-down transistors are (weakly & briefly) tied. We must also remember that this particular problem is present in many modern synchronous clocking schemes for the very same reason that we see it in pulsed asynchronous circuits. Finally, it is also present in the pulse repeaters presented earlier in section 1.

To determine the cycle time of a STAPL handshake, let us refer back to

P: *[[¬rd]; rd↑]∥Q: *[[rd]; rd↓].

The trace of executing this handshake is rd↑; rd↓; rd↑; rd↓; .... We shall compute the time taken from an rd↑ to the next rd↑; this is the cycle time.

After the rising edge of rd↑, the driving process must not hold rd high for more than $\sigma_{true}$ time units. Likewise, the receiving process must not begin executing rd↓ until $\xi_{true}$ time units have passed. Since we have $\xi_{true} \geq \sigma_{true}$, we know that rd↓ can begin at the earliest after $\xi_{true}$ time units have passed. Repeating the argument for the down-going part of the handshake, we should find that the cycle time for a STAPL circuit in the present invention is constrained so that $$t_c \geq \xi_{true} + \xi_{false} \quad (1)$$

We have previously experienced problems when building asynchronous circuits with very fast feedback paths; in Section 2.4, for instance, we saw what could go wrong if the delays on a three-transition feedback path were not carefully adjusted. This is a strong reason for avoiding three-transition feedback paths and hence for requiring $\sigma_y$'s being at least five transitions' worth of delay. A design with $\xi_y \approx \sigma_y$ with all these equal to five transitions is safer than one where $\xi_y$ is five and $\sigma_y$ is three transitions. Whether this justifies the inevitable performance loss that results from our going from an eight-transition cycle time to a ten-transition cycle time is unclear; but we might also find it difficult to implement the amount of logic we should like in a single process in as little as eight transitions per cycle (see Section 4.3), and we should remember that a circuit with different numbers of transitions on its set and reset phases will necessarily have to be implemented asymmetrically, which makes designing it more difficult.

For all these reasons, the STAPL circuits in the present invention shall have $\xi_y \approx \sigma_y$ and equal to five transitions' delay. These circuits will also have the minimum reasonable input-to-output latency, which is two transitions' delay.

3.1.3 Execution Model

Embodiments within the STAPL circuit family are described in terms of production-rule sets (and the corresponding transistor networks according to the usual transformation rules developed for CMOS QDI circuits). Because the PRS of a STAPL system is not QDI (or speed independent), we cannot use a model where every PR can take an arbitrary time before it fires. We shall instead assume that all PRs take a single time unit from becoming enabled to firing, except when we say otherwise. PRs that take more time to fire will be labeled thus: (n) a→b↑ will take n time units from becoming enabled to firing.

3.1.4 Capabilities of the STAPL Family

Andrew Lines's work suggests that a large class of QDI circuits can be built efficiently by translating more or less directly from decomposed CHP processes to production rules, thus avoiding the frequent explicit use of the HSE level of description (naturally, the compilation procedure itself implicitly represents the HSE).

For pulsed circuits, the reshufflings are necessarily simpler than the allowable four-phase QDI reshufflings; consequently, the HSE is even less important for the working designer (the use of HSE is crucial in this work, where we are examining the reshufflings themselves; but once a reshuffling has been picked, there is much less leeway for the designer to affect the protocols that processes use to communicate). Also, the meaning of production rules is less clear for pulsed circuits. In the present invention, production rules are used as a convenient representation for transistor networks. The syntactic similarity here to the PRS used in QDI circuits should not be inferred that the properties that are true of production-rule sets in QDI circuits also are true of pulsed circuits.

Most of the work we have to do in implementing the STAPL family consists of reconciling the handshake specification of $\sigma_y \approx \xi_y \approx 5$ transitions with the CHP specification of each circuit. We build up the circuit embodiments gradually, showing at each stage how the mechanisms required for building any desired STAPL circuit may be combined.

3.1.5 Design Philosophy

In this chapter, the various techniques that we need for implementing the building blocks that we shall ultimately want are presented one at a time. In the earlier sections of the chapter, some of the circuits may be presented in an incomplete or at least not generalizable way so that they shall remain understandable. The sum of the techniques is what we should properly call the STAPL design-style.

Since our circuits depend on satisfying certain timing assumptions to work, we shall have to proceed carefully. We shall use a few simple techniques for guaranteeing that the circuits will stand a good chance of working properly. First, we shall always use the same circuit for generating the σ delays: a five-stage pulse generator. Secondly, we shall insist that the delay margins shall always be (in the limit of instantaneous transitions) half a cycle, or five transitions: this is the best that can be done uniformly. (This insistence will lead to our rejecting a "naïve" design in Section 4.4.3.1. We will still sometimes make an exception from this rule when we can thereby remove the foot transistor in simple circuits.) Lastly, the complicated logic will always be responsible for implementing the ξ delays; hence, if the logic gets slower (e.g., more heavily loaded), satisfying the timing assumptions becomes easier, not harder.

3.2 The Basic Template

The present invention provides a basic template by which STAPL circuits that can perform useful basic functions can be built. Such functions include computing an arbitrary logical function, computing results conditionally, receiving operands conditionally, storing state, making non-deterministic decisions, and communicating with four-phase QDI circuits.

To describe the template, we start with a few simple STAPL circuits. The simplest useful circuits in the family are the bit generator, the bit bucket, and the left-right buffer. The bit generator is combined with the bit bucket to generate the left-right buffer.

In some cases, the implementation presented here may not seem to be the simplest ways of implementing the specifications. This is true: the bit bucket and left-right buffer could be implemented more simply without violating the single-rail-handshake constraint. The reason for the more complicated implementations we give here is that they generalize; i.e., they lead naturally to the implementations in later sections.

3.2.1 Bit Generator

The STAPL bit generator implements the CHP program
$P \equiv *[R!0]$,
or in terms of HSE,
$P \equiv *[[\neg r0 \wedge \neg r1 \wedge \ldots]; r0\uparrow]$.

The bit generator will illustrate how to transmit data in the STAPL family. The basics are simple: we wish to send a zero value on R repeatedly. For each value we send: P must first wait until its communication partner—all it Q—signals that it is ready to receive, which Q does by lowering any asserted data wire; secondly, after the imposed setup-time $\xi_{false}$, P asserts the zero rail of the channel; thirdly, we must ensure that P no longer drives the rail after the hold time $\sigma_{true}$ has passed after the rail's being asserted.

3.2.1.1 Output Completion

Using the precharged implementation suggested previously for the circuits, we find that the minimum delay in a STAPL stage from an input's being asserted to an output's being asserted is two transitions. Furthermore, a STAPL stage is not allowed to produce outputs until five transitions after its partner has removed the previous output from the channel. This means that the logic path bringing flow control from the output rails to the domino block must be three (5−2) transitions long.

3.2.1.2 Forward Path

Figure 18:
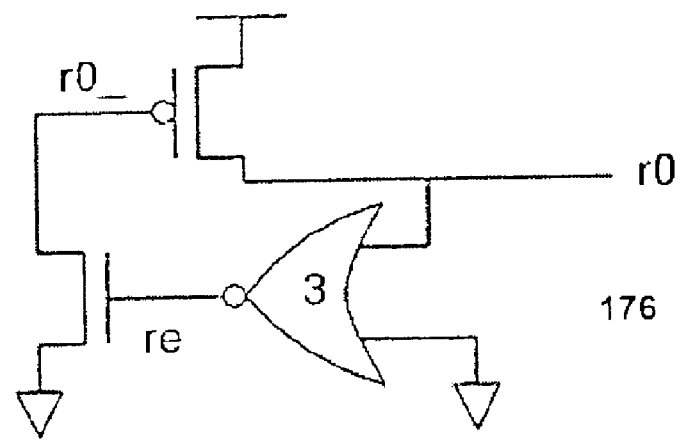
FIG. 18 is a circuit diagram of the forward (compute) path of STAPL bit generator according to one embodiment of the present invention.

Since the bit generator does nothing besides generating outputs, we can now start deriving a STAPL implementation. The only thing that remains to sort out is what to do with the remaining rails of the channel: since we know that only P will send on R, we can tie the other rails to GND and ignore them in P. This results in the HSE
$P \equiv *[[\neg r0]; r0\uparrow]$;
straightforward compilation of the "forward path" [¬r0]; r0↑ results in the partial PRS (3)¬r0→re↑
re→r0__↓
¬r0__→r0↑, where the annotation "(3)" means that the production rule in question shall take three transitions to execute. The corresponding circuit is shown in FIG. 18, which shows the forward compute path STAPL bit generator 176. The use of the NOR gate in the figure in place of the inverter of the PRS suggests how the R channel could be generalized to multiple rails.

3.2.1.3 Pulse Generation

We shall finally see how r0__ is precharged. The bit generator is particularly simple, and all that is required for precharging is a sequence of inverters. The final PRS, with the PRs listed in order of execution, is as follows:

(3)¬r0→re↑
re→r0__↓
¬r0__→r0↑
(4)¬r0__→rf↓
(3)r0→re↓
¬rf→r0__↑
(4)r0__→rf↑

Figure 19:
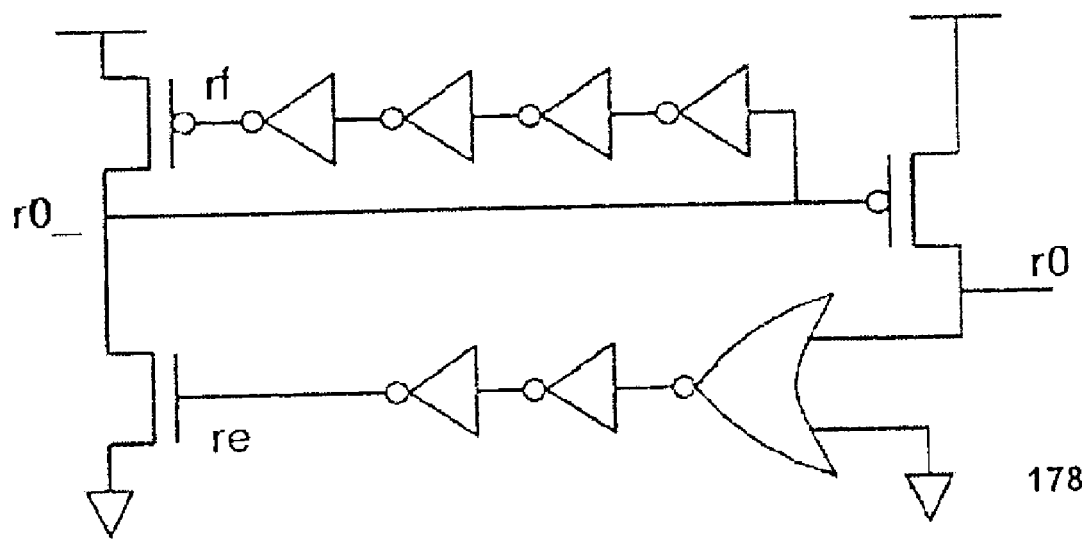
FIG. 19 is a circuit diagram of a complete STAPL bit generator according to one embodiment of the present invention.

The final complete circuit of the STAPL bit generator 178 is shown in FIG. 19, where we see the expanded version of each PR. Although it is not shown in the diagram, all nodes that are dynamic must be staticized; nodes that are pulsed may be staticized with a resistor to Vdd, whereas those that hold state must be staticized with a cross-coupled inverter-pair with weak feedback or an equivalent latching circuit. (The bit generator does not have any nodes that hold state.)

3.2.1.4 Execution

It will be instructive to make a timeline for P's execution, labeling each transition with the time when it occurs. Starting with the fall of r0 at t=−3 (the rationale for this choice is that we shall consistently have the inputs to the domino block become active at t=0), we get the following:

| action | time |
| --- | --- |
| r0↓ | −3 |
| re↑ | 0 = (−3) + 3 |
| r0__↓ | 1 |
| r0↑ | 2 |
| rf↓, re↓ | 5 = 1 + 4 = 2 + 3 |
| r0__↑ | 6 |
| r0↓ | 7 + δ = 2 + (5 + δ) |
| rf↑ | 10 = 6 + 4 |
| re↑ | 10 + δ = (7 + δ) + 3 |

An arbitrary delay, δ, has been added to the response time of process Q. This δ accounts for the pulse-signaling constraint's being single-sided on the response time of Q: Q may respond to r0↓ after $\xi_{false}$ has elapsed, but it need not; the arbitrary extra time that Q lingers in a particular execution is captured by δ. This allowed, arbitrary δ is what makes the design style asynchronous and composable.

3.2.1.5 Constraint Satisfaction

Let us verify that this circuit satisfies the single-track-handshake constraint. Calling the pulse generator P and its neighbor Q, we must check that P obeys $\sigma_{true}$ and $\xi_{false}$ on r0 and Q obeys $\sigma_{false}$ and $\xi_{true}$. We assume all the σs and ξs are five time units (transition times). Since we are here describing the bit generator, we shall postpone the verification for Q to the section on the bit bucket; we shall assume that Q does its part and resets r0 at the earliest five time units after P has set it to true and that Q holds it false for no more than five time units.

Process P drives r0 from the time r0__ goes down until it goes back up; this is 6−1=5 time units, as desired. Likewise, after r0 goes down at −3, P does not attempt driving it until at 2, again five time units. These things are clear from the production rules.

We should note that the pull-up transistor that causes r0↑ must be sized large enough to drive the actual output most of the way to Vdd during the pulse. This means, for instance, that the only way of handling intrinsically long-delay outputs (e.g., outputs that themselves behave like RC loads rather than, as we have assumed, mere capacitive loads) is to slow down the circuits. We should hence not expect to use STAPL signaling off-chip or even on very long on-chip wires (see Section 5.1.3).

3.2.1.6 Remarks

A few things are noteworthy in the trace of P: $rf\downarrow$ and $re\downarrow$ occur after the same number of transitions; falling transitions occur at odd time indices, rising transitions at even indices; there are two "extra" transitions in $\neg r0\_\rightarrow re\uparrow$, and three in $\neg r0\_\rightarrow rf\downarrow$, that we have not made use of (in the sense that they are realized with inverters, but we could conceivably introduce logic instead; we cannot remove them completely since then the circuit would no longer satisfy $\xi_{false}$).

First, the fact that $rf\downarrow$ and $re\downarrow$ occur at the same time is evidence that an important general design principle has not been ignored: the inputs to a logic gate's arriving simultaneously ensures that the gate spends the least possible time in an idle state. We shall see later that we cannot always trust re as sufficient flow control, and we shall sometimes have to use $re \wedge rf$ in the pulldown network; re and $rf$'s being synchronized will then be of even more value.

Secondly, the strict alternation of falling and rising transitions suggests that a direct CMOS implementation is possible. We shall see that we can maintain this property while generalizing the design of the bit generator.

Lastly, we shall also find the "extra" transitions useful in generalizing the circuits; it is for instance obvious that the three transitions allotted to the path $\neg r0\rightarrow re\uparrow$ could be used for implementing the neutrality and validity checks of wide channels, e.g., 1-of-8 codes.

3.2.2 Bit Bucket

The bit bucket is the counterpart to the bit generator; its CHP is

*[L?_], where the use of the underscore variable_signifies that the process should discard the incoming values, which it has read on L. The corresponding HSE is

*[[l0∨l1]; 10↓, 11↓], where every 10↓, 11↓ except one is vacuous. The bit bucket's specification is similar to the bit generator's; and this suggests that we might be able to reuse the bit generator design, with appropriate modifications. However, this approach would not be suitable for generalization to the more complex units that we shall study later, because of our asymmetric choice of delays in the STAPL family: two transitions for the path input↑-to-output↑ (the forward latency), but five transitions for input↑-to-input↓ (=$\xi_{true}$). Therefore, we develop the bit bucket quite differently from how we developed the bit generator; this will serve the purpose of providing an example of the input circuitry required in a generic STAPL unit.

3.2.2.1 PRS Implementation

Although the bit bucket does not require the input values on L for any computation, it obviously cannot work without detecting the presence of inputs. We introduce a "dummy output" for this purpose; it is convenient to choose this output to be a single-rail channel— we call it X—, which cycles for every L received. The node implementing X, $x_{13}$, is precharged in the same way that the domino output is precharged in the bit generator. The corresponding PRS is l0∨l1→x_↓
(4)¬x_→xf↓
¬xf→x_↑
(4)x_→xf↑.

If we consider the case when l0 is the asserted input at t=0, the execution trace is as follows:

| action | time |
|---|---|
| l0↑ | 0 |
| x_↓ | 1 |
| xf↓ | 5 = 1 + 4 |
| x_↑ | 6 |
| xf↑ | 10 = 6 + 4 |

What remains is for us to ensure that the input is removed at time index 5. We do this by, first, adding output-validity circuitry (even though all we have is a dummy output); we call the node that checks the output validity xv. Since x_ is here a single-rail signal, this amounts to an inverter. Secondly, we add a pulse generator for generating the pulse that resets the inputs. To minimize the number of different circuits that shall need to be verified for timing and other properties, we arrange that this pulse generator is as similar as possible to the x_ pulse generator; i.e., it will generate negative pulses; this being the case, the actual reset pulse will have to be generated by an inverter.

We introduce the names ρ for the internal, negative pulse; ρf for the precharge of ρ; and R4 for the positive reset pulse, where the "4" conveniently denotes that the pulse becomes active four transitions after the input arrives (recall our convention of choosing for t=0 the time of the input's becoming defined). Hence the PRS:

l0∨l1→x_↓
¬x_→xv↑
(4)¬x_→xf↓
xv→ρ↓
¬ρ→R4↑
(4)¬ρ→ρf↓
R4→l0↓, l1↓
¬ρf→ρ↑
ρ→R4↓
(4)ρ→ρf↑
¬xf→x_↑
¬x_→xv↓
(4)x_→xf↑

Figure 20:
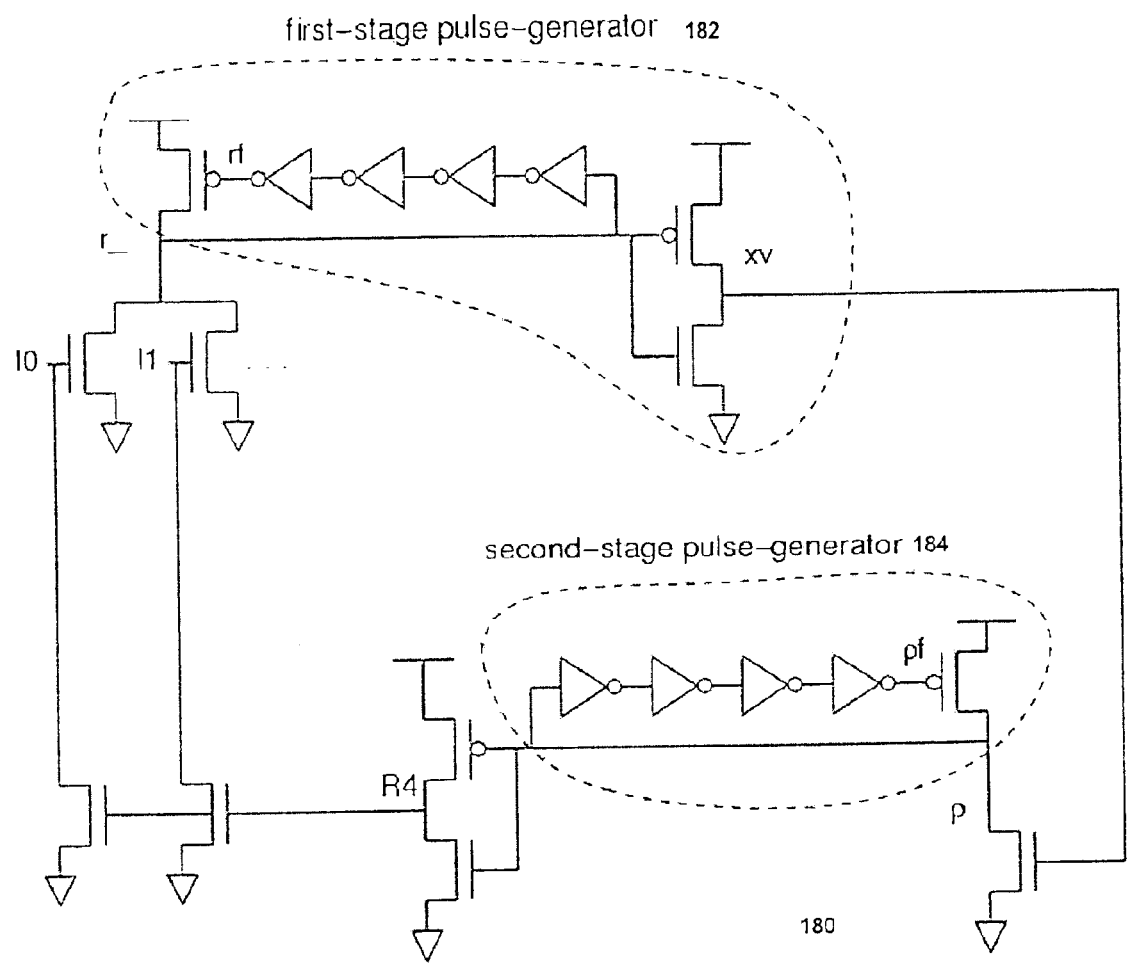
FIG. 20 is a circuit diagram of STAPL bit bucket according to one embodiment of the present invention.

The STAPL bit bucket 180 is shown a circuit diagram in FIG. 20. Note that we have shown xv as being within the first-stage pulse-generator 182 because we should consider it part of the output completion of the pulse generator, not as an output. In other words, a pulse generator with a wide output channel would still have only a single xv output. There is also a second-stage pulse-generator 184 to complete our cycle.

3.2.2.2 Execution

The execution trace becomes as follows:

| action | time |
|---|---|
| l0↑ | 0 |
| x_↓ | 1 |
| ρ↓ | 3 |
| R4↑ | 4 |
| l0↓, xf↓ | 5 = 4 + 1 = 1 + 4 |
| x_↑ | 6 |
| ρf↓ | 7 = 3 + 4 |

-continued

| action | time |
|---|---|
| ρ↑ | 8 |
| R4↓ | 9 |
| xf↑ | 10 |
| l0↑ | 10 + δ = 5 + (5 + δ) |
| x_↓ | 11 + δ |
| ρf↑ | 12 = 8 + 4 |
| . . . | |

We should now verify that the bit bucket satisfies the timing constraints we claimed for it when we verified the bit generator, in Section 3.2.1.5. There we claimed that the bit bucket does its part and resets l0 (the bit generator's r0) at the earliest five time units after the bit generator has set it to true and that the bit bucket holds it false for no more than five time units.

We see from the production rules and the execution trace that the bit bucket indeed takes five transitions to respond, satisfying $\xi_{true}$. Furthermore, the resetting of the input is handled by the signal R4; this signal is active (high) for five transitions too, which satisfies $\sigma_{false}$.

We observe that the remarks of Section 3.2.1.6 hold for the bit bucket also.

3.2.3 Left-right Buffer

We have seen enough detail in the description of the bit bucket and bit generator that we can combine the two to build a left-right buffer, which is the needed basic unit of circuitry that is found in more complex STAPL circuits. The left-right buffer serves as a template from which other STAPL circuits can be built.

The CHP specification for the buffer is

BUF=*[L?x; R!x].

We shall give the implementation of BUF for the case when L and R are one-bit (1-of-2) channels. The HSE for BUF is then

*[[l0→r0↑[]l1→r1↑]; l0↓, l1↓, [¬r0∧¬r1]].

3.2.3.1 PRS Implementation

Except for the fact that both the output rails are used (and thus must be checked for validity), the output looks like that of the bit generator, in other words, (3)¬r0∧¬r1→re↑ re∧l0→r0__↓ re∧l1→r1__↓

¬r0__→r0↑

¬r1__→r1↑

(4)¬r0__∨¬r1__→rf↓

(3)r0∨r1→re↓

¬rf→r0__↑, r1__↑

(4)r0__∧r1__→rf↑;

the inputs are handled as in the bit bucket:

¬r0__∨¬r1__→rv↑ r0__∧r1__→rv↓ rv→ρ↓

¬ρ→R4↑

(4)¬ρ→ρf↓

R4→l0↓, l1↓

¬ρf→ρ↑

ρ→R4↓

(4)ρ→ρf↑

Figure 21:
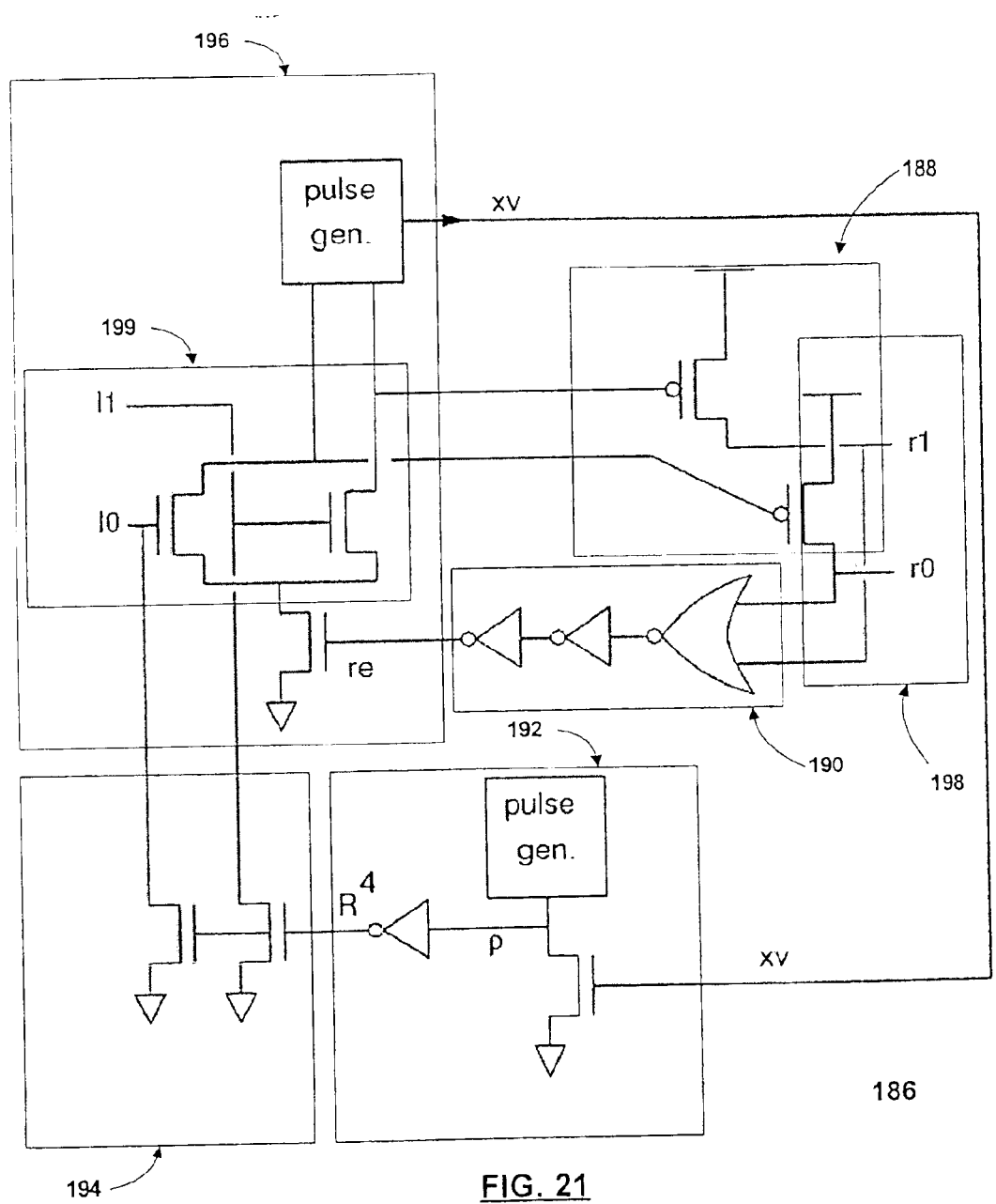
FIG. 21 is a circuit diagram of STAPL left-right buffer according to one embodiment of the present invention.

The only thing that is different in BUF compared with the program that should result from merging the PRs for the bit bucket and the bit generator is the two rules re∧l0→r0__↓ and re∧l1→r1__↓. These rules are responsible for the computation of the output, when a value arrives on L, as well as for flow control, when the process that receives R is slow to respond. The complete STAPL left-right buffer circuit 186 is shown in FIG. 21.

Several of the main components should be pointed out. First, there is converting component 188, which is responsible for converting pulses to level high voltage. Then there is checking component 190, which checks to ensure that no old output is still pending. Pulse generating component 192 contains a pulse generator for generating a resetting pulse. It is connected to converting component 194, which resets inputs and converts reset pulse to level "0." Finally there is pulse generating component 196, which begins the whole process by generating the sending pulse. Input component 199 and output component 198 can be generalized to handle more than one input and output. To generalize, an n-input pulse generator is made by replacing the first inverter (not shown) in the 1-input pulse generator in pulse generating component 196 with an n-input NAND-gate, as suggested by the PRS. To see the first inverter, recall the detailed portion of the pulse generator 182 shown in FIG. 20. The NAND-gate would take n-input from an n-input component 199 instead of the one input version shown. Similarly, a n-output component can be used placed of the 1 output component 198 as shown in the figure.

This circuit embodiment forms one of the most useful basic building blocks of STAPL circuits.

The left-right buffer consists mainly of a domino block and two pulse generators. One pulse generator is used for generating the outputs of the circuit; the other is used for clearing the inputs.

3.2.3.2 Execution

The execution trace for this process, assuming that the first L and the first re↑ both arrive at t=0 and that the counterpart on L sends 0, 1, . . . , is as follows:

| action | time |
|---|---|
| l0↑, re↑ | 0 |
| r0__↓ | 1 |
| r0↑ | 2 |
| ρ↓ | 3 |
| R4↑ | 4 |
| l0↓, rf↓, re↓ | 5 |
| r0__↑ | 6 |
| ρf↓ | 7 |
| r0↓ | 7 + ε = 2 + (5 + ε) |
| ρ↑ | 8 |
| R4↓ | 9 |
| rf↑ | 10 |
| l1↑ | 10 + δ = 5 + (5 + δ) |
| re↑ | 10 + ε = (7 + ε) + 3 |
| r1__↓ | 11 + max(δ, ε) = max((10 + δ) + 1, (10 + ε) + 1) |
| ρf↑ | 12 = 8 + 4 |
| . . . | |

Arbitrary delays δ and ε have been inserted where the neighbor processes are allowed to linger; these delays have the same meaning as the δ of Section 3.2.1.4. Again, these allowable extra delays are what make this design style asynchronous, i.e., composable and modular.

3.2.3.3 Timing Assumptions

Figure 22:
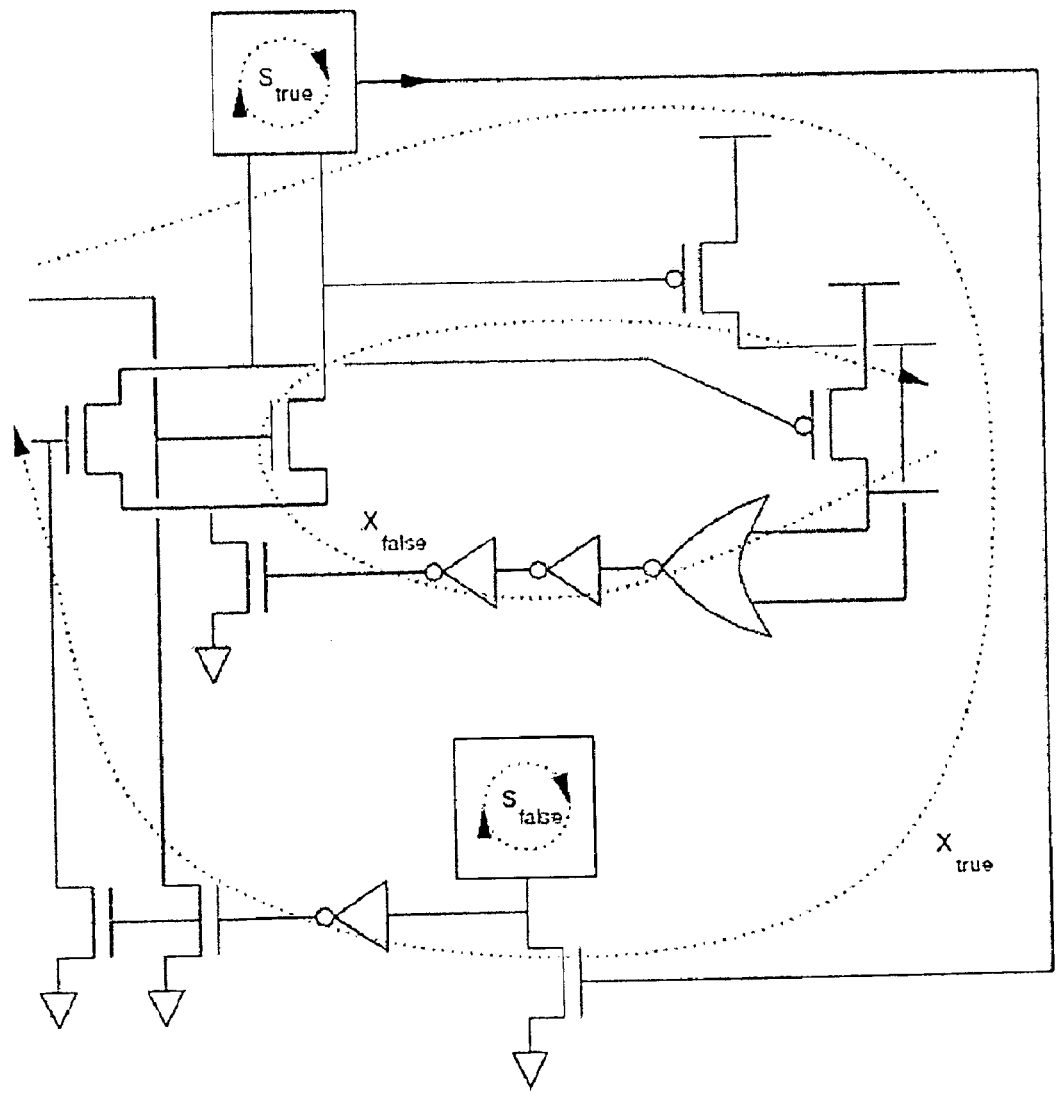
FIG. 22 shows the paths implementing the delays $s_{true}$, $s_{false}$, $x_{true}$, and $x_{false}$ in the STAPL left-right buffer.

FIG. 22 is a circuit diagram that shows the paths implementing the delays $s_{true}$, $s_{false}$, $x_{true}$, and $x_{false}$ in the STAPL left-right buffer 186. FIG. 22 shows how the different parts of the circuit satisfy the timing constraints: as promised, the σ pulse-lengths are controlled with pulse generators, and the ξ response-delays are delays through the logic. We call the actual delays of the circuit, as opposed to the timing constraints, $s_{true}$, $s_{false}$, $x_{true}$, and $x_{false}$.

While the single-track-handshake constraint only requires the conditions $\xi_{true} \geq \sigma_{true}$ and $\xi_{false} \geq \sigma_{false}$, our circuit implementations depend on more than that. The handshake constraint gives us the following constraints on $s_{true}$, $s_{false}$, $x_{true}$, and $x_{false}$:

$$s_{true} \leq \sigma_{true} \quad (2)$$

$$s_{false} \leq \sigma_{false} \quad (3)$$

$$x_{true} \geq \xi_{true} \quad (4)$$

$$x_{false} \geq \xi_{false} \quad (5)$$

As we have remarked earlier, we always handle the σ constraints with pulse generators; hence we should expect $s_{true} \approx s_{false}$; $\sigma_{true}$ and $\sigma_{false}$ are also of course approximately equal to the s's. Since we have the difficult task of making sure that s is long enough for latching the output transistor yet not too long to violate (2) or (3), choosing to generate s with a single, well-characterized circuit is the right thing to do.

The only part of the circuit that can be slowed down arbitrarily is the domino pull-down that computes the logic; if the reset pulse is delayed, then the circuit may double-latch the inputs, and if the flow control through the NOR gate and inverters to re is slowed down, then the circuit may produce another output before it is allowed to do so.

3.2.3.4 Remarks

Again, the remarks of Section 3.2.1.6 hold. We note that r1_↓ happens only after both the arbitrary extra delays before l1↑ and r0↓ have been accounted for; this means that, as required, the circuit will not produce a new R until $\xi_{false}$ time units after the old R has been consumed, nor will it attempt removing the new L until $\xi_{true}$ time units after the new L has arrived. Furthermore, we should note with satisfaction that l0↓, rf↓, and re↓ are perfectly synchronized and will stay thus as long as δ and ε are both zero; connecting buffers in a long chain with a bit generator at one end and a bit bucket at the other end will keep them at zero. But it is a bad sign for efficiency that several transistors in series are required in some places, viz. in the gates that compute rv and rf; we should like to avoid this kind of variance from the template because it introduces delays that are more difficult to keep uniform across a large system with diverse circuits.

3.3 Summary of Properties of the Simple Circuits

So far, we have seen three STAPL circuits: the bit generator, the bit bucket, and the STAPL dual-rail left-right buffer. The following properties hold.

1. Each circuit takes at minimum 10 transitions for a cycle (the time it takes to return to a state once it has been departed).
2. If the environment of the circuit does not impose further timing constraints (in our discussion, by setting δ>0 or ε>0), then the circuit takes exactly 10 transitions per cycle.
3. The forward latency of the left-right buffer is two transitions.
4. If the environment imposes δ>0 or ε>0, then the circuit slows down accordingly; i.e., flow control is automatic.
5. The circuits can be implemented in CMOS; i.e., all the PRs are antimonotonic.
6. If the environment does not impose δ>0 or ε>0, then every input to every conjunctive gate arrives simultaneously.
7. The static slack of the left-right buffer is one; its dynamic slack is, to first order, 1/5. The static slack is the maximum number of tokens (data items) that a chain of buffers can hold when deadlocked; the dynamic slack is the number of tokens held at maximum throughput.
8. Foot transistors, except for the flow-control transistor, are unnecessary.
9. The inputs of the left-right buffer lead only to the domino block; no extra completion is necessary.
10. One or several NAND-gates with fanin equal to the width of the output channel are required in the circuit.

Each one of these except the last is a desirable property. Unfortunately, not all of the desirable properties can be maintained in more complex situations: specifically, we shall need foot transistors and extra completion-circuitry in some cases. We shall be able to remove the NAND-gates' series transistors, however.

4 Advanced STAPL Circuits

In the present invention, STAPL circuit embodiments are capable of basic dataflow operations:

Computing an arbitrary logical function
Computing results conditionally
Receiving operands conditionally
Storing state
Making non-deterministic decisions
Communicating with four-phase QDI circuits The rest of this section describes how we provide each one of these capabilities in the STAPL circuit embodiments. A circuit template that simultaneously admits of as many of these capabilities as possible is presented. Such a template will allow the direct compilation of as wide a class of CHP programs as possible.

4.1 Multiple Input and Output Channels

Let us consider the program

DBUF≡*[L?x, M?y; R!x, S!y], which is a simple example of synchronized input and output channels. In this form, this is not a very useful program; as we mentioned, the computation model that we are working in assumes that only the sequence of values sent on every channel—not the relative timing of the communications—has meaning, so DBUF could equally well be written *[L?x; R!x]∥*[M?y; S!y]. In a slack-elastic program, the syntactic semicolon, like the one in DBUF, is not what demands synchronization; dependencies between different data computations are what demand it. But still we study DBUF so that we shall see synchronizations in their simplest form; we do not yet want to think about the reasons for and extents of data dependencies.

In the present invention, we do not introduce unnecessary synchronization on the compute path of a STAPL process; accordingly, we shall not invent an artificial scheme for synchronizing DBUF exactly as the CHP has been written. Instead, we shall implement the program DBUF2≡*[(L?x; R!x), (M?y; S!y)].

The synchronization between L, R and M, S in DBUF2 lies in the implied semicolon at the end of the loop, which keeps the channels loosely synchronized (i.e., cL−cM≦1, etc. at all times).

We shall not burden our circuits with synchronization on the forward path (except for the needed data synchronization); hence, at the HSE level, DBUF's synchronizes the channels on the reset phase. In other words, assuming single-rail data, DBUF≡*[([l∧¬r]; r↑), ([m∧¬s]; s↑); l↓, m↓].

4.1.1 Naïve Implementation

Figure 23:
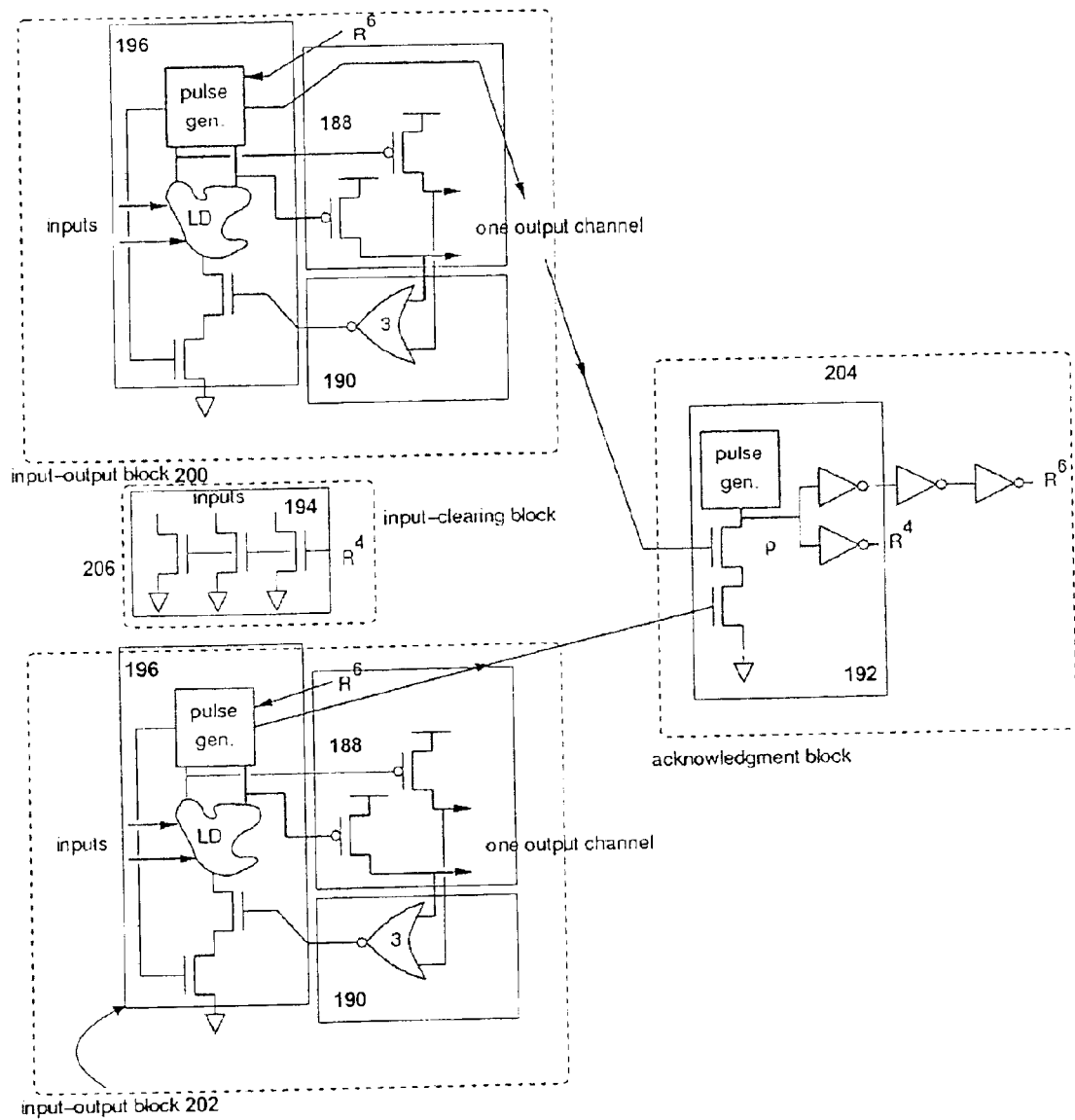
FIG. 23 is a diagram showing a schematic version of the unconditional STAPL template according to an embodiment of the present invention.

Most of the PRS implementation of DBUF is a straightforward composition of the two left-right buffers we saw above; one may surmise that certain parts will have to be shared in order to accomplish the synchronization, and that other parts cannot easily be shared. Examining the structure of the left-right buffer (see Section 3.2.3.4), we see that we may attempt generalizing it—at first incorrectly, it will turn out—into a new circuit that can handle several channels by using one pulsed domino block for each output channel and one extra pulsed block for generating the clear signal for the inputs. (The general scheme we use for generalizing the buffer's circuit structure is shown in FIG. 23.) In FIG. 23, there are input-output blocks 200 and 202, each sending a one channel output to acknowledgement block 204 in response to the inputs that each receives. Also present is an input-clearing block 206. The block (206) generating the clear signal will accomplish the simultaneous reset of l and m specified by the HSE. We should thus get the following PRS:

| | | | |
|---|---|---|---|
| $(3)\neg r$ | $\rightarrow re\uparrow$ | $rv \wedge sv$ | $\rightarrow \rho\downarrow$ |
| $re \wedge l$ | $\rightarrow r\_\downarrow$ | $\neg\rho$ | $\rightarrow R4\uparrow$ |
| $\neg r\_$ | $\rightarrow r\uparrow$ | $(4)\neg\rho$ | $\rightarrow \rho f\downarrow$ |
| $(4)\neg r\_$ | $\rightarrow rf\downarrow$ | $R4$ | $\rightarrow l\downarrow, m\downarrow$ |
| $(3)r$ | $\rightarrow re\downarrow$ | $\neg\rho f$ | $\rightarrow \rho\uparrow$ |
| $\neg rf$ | $\rightarrow r\_\uparrow$ | $\rho$ | $\rightarrow R4\downarrow$ |
| $(4)r\_$ | $\rightarrow rf\uparrow$ | $(4)\rho$ | $\rightarrow \rho f\uparrow;$ |
| $\neg r\_$ | $\rightarrow rv\uparrow$ | | |
| $r\_$ | $\rightarrow rv\downarrow$ | | |
| $(3)\neg s$ | $\rightarrow se\uparrow$ | | |
| $se \wedge m$ | $\rightarrow s\_\downarrow$ | | |
| $\neg s\_$ | $\rightarrow s\uparrow$ | | |
| $(4)\neg s\_$ | $\rightarrow sf\downarrow$ | | |
| $(3)s$ | $\rightarrow se\downarrow$ | | |
| $\neg sf$ | $\rightarrow s\_\uparrow$ | | |
| $(4)s\_$ | $\rightarrow sf\uparrow$ | | |
| $\neg s\_$ | $\rightarrow sv\uparrow$ | | |
| $s\_$ | $\rightarrow sv\downarrow$ | | | note that the only PR that synchronizes the activities of the L–R block with those of the M–S block is $rv \wedge sv \rightarrow \rho\downarrow$.

4.1.2 Double Triggering of Logic Block in the Naïve Design

From the pulse repeaters presented in Section 3 we remember that an input staying active for too long could cause a pulse repeater's consecutively interpreting that input as several; the same problem could occur in DBUF. If for instance an input arrives by way of $l\uparrow$ but some delay should intervene before the arrival of $m\uparrow$, then DBUF would not quickly reach the action $l\downarrow$; as a result, l could stay true for an arbitrarily long time. The trouble this would cause is apparent from an examination of the relevant PRs, those of the L–R block, viz.

| | | | |
|---|---|---|---|
| $(3)\neg r$ | $\rightarrow re\uparrow$ | $\neg rf$ | $\rightarrow r\_\uparrow$ |
| $re \wedge l$ | $\rightarrow r\_\downarrow$ | $(4)r\_$ | $\rightarrow rf\uparrow$ |
| $\neg r\_$ | $\rightarrow r\uparrow$ | $\neg r\_$ | $\rightarrow rv\uparrow$ |
| $(4)\neg r\_$ | $\rightarrow rf\downarrow$ | $r\_$ | $\rightarrow rv\downarrow;$ |
| $(3)r$ | $\rightarrow re\downarrow$ | | | there is here no mention of R4 nor of $\rho$; since it does not wait for these signals, this circuit would read l as being true repeatedly; this would continue until $m\uparrow$ occurs, when $\rho$ and R4 will at last pulse, removing l from the input and finally—alas, too late!—putting an end to the nonsense.

The way to eliminate the repeated triggering of the L–R block is obvious. The issue is simply that we did not properly implement the final semicolon in $*[([l\wedge\neg r]; r\uparrow), ([m\wedge\neg s]; s\uparrow); l\downarrow, m\downarrow]$. We cannot allow the L–R block's cycling twice before the M–S block has had its say. This is not hard to do; we change the pulse generator so that it will have to be "armed" before it will cycle. We do this by making the pullup of $rf$ conditional on the arming signal, which we call Rx. But is then the PR $r\_ \rightarrow rf\downarrow$ necessary? Not if we guarantee that $Rx\uparrow$ can cause $rf\uparrow$ only after $r\_$ would have caused it in the naïve design; and this is easy to do, because we know exactly when $r\_$ will go back up, viz. at transition 6.

4.1.3 Solution

The naïve design works properly and efficiently when l and m are synchronized; as long as they are synchronized, Rx must re-arm the pulse generator at the same as in the naïve design. When l and m are not synchronized, Rx needs to re-arm both pulse generators exactly when the later of l and m should have re-armed it. From this discussion, it is obvious that Rx can be a delayed version of R4 since R4 already waits for the later of l and m.

Thus we arrive at a satisfying design that not only can be generalized to multiple outputs but also does away with the pesky series n-transistors that were required by the static-logic design when $r\_$ carries data. The production rules for $rf$ become $(4)\neg r\_ \rightarrow rf\downarrow$ $(?)Rx \rightarrow rf\uparrow.$ By comparing the transition time-indices of Rx, R4, and the inputs, we find that $rf\uparrow$ should be enabled at t=10, whence we deduce that $(2)R4 \rightarrow R6\uparrow$ $(2)\neg R4 \rightarrow R6\downarrow$ $(4)\neg r\_ \rightarrow rf\downarrow$ $(4)R6 \rightarrow rf\uparrow$ will do the job.

For the scheme to work completely, we must eliminate the possibility that the inputs cause the path $re \wedge l \rightarrow r\_\downarrow$ to turn on at the same time that $rf$ is pulling $r\_$ up. This is our first encounter with the problem because of the fortuitous (and fortunate) way that the timing of $rf$ always aligned with that of $re$ in the bit generator and in the left-right buffer. The solution lies in adding a foot transistor to the PR for $r\_\downarrow$; the foot's being gated by $rf$ will prevent the unwanted interference (in the simple circuits of the prior section, the foot transistor is not required because the re node cuts off the pulldown path; since no other outputs are being generated, the pulse generator always re-arms immediately—eight transitions—after the output is produced). Observe that the foot transistor is required in an input-output domino-block if and only if there is in the process more than one input-output block; i.e., it is required for all output channels if and only if there are in total two or more output channels. No extra foot transistor is required in the $\rho$ block.

We should of course make the corresponding changes for the S–M block; we can also introduce a signal R8, defined in analogy with R6, thus removing the combinational pullup for $\rho$; as far as we know at present, the only reason we should do this is to maintain the similarity between the L–R and M–S pulse generators on the one hand and the $\rho$–Rx pulse generator on the other; but see Section 4.3 for a better reason.

Summing up, we have the PRS for DBUF:

| | | | |
|---|---|---|---|
| (3)¬r | → re↑ | ¬r__ | → rv↑ |
| rf ∧ re ∧ l | → r__↓ | r__ | → rv↓ |
| ¬r__ | → rf↑ | (3)¬s | → se↑ |
| (4)¬r__ | → rf↓ | sf ∧ se ∧ m | → s__↓ |
| (3)r | → re↓ | ¬s__ | → s↑ |
| ¬rf | → r__↑ | (4)¬s__ | → sf↓ |
| (4)R6 | → rf↑ | | |
| (3)s | → se↓ | (4)¬ρ | → pf↓ |
| ¬sf | → s__↑ | R4 | → l↓, m↓ |
| (4)R6 | → sf↑ | ¬pf | → ρ↑ |
| ¬s__ | → sv↑ | ρ | → R4↓ |
| s__ | → sv↓ | (4)ρ | → pf↑ |
| rv ∧ sv | → ρ↓ | (2)R4 | → R6↑ |
| ¬ρ | → R4↑ | (2)¬R4 | → R6↓ |

4.1.4 Timing Assumptions

With the addition of the R6 circuitry, some of the timing constraints that were present in the simple circuits have become easier to satisfy: this is good because it may be more difficult to predict the delays in these more complicated circuits. Specifically, the two constraints mentioned in Section 3.2.3.3 are now easier to satisfy: the reset pulse's being delayed now cannot cause the circuit to double-latch the inputs, because the reset pulse is used for re-arming the pulse generators, which must happen before another output can be produced; similarly, adding the foot transistor removes the need for re's switching early enough to keep the circuit from producing another output during the same cycle.

4.2 General Logic Computations

We need to change very little in the buffer template that we have been studying for it to be used for more general computations. If we consider DBUF from the previous section and compare it with a half-adder, HADD, the kinship is obvious because DBUF≡*[L?x, M?y; R!x, S!y], and HADD≡*[A?a, B?b; S!(a+b)$_0$, D!(a+b)$_1$], where the subscripts denote bit indexing. If we implement the computation of a+b directly on the input rails, the calculation is self-synchronizing; i.e., no result will be produced till the inputs have arrived. The only PRs for HADD that we need state are se∧sf∧(a.0∧b.0∨a.1∧b.1)→s__.0↓ se∧sf∧(a.1∧b.0∨a.0∧b.1)→s__.1↓ de∧df∧(a.0∨b.0)→d__.0↓ de∧df∧(a.1∧b.1)→d__.1↓;

the rest can be easily inferred from the descriptions of the left-right buffer and DBUF.

4.2.1 Inputs Whose Values are not used

We can only trust the simple compilation, which appears to work in the case of HADD and DBUF, when the logic computation is itself enough to implement the required handshaking behavior. When the logic computation does not suffice for this, we shall have to add further circuitry.

An example will clarify. Let us consider a circuit that generates only the carry output of a full-adder, CADD≡*[A?a, B?b, C?c; D!(a+b+c)$_1$], where the subscript "1" denotes bit indexing. By following the procedure we used for HADD, we should arrive at the following:

de∧df∧(a.0∧b.0∨a.0∧c.0∨b.0∧c.0)→d__.0↓ de∧df∧(a.1∧b.1∨a.1∧c.1∨b.1∧c.1)→d__.1↓

Omitting the details of the data computations, we can say that HSE is at least

*[[a.0∨a.1], [b.0∨b.1], [c.0∨c.1];
[...→d.0↑[] ...→d.1↑], a.0↓, a.1↓, b.0↓, b.1↓, c.0↓, c.1↓].

But neither a.0∧b.0∨a.0∧c.0∨b.0∧c.0 nor a.1∧b.1∨a.1∧c.1∨b.1∧c.1 actually implements [a.0∨a.1], [b.0∨b.1], [c.0∨c.1], whence we must believe that something is amiss with this implementation of CADD.

4.2.1.1 Aside: Comparison with QDI Precharge Half-buffer

The following discussion has been prepared for those familiar with the implementation of the QDI precharge half-buffer (PCHB) and the QDI weak-condition half-buffer.

We may write the simple (dataless) QDI process *[A?__, B?__, C!__] in terms of HSE as

*[([a$_i$]; a$_o$↑; [¬a$_i$]; a$_o$↓), ([b$_i$]; b$_o$↑; [¬b$_i$]; b$_o$↓), (c$_o$↑; [c$_i$]; c$_o$↓; [¬c$_i$])];

at present, we shall only be concerned with the inputs a$_i$ and b$_i$. Traditionally, authors—Martin among others—have used the notation A to signify a dataless synchronization, thus emphasizing that a dataless synchronization is symmetric. This is sensible when there is no "direction" in the synchronization. But communications almost always have a definite send-receive direction in the design style that we are exploring in this work—the only reason for introducing dataless synchronizations is, with few exceptions, pedagogy. This is why we shall still normally identify the direction of the synchronization, i.e., the party that sends (A!__) and the one that receives (A?__). The handshake on an input, [a$_i$]; a$_o$↑; [¬a$_i$]; a$_o$↓, may be broken down into the rising-edge input completion (also called input validity) [a$_i$], the acknowledgment a$_o$↑, the falling-edge input completion (also called input neutrality) [¬a$_i$], and the reset phase of acknowledgment a$_o$↓. If data is used instead of merely bare handshakes, then [a$_i$] becomes instead [a0∨a1∨ ...], and [¬a$_i$] becomes [¬a0∧¬a1∧ ...].

The essential insight that establishes that the PCHB compilation is often superior to the weak-condition half-buffer (WCHB) compilation is that it is unnecessary and usually unwanted to perform, as the WCHB does, the waits required by a process's handshaking specification in the same operators as the logic computation is performed. Performing the waits with these operators often means strengthening the operators, which reduces their performance for two reasons: it adds extra transistors in series, and it means that inputs that are not required for the computation of the outputs are still waited for; and while our having to insert these waits is troubling enough, in the WCHB we also have to insert neutrality waits for the down-going phase of the handshake; the terror when we realize that this can compile to one additional p-transistor in series for every rail in every input channel!

The PCHB avoids the completion difficulties of the WCHB by our compiling the two functions of handshaking and completion into separate circuitry; the two parts are joined on the input with isochronic forks, and on the output synchronized by a C-element. The very simple requirements on the handshaking part allow an implementation that can be decomposed into OR-gates and C-elements; these operators can be further decomposed, if that should be deemed necessary.

If we observe a PCHB circuit, e.g., an implementation of our offending CADD, in operation, we shall see the following. Sometimes, the logic part of the circuit uses enough information about the inputs in computing its outputs that the input validity may thence be inferred; since, however, the logic part has no p-transistors, it cannot possibly compute the input neutrality. In contrast, the completion part of the circuit always checks both the input validity and the input neutrality.

In a STAPL circuit, input neutrality need not be checked. In effect, our timing constraints guarantee that the inputs are neutral when required—no p-transistors are required for this, and this is of course one of the reasons that STAPL circuits are faster than QDI circuits.

In summary: the QDI circuit often needs only the p-transistors in the completion network; the n-transistors are added so that the completion network itself shall be delay-insensitive. The STAPL circuit does not need the p-transistors; hence we can also omit the n-transistors, except in those unfortunate circumstances (as in CADD) where the logic computation is insufficient for always checking for the arrival of inputs. In other words, in STAPL circuits the need for the completion circuitry is much diminished, but not eliminated.

4.2.1.2 Solving the Problem

In this circuit embodiment, we add the needed completion circuitry to solve the problem posed by the CADD compilation. One way of doing this is simply to make the circuit's producing the outputs always depend on its receiving inputs on all channels: this amounts to checking for the arriving of unneeded inputs in the compute logic. Sometimes this is the preferred way of doing things; but it reduces the slack and increases the number of transistors in series, so it often is not.

Indeed, the bit-bucket compilation suggests what needs to be done if we want to complete the inputs without complicating the computing logic. We add to the circuit a dummy output $\delta$ whose task is checking that all the inputs have arrived before the Rx reset pulses are generated. While it may sometimes be possible to do tricky things with the dummy output, it seems simplest to make it an unconditional output that indicates only that all the inputs have arrived and nothing else; if the normal outputs always check the arrival of certain inputs but not others, the dummy output needs-only check the others. We can specify it thus at the HSE level:

*[([a.0va.1], [b.0vb.1], [c.0vc.1]; $\delta\downarrow$), [ ... →d.0↑[] ... →d.1↑];
$\delta$↑, a.0↓, a.1↓, b.0↓, b.1↓, c.0↓, c.1↓];

the negated sense of $\delta$ allows implementing it as we implement the a_.x operators. The implied PRS is se∧sf∧(a.0∧b.0va.1∧b.1)→s__.0↓
se∧sf∧(a.1∧b.0va.0∧b.1)→s__.1↓
de∧df∧(a.0vb.0)→d__.0↓
de∧df∧(a.1∧b.1)→d__.1↓
$\delta$f∧(a.0va.1)∧(b.0vb.1)∧(d.0vd.1)→$\delta\downarrow$;

since $\delta$ does not leave the process, no $\delta$e node need exist. Note that we get to keep the desirable property that no p-transistors are required for the completion of the unused inputs.

4.2.1.3 Unconditional Process Template

This is how we implement as a STAPL circuit any process of the form

*[<,i::$L_i$?$x_i$>; <,j::$R_j$!$f_j$(<,i::$x_i$>)>], as long as the process is reasonably simple; what is reasonable varies with technology and application.

In terms of circuits, the unconditional process template is schematically illustrated by FIG. 23. As shown in FIG. 23, any unconditional STAPL process can be built out of the following components pieces.

First, one output block for generating the data on each output channel is needed. In the figure we have example input-output blocks 200 and 202, each sending a one channel output in response to the inputs that each receives. A pulse is sent to acknowledgement block 204, which will reset the inputs. Note the similarity of input-output blocks to elements found in the left-right buffer. The essential parts are labeled—sending pulse generating component 196, converting component 188 and checking component 190. Although the figure shows two input-output blocks, it is understood that any number of input-output blocks can be used and the figure is showing an example implementation only.

Also needed is an input-clearing block 206 that is responsible for clearing all the inputs. The input-clearing block contains circuitry similar to that of converting component 194 found in the left-right buffer.

Finally, we need an acknowledgement block. In the figure, acknowledgment block 204 is for implementing the necessary sequencing in the process. The acknowledgment block 204 contains circuitry similar to that of resetting pulse generating component 192 found in the left-right buffer.

Dummy channels as mentioned in the previous section are simply implemented as output channels without the output p-transistors or flow-control NOR-gates. The areas marked "LD" in the figure will contain the circuitry for evaluating the output functions. The reason the circuit in FIG. 23 does not generate R6 directly from R4 is to avoid that the designer's imprudently overloading R4 should affect the pulse shape on R6.

4.3 Conditional Communications

As is obvious from synchronous systems, in which we may consider the value that each node assumes on every clock cycle as the result of a communication, the unconditional template we have so far developed is enough for building a system that implements any arbitrary high-level specification. As is equally obvious from the CHP programming-model, however, our using only unconditional processes is not the only—or even the obvious—way to build message-passing systems: lately, even synchronous designers are investigating conditionally message-passing systems; they do this in the hope that they will thus be able to avoid the costs involved in communicating unnecessarily often.

It is not always clear when introducing conditionality into a system is a good idea, and determining whether it is a good idea in a given situation would take us too far afield from the main subject of this work; we shall simply assume that conditionality may be specified in the CHP, and that when it is specified, it must be implemented.

4.3.1 The Same Program can be Expressed in Several Ways

An elementary example of conditional communication is the split, viz.,

SPLIT≡*[C?c, L?x; [c=0→R0!x[]c=1→R1!x]];

another is the merge,

MERGE≡*[C?c; [c=0→L0?x[]c=1→L1?x]; R!x].

The asymmetry (most noticeably, the differing number of semicolons) between SPLIT and MERGE is somewhat illusory, due in part to syntactic issues with the CHP language. We might, e.g., write SPLIT≡*[C?c; [c=0→R0!(L?)[]c=1→R1!(L?)]],
MERGE≡*[C?c; [c=0→R!(L0?)[]c=1→R!(L1?)]];

in the slack-elastic model, rewriting like this in no way changes the meanings. Inventive persons have carried this argument further, noticing that the receiving of c into an internal variable is needless; the output or outputs depend on c as much as they depend on l, only in a different way. If we insisted on our code's reflecting the symmetry between c and l, we should for example have that, written with a single, implied semicolon, SPLIT≡
  *[[$\overline{C=0}$→C?__, R0!(L?)
    ⫿$\overline{C=1}$→C?__, R1!(L?)
  ]].

While SPLIT seems at home with this transformation, the same could not be said for many more complex processes; the synchronization behavior implied by our writing the processes in this way may be closer to what we aim at in our HSE-PRS compilation, but the semantic advantage is outweighed by the degree that the code is obscured to, and we hence shall usually take the position that slack elasticity allows us: all the programs for SPLIT we have given in this section are equivalent and should compile the same.

4.3.2 Simple Techniques for Sends

There is a wide variety of ad hoc techniques available for adding conditional sends to QDI process templates; we shall briefly study the simplest one before proceeding to general methods.

Consider the "filter" process

FILTER≡*[C?c, L?x; [c=0→R!x⫿c=1→skip]].

The simplest QDI implementation of this process is arrived at by starting with a QDI left-right buffer and to it adding an extra, dummy output-rail of r__; this appears not to work so well in the STAPL family, because it appears that we shall need to add a dummy block for completing L when c=1. However, that the dummy block is required is a property of the output function—not of its implementation; the dummy block would in any case be required because the outputs do not always complete the inputs. For other circuits with conditional outputs, the dummy block may not be required, because'the input could be completed by some other, unconditional, output; or conversely the dummy block may be needed because the output functions do not compute the input completion even when the outputs are generated, as happened with CADD.

We give the PRS for r__:

re∧c.0∧l.0→r__.0↓
re∧c.0∧l.1→r__.1↓
c.1→r__.∞↓;

using re in the PR for r__.∞↓ is quite legal, but unnecessary. (Sharp eyes and minds will notice that replacing the PR for r__.∞↓ with c.1∧(1.0∨1.1)→r__.∞↓ will, in this special case, obviate the dummy block.) Being only an internal signal in FILTER, r__.∞ has no output p-transistor.

4.3.3 General Techniques for Conditional Communication-actions

We may solve the problem of conditional outputs by adding a dummy rail, but this is not always the most efficient way of doing it; thinking about the behavior of the circuit, we should realize that while no outputs are generated when r__.∞ cycles, there is still much internal activity going on. The situation becomes especially bad if most output circuits are not generating outputs on a given cycle—they shall still have to cycle their dummy rails.

More seriously, the dummy-rail technique helps not at all if what we want is a conditional input. That satisfying this desire is more difficult is clear if we consider that a conditional input implies, among other things, conditional reset pulses. We cannot sidestep this difficulty by resetting inputs that are not being used because we are required to keep our circuits slack-elastic: inputs must be allowed to arrive arbitrarily early; hence resetting inputs that are not being used would violate the handshaking specification.

4.3.3.1 A General Method

We shall solve the problem of general conditional communications by introducing another domino-logic block. This domino-logic block will compute which inputs and outputs the process uses on a given cycle. We shall avoid introducing new fundamental constructs by using the same kind of domino block for the conditions as for the logic computations; this means that this conditions block shall have a one-hot (i.e., 1-of-n) output. In other words, depending on the input, the conditions block computes which of several possible communication patterns is being followed.

We shall illustrate the method by implementing SPLIT and MERGE.

4.3.3.2 SPLIT Implementation

The SPLIT process has only conditional outputs; this will make the compilation simpler than for MERGE. We first introduce an internal channel p__ that denotes the communication pattern. There are two mutually exclusive communication patterns followed by SPLIT: receive on C, receive on L, send on R0; and receive on C, receive on L, send on R1: we call the former p__.0, and the latter p__.1. Furthermore, we may consider p__ as the manifestation of an internal, unconditional channel P, whence we may summarize the communication patterns in the table:

| Condition | When true | Channels exercised |
|---|---|---|
| p.0 | c.0 | C L R0 P |
| p.1 | c.1 | C L R1 P |

Why can we not use c directly instead of generating the middleman p__? Admittedly, SPLIT is a special case where we could implement the conditional communications more simply; but one of the main problems is that if we try to use c directly, it becomes defined and needs to be reset at the wrong times, viz. in each case two transitions after the other inputs. (Recall that the logic block synchronizes c and l because they are both used in the same production rules; hence we cannot simply require that c be presented two stages later by the environment.) This is an unwanted asymmetry in the circuit; furthermore, the additional two stages of delay introduced by the conditions block also allow our using much more complex conditions.

We make all the activity in the acknowledge block conditional on the communication pattern; thus, ρ, R4, and R6 become one-hot-codes (one-"cold" for ρ).

In any case, the PRS consists of the usual compilation for the outputs and additionally of conditional-communication circuitry. First, the PRs for p__ and p are p$f$∧c.0→p__.0↓
p$f$∧c.1→p__.1↓
¬p__.0→p.0↑
¬p__.1→p.1↑.

Secondly, since we need separate resets for the output channels, we can re-use them for resetting the p's, so we have R6.0→p.0↓
R6.1→p.1↓.

Thirdly, the PRs for re-arming the pulse generators are now different for the different outputs (strictly speaking, this is not required for the SPLIT, but in the general case, slack-elasticity requires it; also, if a single output channel participates in several communication patterns, each one of the corresponding R6's must be able to reset it), so that the pulse generators now become (4)¬r0.0__∨¬r0.1__→r0$f$↓
¬r0.0__∨¬r0.1__→r0v↑
(4)R6.0→r0$f$↑
R6.0→r0v↓

(4)¬r1.0_v¬r1.1_→r1f↓

¬r1.0_v¬r1.1_→r1v↑

(4)R6.1→r1f↑

R6.1→r1v↓.

Lastly, the PRs for ρ, R4, and R6 are p.0∧r0v→ρ.0↓ p.1∧r1v→ρ.1↓

ρ.0→R4.0↓

ρ.1→R4.1↓

(2)R4.0→R6.0↑

(2)¬R4.0→R6.0↓

(2)R4.1→R6.1↑

(2)¬R4.1→R6.1↓.

Figure 24:
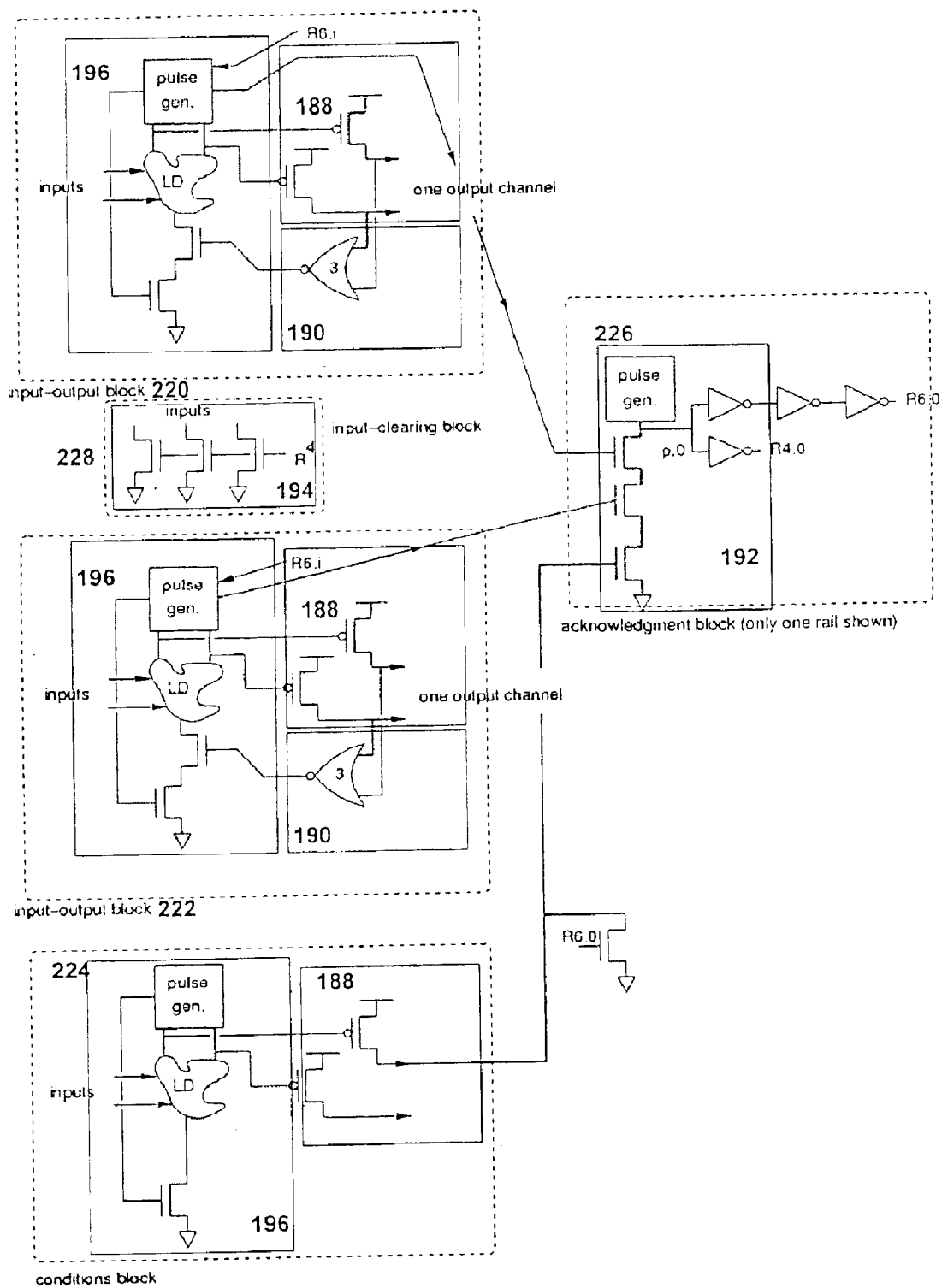
FIG. 24 is a diagram showing a schematic version of the conditional STAPL template according to an embodiment of the present invention.

All the input channels are completed by the outputs. In this compilation, all the logic blocks (including the conditions block) require the extra foot transistor; as always, the ρ block does not. Schematically, the arrangement is shown in FIG. 24. Shown in the figure is two example input-output blocks 220 and 222, each sending a single output channel. The major difference between this layout and the unconditional version is that acknowledgement block 226 is now controlled by conditions block 224. The resetting is now done conditionally. Although the figure shows two input-output blocks, it is understood that any number of input-output blocks can be used and the figure is showing an example implementation only.

Similar to the setup of the unconditional version, the essential parts of the input-output blocks are labeled—sending pulse generating component 196, converting component 188 and checking component 190.

Again we an input-clearing block 206 that is responsible for clearing all the inputs. The input-clearing block contains circuitry similar to that of converting component 194 found in the left-right buffer.

In the figure, acknowledgment block 226 is for implementing the necessary sequencing in the process. Only one rail is shown is acknowledgement block 226. Acknowledgment block 226 contains circuitry similar to that of resetting pulse generating component 192 found in the left-right buffer. Conditions block 224 contains circuitry similar to pulse generating component 196 and converting component 188 found in the left-right buffer.

Since we are handling the input conditionally, we have conditions block 224. We also have input-clearing block 228 to complete the circuit. The resetting is now done conditionally, so that R6 and R4 reset each of the input-output blocks (and/or clear the inputs) conditionally (e.g. if an output was sent). The inputs need not to be cleared and maybe used again. Conditions block 224 comprises of circuitry similar to pulse generating component 196 and converting component 188.

We may generalize the conditional communications of the SPLIT, thus implementing any process of the type

*[<,i::L$_i$?x$_i$>; <,j::[G$_j$(x)→R$_j$!f$_j$(x)[]¬G$_j$(x)→skip]>], where we for simplicity write x for <,i::x$_i$>.

4.3.3.3 MERGE Implementation

The MERGE is similar to the SPLIT except for its conditional inputs, to wit

MERGE≡*[C?c; [c=0→R!(L0?)[]c1→R!(L1?)]], which compiles (in the dual-rail case) to

*[[c.0∧¬(r.0vr.1)∧l0.0→r.0↑, 10.0↓, c.0↓

[]c.0∧¬(r.0vr.1)∧l0.1→r.1↑, 10.1↓, c.0↓

[]c.1∧¬(r.0vr.1)∧l1.0→r.0↑, 11.0↓, c.1↓

[]c.1∧¬(r.0vr.1)∧l1.1→r.1↑, 11.1↓, c.1↓

]].

We shall need separate reset signals for the channels l0 and l1; since we must in any case have these separate reset signals, we can take advantage of them and give c.0 and c.1 separate resets; however, introducing separate reset signals for each of the values of the channels l0 and l1 is needless and would lead to a more complex circuit. Hence the program we implement is better described as

*[[c.0∧¬(r.0vr.1)∧l0.0→r.0↑, 10.0↓, 10.1↓, c.0↓

[]c.0∧¬(r.0vr.1)∧l0.1→r.1↑, 10.0↓, 10.1↓, c.0↓

[]c.1∧¬(r.0vr.1)∧l1.0→r.0↑, 11.0↓, 11.1↓, c.1↓

[]c.1∧¬(r.0vr.1)∧l1.1→r.1↑, 11.0↓, 11.1↓, c.1↓

]].

We compile MERGE in much the same way as SPLIT. If we introduce P the same way as before, the condition table for MERGE becomes

| Condition | When true | Channels exercised |
|-----------|-----------|--------------------|
| p.0       | c.0       | C L0 R P           |
| p.1       | c.1       | C L1 R P           |

The condition computation is identical to SPLIT's, but we shall have to generate the two reset signals from two separate ρ signals; the PRS becomes pf∧c.0→p__.0↓ pf∧c.1→p__.1↓

¬p__.0→p.0↑

¬p__.1→p.1↑ p.0∧rv→ρ.0↓ p.1∧rv→ρ.1↓

¬ρ.0→R4.0↑

¬ρ.1→R4.1↑

(2)R4.0vR4.1→R6↑

R6→p.0↓

R6→p.1↓

(2)R6→R8↑

(2)R6→R8↓

(4)R8→ρ.0↑

(4)R8→ρ.1↑, where we see that introducing R8 becomes necessary (see Section 4.1.3) if we insist on avoiding the long pulldowns of a static implementation of ρf. The only drawback to our introducing R8 in this way is that part of the path to the ρ pullups becomes dynamic, but this is a drawback that we have long ago accepted for the first-stage logic blocks, so why not here too?

Conceptually, we should not find difficult generalizing the template of Section 4.2.1.3 so that it covers conditional receives; however, the CHP language does not have the necessary constructs for easily and unambiguously describing the semantics that we can implement.

4.4 Storing State

Any method of digital design that aims at components' being used repeatedly must allow state to be stored across circuit iterations. The present invention provides for such as a state-storing circuit component. To start, we look at simple circuit that requires storing state. It is given by the alternator, which is specified by the CHP program

ALT≡*[R!0; R!1].

During an execution of P, it may be that ALT has lately executed R!0 and will presently execute R!1; that this is so and not the other way around (i.e., that ALT has lately executed R!1, et seq.) need not be a fact inferable from any outside information. Therefore P must store state within itself.

4.4.1 The General State-storing Problem

We have expressed all our programming problems in terms of repetitive programs with two parts: receiving inputs, then producing results. In these general terms, a circuit's storing state becomes necessary when actions in a later iteration depend on events in an earlier iteration. In this state-storing template embodiment, we shall extend the template given in Section 4.2.1.3 to $$*[<,i::L_i?y_i>, <,k::x_k:=x'_k>;$$
$$<,j::R_j!f_j(y,x)>, <,k::x'_k:=g_k(y,x)>$$
$$],$$

whence it is already clear that the updating of a state variable is similar to receiving and sending values on a channel—unsurprisingly so, since sending and receiving together implement a distributed assignment. We may note in passing that complicating matters with conditional actions is unnecessary since ... ; $[G_0 \to x:=g_0 [] \neg G_0 \to \text{skip}]$; ...

is identical in effect to

... ; $[G_0 \to x:=g_0 [] \neg G_0 \to x:=x]$; ... ;

hence all state variable updates may, without loss of generality, be made unconditional.

One example application of the template embodiment is ALT. We need to rewrite ALT so that it contains only a single send action per iteration; we replace the sequencing implied by the semicolon with loop iterations and introduce a state variable for keeping track of the program's progress with respect to the semicolon. The similarity to software compilation into assembly language statements is clear: one could introduce a program counter to fold an arbitrarily complex sequential program into a single statement. We have ALT≡x:=0;
*[[x=0→R!0; x:=1
[]x=1→R!1; x:=0
]].

A final rewriting will merely introduce the special intermediate variable x'; hence we have the state-storing template embodiment as ALT≡
x':=0; *[x:=x'; R!x, [x=0→x':=1[]x=1→x':=0]].

4.4.2 Implementing State Variables

Observing that state-variable updates are similar to channel sends and receives, we can see that state variables could be implemented with feedback loops—channels that lead from a process P, possibly through buffering, back to P. P would send the updated state variable on, e.g., X' and receive the new value, some time later, on X. This approach works, is easy to implement, and can be reasonably efficient if there are not too many state variables in a system; it also has the advantage that we can in some situations easily add pipelining, since it is now straightforward to pipeline the state variable—the procedure we are alluding to is similar to loop unrolling and software pipelining, and it was extensively used in the MiniMIPS processor.

The high costs of implementing state variables with feedback loops are obvious in the MiniMIPS processor: they are due to the channel mechanism's being more powerful than is required for state variables; in other words, channels carry more information—specifically, synchronization information—than variables that may be read and assigned at any time; they hence work in many situations where (shared) variables are insufficiently powerful; but using channels where variables are sufficiently powerful is wasteful: taking the dynamic slack properties of Williams and Lines into account, we can deduce that implementing a single-bit state variable may require as many as four or five left-right buffers, which adds up to an exorbitant cost of several hundred transistors. In short, the approach may be acceptable for infrequent use in control circuitry, but we should avoid using it in datapath circuitry.

4.4.2.1 Issues with Direct Implementation

One embodiment of the present invention uses the better way of implementing state variables, which is to implement them directly. The main obstacle to this is that, till now, all nodes in our STAPL circuits have had the same switching behavior; namely, if we consider an iteration of such a circuit, each node either remains idle or switches with (ideally) a 50 percent duty cycle, which means that in the circuits studied so far, the node goes active for five transitions, then returns to its neutral value for another five transitions, and may go active again at that time; as we have explored the handshake phases may be longer, but not shorter, than five transitions in the presence of external synchronizations. Our using the terms "active" and "neutral" in place of true and false indicates that the argument applies to logic that can be either positive or negative.

The symmetric and long pulses that appear in normal asynchronous circuitry are due to the handshake protocols that are used for moving data around. These protocols come at a high cost, but this is often unobjectionable when the computation that is implemented is logically complex, as is often the case in normal control or datapath circuitry. In the case of state variables, however, the mass of extra circuitry that is needed for generating the desired symmetric pulses does in fact give rise to the feedback loops that we have already deprecated.

4.4.3 Compiling the State Bit

To find our way out of the timing conundrum, we must abandon the similarity between handshake variables and state variables. In one embodiment, we instead implement a STAPL circuit with characteristics similar to the state-variable compilation given by Lines for QDI circuits. Our new compilation uses the fact that the state variable is embedded inside a circuit that we already have timing information about; in this way, we can achieve a very simple state-variable implementation that allows of using a simple dual-rail, non-handshaking state-bit, but which at the same time can safely be accessed by its parent circuit according to the parent's handshake timing. We shall see that the timing signals that are necessary for a simple state-variable compilation are already available in the STAPL template.

4.4.3.1 Circuits

The simplest state variable (that does not need to be refreshed) is the SRAM cell, which consists of two cross-coupled inverters and read-write circuitry. Whereas a standard SRAM has pass-gates for reading out and writing the stored bit, we shall use different circuits, which will implement the conversion between handshaking protocols and the state variable.

Figure 25:
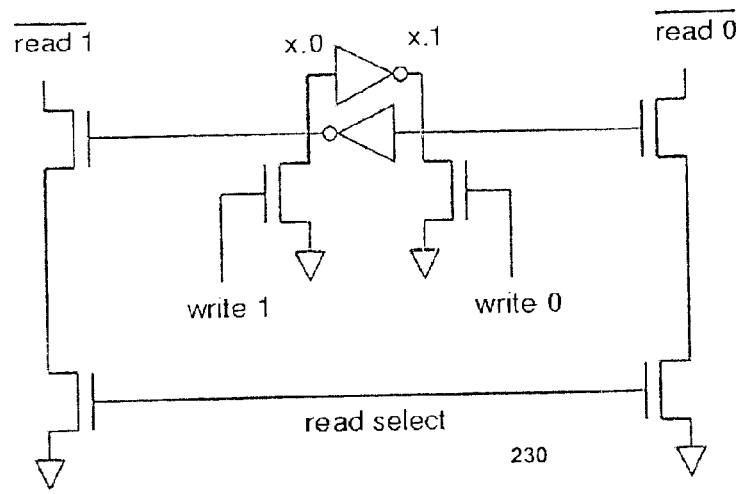
FIG. 25 is a diagram showing a state-holding circuit embodiment that holds a basic state bit according to the present invention.

State bit circuit 230 is shown conceptually in FIG. 25.

Recalling the timing of a STAPL process, we know that once we have generated the outputs (on transition 1 internally, transition 2 for the outputs), we shall have eight transitions for getting the circuit ready for the next set of inputs. We shall find it convenient to synchronize the arrival of the new state-bit value with the next set of data inputs; this allows us the maximum time for computing the new state bit without incurring a delay penalty on the next iteration.

Figure 26:
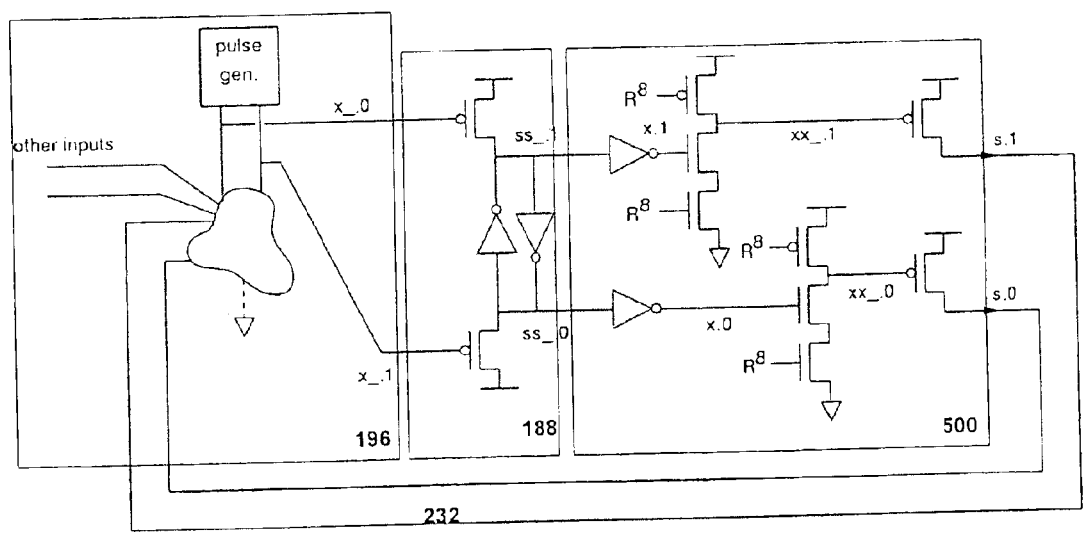
FIG. 26 is a diagram showing a state-variable circuit embodiment according to the present invention.

In one embodiment, the implementation of the STAPL state bit works as follows: on transition 1, the internal nodes begin their active-low pulse; we use p-transistors to write the state bit immediately on transition 2; this being done, the last reset pulse R8 copies the new state bit to the input side of the process. State-variable circuit 232 is shown in FIG. 26. We see the basic STAPL circuitry components used in other embodiments of the invention—pulse generating component 196 and converting component 188, which is slightly modified to set the state (the p-transistors). The updating component 500 contains 8 stages after the state bit is set (as shown with the R8 pulse).

The corresponding PRS is

¬x_.0→ss_.0↑ R8∧x.0→xx_.0↓
¬x_.0→ss_.1↑ R8∧x.1→xx_.1↓
ss_.0∧x_.1→ss_.1↓(†)
ss_.1∧x_.0→ss_.0↓(†) ¬xx_.0→s.0↑
   ¬xx_.1→s.1↑
ss_.0→x.0↓
ss_.1→x.1↓ ¬R8→xx_.0↑
¬ss_.0→x.0↑ ¬R8→xx_.1↑.
¬ss_.1→x.1↑

Here, we call the input to the circuit x_; this is the "output" of the parent. Conversely, the output of the circuit, also the "input" of the parent, is called s. The production rules marked (†) are implemented with interference (weak feedback).

4.4.3.2 Problems

What are the problems that introducing this circuit into the STAPL family can give rise to?

We first note that we may have a problem when an input is asserted and it attempts setting the state bit to a new value. When this happens, the n-transistor pulldown chain that is responsible for setting the new value turns on at the same time that the opposing p-transistor is turned on. Hence, we must make arrangements that ensure this situation's happy resolution; this is an instance of a ratioing assumption. The only way we can solve this problem (short of using a much more complex implementation) is by careful sizing and verification. This being a familiar problem, it should not concern us too deeply.

Secondly, the worries that we had regarding the unusual timing relationships of the state-variable nodes must be considered. When one side of the cross-coupled inverter pair is pulled down to GND, the other side is pulled up one transition later; it may be a slow transition, but in either case, there is no reason to believe that the timing relationship between this transition and the transitions otherwise seen in STAPL circuits should be predictable. If we compare the behavior of a dual-rail STAPL channel with the state bit, we see that the dual-rail channel ideally is defined five transitions out of ten; the state bit ideally nine or—when it does not change—ten out of ten. The main issue that we need to worry about is the new value's being generated too early and hence its triggering an illegal 1-1 state (because it may be read one cycle early, when the old value is still available).

This is a real problem. R8 is, as we know, active (high) for five transitions, going high at transition 8 and low at 13. If the state variable changes, however, the new value of x goes high at transition 4, viz. transition 14 of the previous cycle. Terror strikes! We have only a single transition of delay margin; should x go high a little early or R8 be a little slow to reset, then the circuit may enter the illegal 1-1 state, and all is lost.

Since solving the state variable's timing problem by delaying the variable's update would defeat the purpose (this solution would turn the state variable back into some sort of feedback loop with the same kind of timing as a channel), we must use something more unconventional. The problem we wish to avoid can be seen from the following partial trace:

| action  | time |
|---------|------|
| x.1↑    | 4    |
| R8↑     | 8    |
| xx_.1↓  | 9    |
| R8↓     | 13   |
| x.0↑    | 14   | whence we see that if the reset of R8 is delayed slightly, then xx_.0↓ may become enabled at time index 14. We introduce an interlock; this is a mechanism that keeps the circuit from getting into the 1-1 state. Since xx_.1 has fallen at time index 9, it is the obvious choice for the interlock; the PRS for the state variable becomes ¬x_.0→ss_.0↑
¬x_.1→ss_.1↑
ss_.0∧x_.1→ss_.1↓
ss_.1∧x_.0→ss_.0↓
ss_.0→x.0↓
ss_.1→x.1↓
¬ss_.0→x.0↑
¬ss_.1→x.1↑
R8∧x.0∧xx_.1→xx_.0↓
R8∧x.1∧xx_.0→xx_.1↓
¬xx_.0→s.0↑
¬xx_.1→s.1↑
¬R8→xx_.0↑
¬R8→xx_.1↑.

Figure 27:
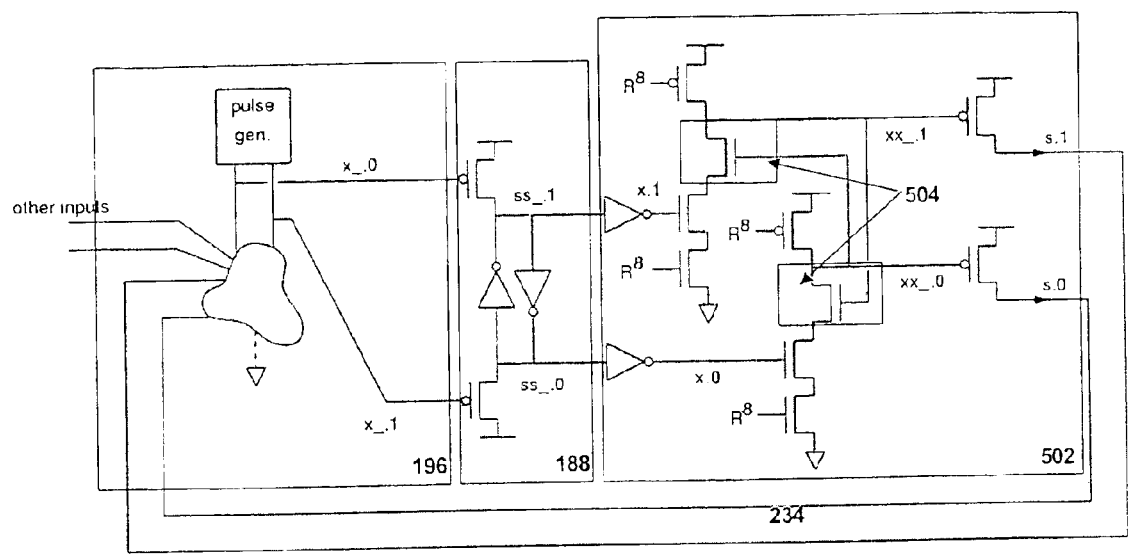
FIG. 27 is a diagram showing another state-variable circuit embodiment according to the present invention.

Sophisticated state-variable circuit 234 is shown in FIG. 27. Again, as with the previous version, we see the basic STAPL circuitry components used in other embodiments of the invention—pulse generating component 196 and converting component 188, which is slightly modified to set the state (the p-transistors). The updating component 502 contains 8 stages after the state bit is set (as shown with the R8 pulse). Except now within updating component 502 there is interlock 504 (the two n-transistors from xx_.1 and xx_.0), which increases the robustness of the circuit.

Compiled thus, the state variable is again resistant to minor timing variations; in fact, the interlock makes the production rules for xx_ more resistant to timing variations than the other parts of the STAPL circuit—the margin on xx_ is nine transitions, rather than the usual five.

4.5 Special Circuits

The circuit embodiments presented so far are for buffering data, computing functions, performing conditional communications and remembering state. These are enough for implementing deterministic computations that take place entirely within the STAPL model.

The present invention also has circuits embodiments that are nondeterministic devices (i.e., arbiters) and circuit embodiments that allow us to communicate with systems built in different design-styles, e.g., QDI systems. These embodiments are not necessarily intended to be generalized.

4.5.1 Arbitration

There are situations in VLSI design in which nondeterministic choice simplifies or allows a more "asynchronous" implementation. In the MiniMIPS for instance, nondeterminism was introduced in two places where it naïvely appeared unnecessary: in merging the cache operations in the off-chip memory-interface, and in the exception mechanism. In the former case, the nondeterminism simplified; in the latter, it allowed a more asynchronous implementation because it allowed the system's being designed without any prior knowledge of actual pipeline depths.

One embodiment of the present invention implements arbitration in one way only:

ARB≡
  *[[$\overline{A}$→A,R!0
  |$\overline{B}$→B,R!1
  ]].

This program is at least sufficient, although perhaps not always the most convenient, for implementing most interesting kinds of nondeterministic choice (but see also Section 4.5.2).

Figure 28:
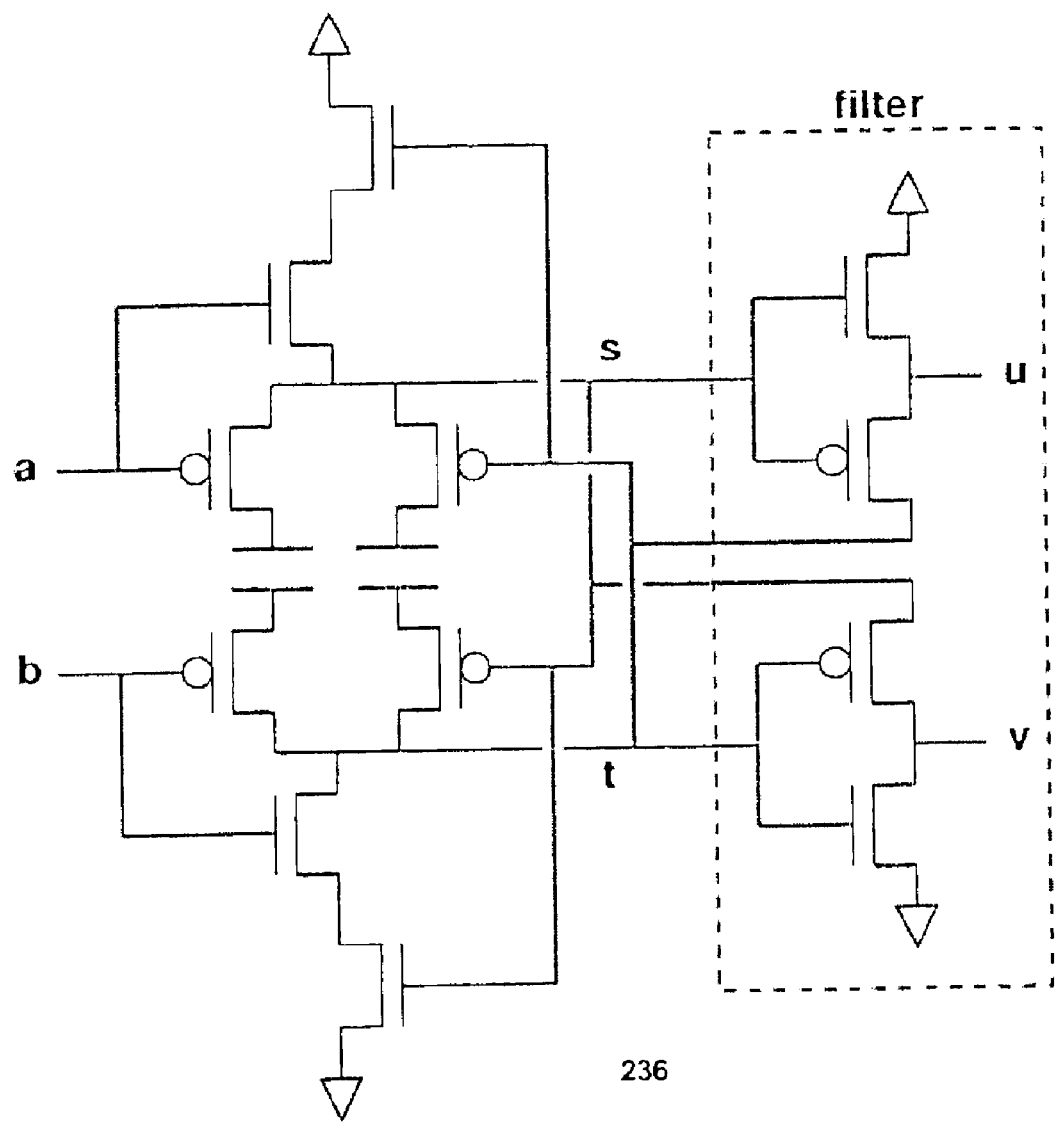
FIG. 28 shows a "Mead & Conway" CMOS arbiter.
Figure 29:
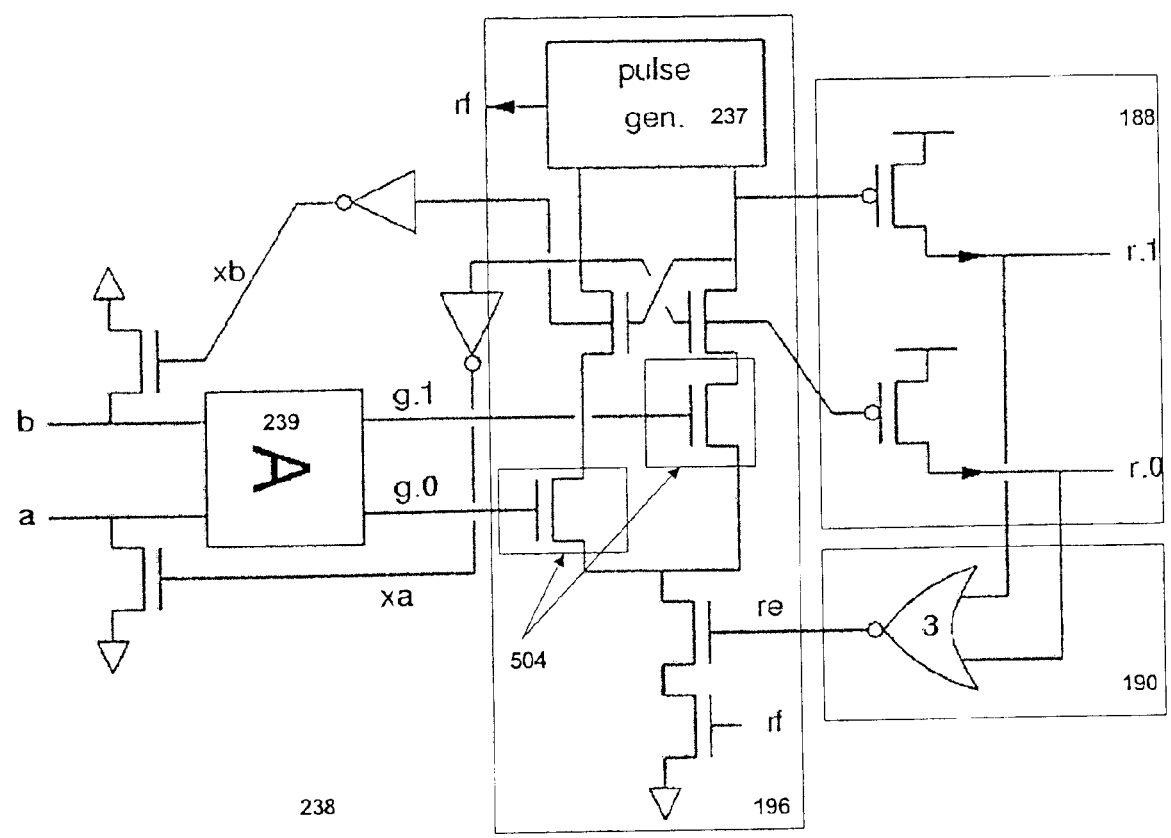
FIG. 29 shows a STAPL ARB process according to an embodiment of the present invention.

We shall use the standard QDI arbiter 236 shown in FIG. 28 as the central building block of the STAPL ARB embodiment. The only difficulty this causes is that the QDI arbiter takes more than one stage of logic; hence we cannot simply insert it into a normal STAPL circuit. Instead, we provide for the extra delay by omitting the second stage (the completion stage) from the circuit and instead using the grant lines to reset the request lines directly. The resulting ARB circuit 238 is shown in FIG. 29. In terms of PRS, the circuit consists of the usual arbiter-filter combination 239, the usual STAPL pulse generator 237, and the rules of:

re∧rf∧g.0∧r__.1→r__.0↓
re∧rf∧g.1∧r__.0→r__.1↓
r__.0→xa↓
¬r__.0→xa↑
r__.1→xb↓
¬r__.1→xb↑
xa→a↓
xb→b↓
¬r__.0→r__.0↑
¬r__.1→r__.1↑.

Again we have the usual STAPL components of pulse generating component 196 (slightly modified), converting component 188 and checking component 190. In checking component 190, the "3" NOR gate is a shorthand for the two inverters connected to the NOR gate.

Since the circuit used here is slightly different from what we have used in STAPL circuits so far, some care may be necessary to ensure that the circuit verifiably works.

Notice that the interlock 504 we introduced for the state variable has appeared again in ARB. The reason is that the S-R latch used for arbitration is indeed a state-holding element. It has timing characteristics similar to those of the cross-coupled inverters used in the state-variable compilation. Consider a scenario that both inputs to the arbiter are asserted in. The arbiter chooses one, setting in motion a train of events that ends in the chosen input's being deasserted. At this time, the output of the arbiter will quickly change from a 1-0 state to a 0-1 state, in exactly the same troublesome way that a state variable can change. This shows that if the interlock were not added, one output's rising a mere single transition later than designed could cause fatal confusion.

4.5.2 Four-phase Converters

In cases where STAPL circuits need to interface with other circuits, the present invention contains a useful four-phase converter. Our introduction of means for converting between the STAPL family and four-phase QDI circuits ensures that the existing QDI synchronizer implementations can be used; it also obviously allows our carrying over other convenient QDI circuits. For instance, the extra design freedoms of four-phase logic appear to allow designing circuits that are very efficient in terms of energy consumption or number of devices, by using creative and non-obvious reshufflings that efficiently encode complex control.

Figure 30:
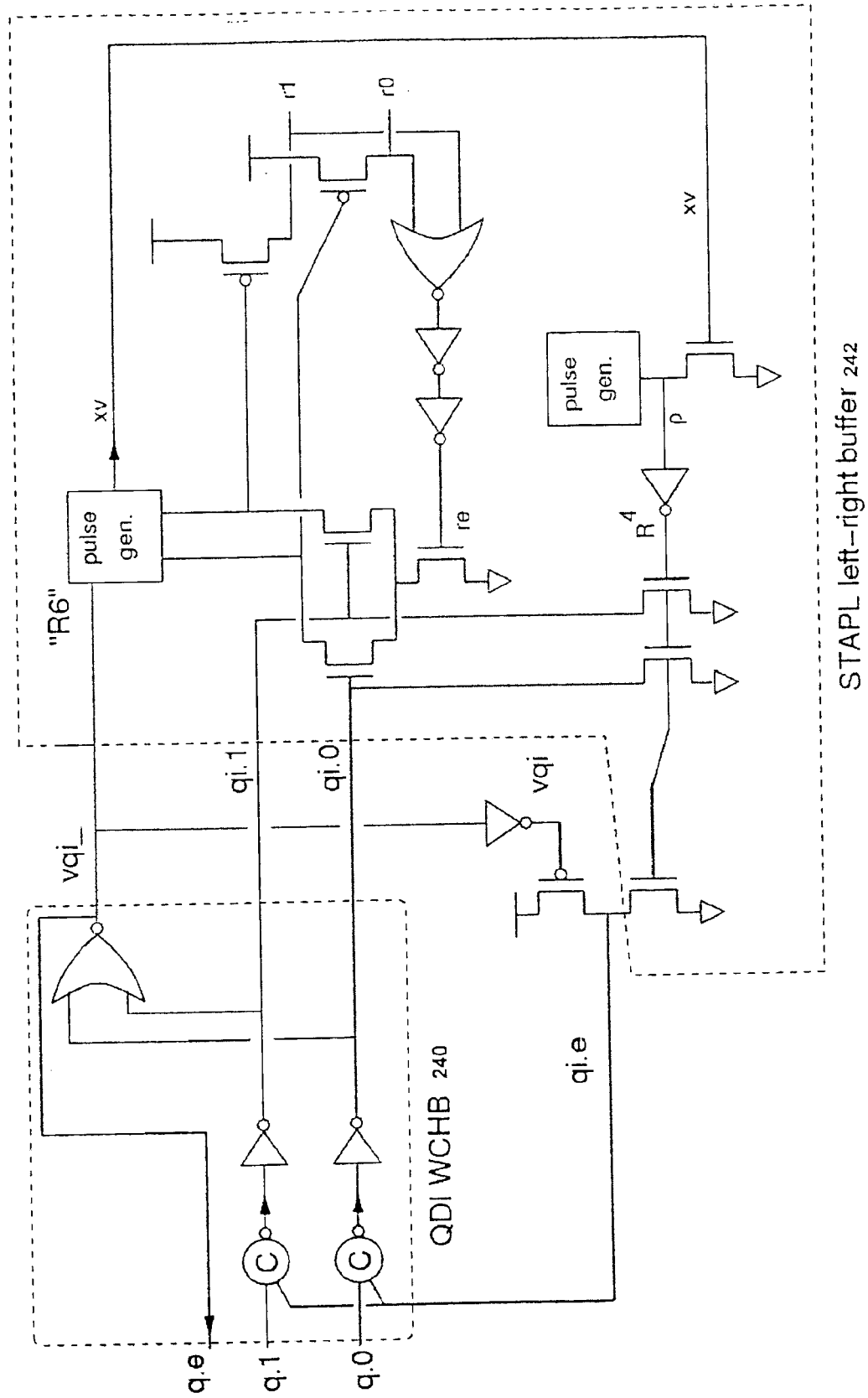
FIG. 30 shows an example QDI-to-STAPL interfacing cell built from a QDI and a STAPL buffer.

The only thing that needs to be done for implementating such a converter is to make the STAPL circuit respect the falling edge of the QDI handshake; i.e., it now has to wait for [¬li]. Because of the timing assumptions in the interface of STAPL circuits (σ and ξ), the QDI circuit that is to be interfaced with has to obey certain timing constraints. The easiest way of solving the problem is probably to make a standard cell with a QDI interface on one side and a STAPL interface on the other. Using the cells that we have already built, we can put together a QDI "weak-condition half buffer" (WCHB) and a STAPL half-buffer. We force the STAPL buffer to respect the QDI handshake by not re-arming the pulse generator until [li] has occurred; for this purpose, we generate R6 by completing the input channel rather than in the usual way. FIG. 30 shows the resulting circuit of this converter embodiment. Notice how little extra circuitry is required. In the figure QDI WCHB 240 is shown to interface with STAPL left-right buffer 242. WCHB is used in this embodiment. Any configuration of QDI buffer can be used in other embodiments as long as the QDI handshake is observed.

Figure 31:
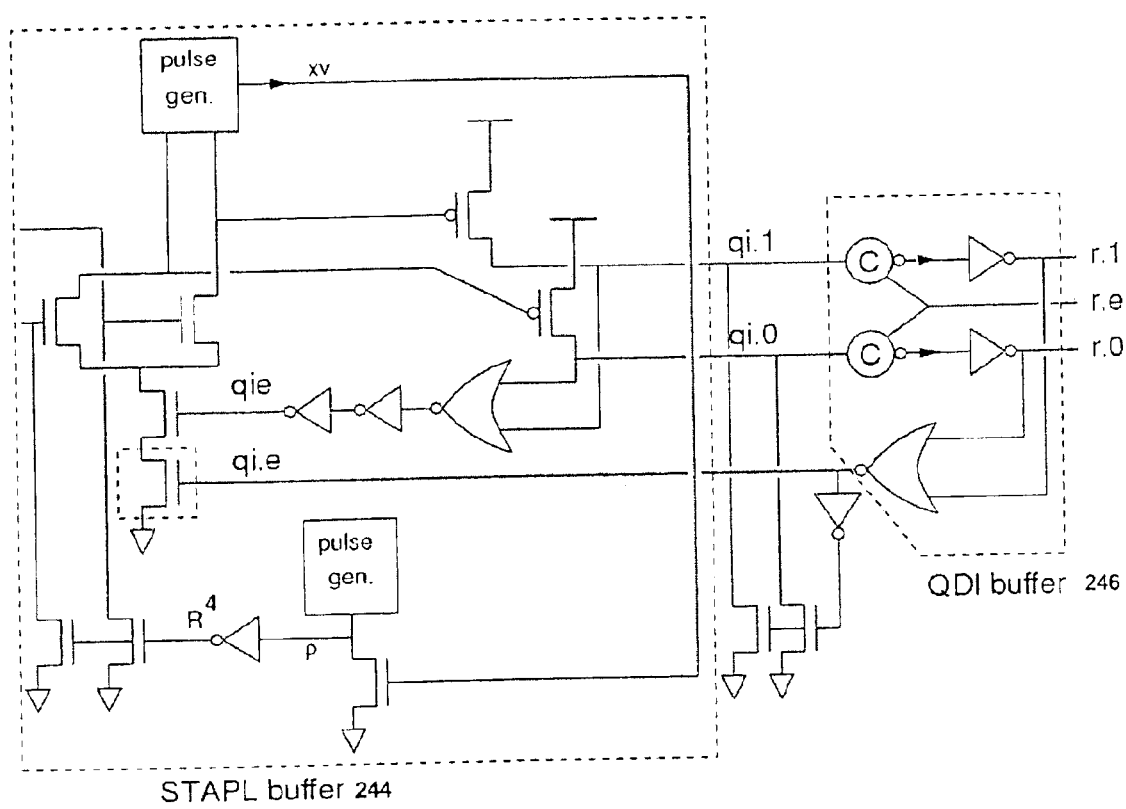
FIG. 31 shows an example STAPL-to-QDI interfacing cell built from a STAPL and a QDI buffer.

Converting from STAPL to QDI is about as easy. A circuit embodiment for doing it is shown in FIG. 31. In the figure STAPL buffer 244 is shown to interface with QDI buffer 246. Any configuration of QDI buffer can be used in other embodiments as long as the QDI handshake is observed. The main changes from standard QDI and STAPL buffers are that the QDI buffer needs to reset its inputs with a pulse, easily generated from its acknowledge; and the STAPL buffer waits for the QDI acknowledge as well.

Simpler circuits could probably be designed for converting between the STAPL and QDI protocols. The ones we have seen however have the advantage that, since the conversion is implemented with a pair of buffers and a few extra transistors, they easily generalize much the same as other STAPL and QDI circuits do.

4.6 Resetting STAPL Circuits

It should be understood that out of the $2^N$ states that a digital STAPL circuit of N nodes can be in, only a small minority are meaningful; for instance, any circuit that has more than one node out of a one-hot channel true is in an illegal nonsense-state. Until now, we have been concerned with describing the repetitive operation of STAPL circuits; we have described mechanisms whose incorporation into circuits will allow these circuits' repetitively computing useful things, all the while remaining in the legal parts of their state spaces; but how do we initially coax them thither?

Since an asynchronous circuit has no clock that governs its timing, it is in general difficult to predict when it shall respond to a presented input. What is more frightening is that an asynchronous circuit is by its nature self-invalidating; i.e., there is no legal stable state for an asynchronous circuit to be in, because if there were, then the circuit would never get out of that state. Hence it is clear that what we seek to do in resetting an asynchronous system is to put it in an unstable state, whence it may proceed to execute normally. On the other hand, there is no requirement that the reset state itself be a legal state that could be encountered later during execution, as long as we can show that from the reset state we shall eventually encounter only legal states.

4.6.1 Previously Used Resetting Schemes

The most commonly used resetting scheme in QDI circuits consists of introducing a single active-low reset node called Reset__ together with its active-high inverse Reset;

this has been used in most QDI projects undertaken at Caltech. The scheme works by resetting the circuit nodes to a known state, call it $\mathcal{R}$, when the reset nodes are asserted. Interference between production rules is allowed during the beginning of the reset period, as long as it resolves itself within a limited time; no interference is allowed afterwards. The time allotted to resetting is "long"; i.e., the timing of the reset pulse is handled through a comfortably safe timing assumption. When the reset nodes are finally deasserted, the circuit begins executing.

From the preceding, we understand that the actual initial state of the circuit from the point of view of the CHP specification is not the reset state that is the fixed point achieved by asserting the reset nodes, but rather it is the special state $\mathcal{R}|_{Reset \to false, Reset\_ \to true}$, achieved just after our deasserting the reset nodes. Designing the MiniMIPS, we realized that—while the timing assumption governing the length of the reset pulse is unavoidable—it would be inadvisable to trust that the two transitions Reset_↑ and Reset_↓ occur simultaneously; we avoided trusting this by using Reset only in downgoing production rules, i.e., by making the transition Reset↓ undetected by the circuit. To complete the reset protocol, we arranged things so that the Reset↓ transition always occurs before the Reset_↑ transition. Hence, the MiniMIPS reset procedure consists of the following succession of states (where __ denotes an arbitrary state, which need not be legal):

$$\_ \mapsto \mathcal{R} \mapsto \mathcal{R}|_{Reset \to false} \mapsto \mathcal{R}|_{Reset \to false, Reset\_ \to true} \quad (6)$$

Since Reset↓ is unchecked, no circuit activity can take place between the second and third states in the sequence, and we may again use a comfortably safe timing assumption. In practice, whereas we handled the reset-length timing-assumption by generating a pulse of the appropriate length off-chip, the second timing assumption is most easily handled by a few on-chip inverter delays.

4.6.1.1 Go Signal

There are obvious problems with the described resetting scheme. The first and most obvious is the timing assumption used for sequencing Reset↓ and Reset_↑. Secondly, the transition Reset_↑ causes other transitions to occur immediately; hence, making this transition too slow could conceivably lead to problems of the kind described in Section 2.4. The first of these problems can be eliminated and the second alleviated by introducing a third reset signal, which we call Go. In the resulting reset scheme, we cause the transitions to occur in the following order: first, reset in the state where Reset=true, Reset_=false, Go=false; secondly, Reset↓ and Reset_↑ occur in any order; lastly, Go↑ shall occur after a comfortably long delay. The reason that this scheme is better is that Reset_↑ no longer needs to do the double duty of on the one hand establishing $\mathcal{R}$ and on the other holding back the execution; in other words, most of the load that was on Reset_ can be kept on it and only a small part shifted to Go, which is the signal that must switch reasonably quickly. The progression of states is now:

$$\_ \mapsto \mathcal{R} \mapsto \mathcal{R}|_{Reset \to false} \mapsto \mathcal{R}|_{Reset \to false, Reset\_ \to true} \mathcal{R}' \mapsto \mathcal{R}'|_{Go \to true} \quad (7)$$

we have here labeled the two stable reset states, $\mathcal{R}$ and $\mathcal{R}'$, separately.

On the system-design level, a third problem occurs with the QDI reset scheme. Consider a "token ring," i.e., a chain of buffers connected in a ring. We should like to think of these buffers as being all of the same type, viz., BUF≡*[L?x; R!x].

Such a ring cannot be useful. It will do nothing, since all processes are attempting to receive but no one is sending—sadly reminding us of dining philosophers that starve.

We can simply solve the ring-resetting problem by introducing an asymmetry; we shall then have two types of buffer process, viz., BUF0≡*[L?x; R!x], and BUF1≡*[R!x; L?x].

The number of buffers of type 1 used determines the number of "initial tokens" in the system. While correct and conventional, the solution leaves us unsatisfied. More precisely: when we are dealing with a system that is described in slack-elastic terms, we are allowed to add slack after the CHP description has been completed, during its compilation to PRS and circuits; we might want to put the initial tokens in that extra slack when possible, but the form of description we have chosen does not allow that; furthermore, once the decision has been made at the CHP level to call one buffer BUF0 and another BUF1, should we not expect that the top-down compilation procedure will yield different implementations? But the same specification (and hence implementation) could be used for both if the initial tokens could be shifted into the extra slack.

We thus get the impression that the placing of initial tokens should properly occur in a separate phase of the design; it would then be possible that our ring of buffers should have processes only of the type BUF. At this point, the possibility of using a single implementation of BUF may seem like an insignificant advantage, but we shall see later (or may imagine now) that it would allow our using a vastly simpler template for describing the CHP processes, which need not make reference to the initial state: we should realize that the simplification, small for BUF, will be much more significant for complicated processes, since a process with N channels may at reset have a token (or not) on each of them.

Let us not deal further in hypotheticals: there is a catch. Normally, QDI processes have combinational logic at their outputs. Hence, any scheme that should attempt resetting QDI processes in two phases as suggested must have knowledge about their internals (it must reset the inputs of the combinational logic, not the outputs).

Here the STAPL circuits have a definite advantage: they have a single transistor on their outputs, so it is possible to create the initial tokens directly on the channels between processes. The reset protocol that we use is the same as the modified QDI protocol: Reset=true, Reset_=false, Go=false. Now we can choose to identify the two reset states $\mathcal{R}$ and $\mathcal{R}'$ thus: $\mathcal{R}$ will be the starving philosophers' state, i.e., when all processes are ready to receive and none is sending; $\mathcal{R}'$ will be the state when all tokens that shall be created on reset have been created. The happy conclusion is that we can design all processes so that they themselves attain $\mathcal{R}$ (when Reset∧¬Reset_ holds); we shall separately add circuitry for getting from $\mathcal{R}$ to $\mathcal{R}'$ (when ¬Reset∧¬Go holds).

4.6.2 An Example

Let us now turn to a simple example. How should we reset the STAPL left-right buffer? From above, we know that we need only concern ourselves with the empty-pipeline case. The goal will be resetting the circuit with as few transistors as possible.

The most obvious places for inserting reset circuitry are the pulse generator and sequencing circuits that must always be present in the same way. Considering the HSE for the (dual-rail) left-right buffer,

*[(†)[l0→r0↑[]l1→r1↑]; l0↓, l1↓, [¬r0∧¬r1]], we should like to reset into the state marked (†). Given a set of processes to reset, we choose the following division of labor: each process shall be responsible for resetting its own internal nodes and its own inputs. Hence, we shall have the various R4 nodes resetting in the true state (which incidentally violates the otherwise sound property of their being mutually exclusively true): this will clear the inputs. As for the internal nodes, we make the pulse generators reset into the state where the precharge signal is active.

4.6.3 Generating Initial Tokens

So far we know how to reset a system so that all processes begin by receiving. We earlier mentioned that we should like to create the initial tokens during the period when ¬Reset∧¬Go holds. Doing this is straightforward: tokens between processes are signified by true nodes; hence, all we shall need to do is pull the nodes that we wish to reset up with two p-transistors implementing ¬Reset∧¬Go. Of course, we must check that Go switches fast enough that the isochronic fork is unimportant. If we feel that we cannot arrange this, then we might have to add yet another reset node, e.g., ReallyGo, since strictly speaking, using Go for generating initial tokens violates a property implied by Section 4.6.1.1, namely, the property that Go should be used only for holding tokens back from execution, not for resetting things.

4.7 How our Circuits Relate to the Design Philosophy

In Section 3.1.5, we outlined a few guidelines that our circuits should obey. We have since developed the bit generator, bit bucket, left-right buffer, multiple-input and multiple-output circuits, circuits that compute arbitrary functions, circuits that do not use certain inputs, as well as a number of specialized circuits.

For each one of the designs, it may have seemed that a new mechanism was invented out of thin air. Of course, if we take a different view of things—if we consider the simpler circuits as special cases—then these mechanisms may not seem so ad hoc.

Let us therefore examine FIG. 24. How much of the design presented there is an inevitable consequence of our design philosophy, and how much of it simply the result of arbitrary design decisions?

First, while it is not exactly part of the design philosophy, the choice of two transitions' delay for the forward path is a natural one: this choice minimizes the delay, given that we want to maintain the same signal senses at the outputs as at the inputs. Using a single p-transistor per output rail is clearly the simplest way of implementing the output part of the handshake, as is using a single n-transistor per input rail for implementing the resetting of the inputs.

Secondly, we stated that we were going to implement the a delays everywhere with pulse generators: this gives us the pullups for the internal nodes. But why can we sometimes get away with combinational pulse-generators and why do we sometimes need to use ones that are one-shot, i.e., explicitly re-armed? Similarly, why do we sometimes need the foot transistor and why do we sometimes not need it? The answer to these questions is the same: in general, the one-shot pulse generators and foot transistors are required. It is only in the very special case of a single output that they are overkill, because with only a single output we can make an additional timing assumption; namely, we can assume that once we have produced the output, all the necessary inputs have arrived; this is true even if some inputs are being ignored since we are counting dummy outputs used for completion as separate outputs. We should note that the timing assumptions are slightly more difficult to meet when we omit the foot transistor: if the foot transistor is used, we know that the pulse generator cannot re-arm until the second stage has reset it; if it is not used, then a slow falling transition on the output can cause the pulse generator to fire twice.

Thirdly, why do we use a second stage for computing what to acknowledge, and why does the second stage have the form we have seen? Here we have mainly tried to keep things simple: the same implementation is used for the second stage as for the first. Note that the reason that we can omit the foot transistor in the second stage is that we can consider the second stage as having a single output; namely, the internal channel R4, which always produces a result. As we have seen in Section 4.3.2, there are other ways of implementing the functionality provided by this second stage.

Lastly, what of the special circuits: the arbiter, state bit, and four-phase converters? These circuits are harder to understand directly within the stated design philosophy. The reason this is so is not hard to see: the state bit is essentially a transistor-saving trick that eliminates much of a feedback loop that could as well have been implemented with buffers, and the arbiter has the same timing characteristics. In the case of the four-phase converters, we are dealing with circuits that in any case do not obey our design philosophy, so it is not surprising that these circuits should look a little odd.

4.8 Noise

When we speak of "noise," the implicit assumption is often that noise is due to some external mechanism, or at least to some mechanism that we are not modeling properly, e.g., shot noise, thermal noise, noise from outside electronic systems. But in more performance-oriented design-styles, the digital model is often just an approximation; the difference between the pure digital model and the physical behavior of the system we can also loosely call "noise." Hence, we shall use the term "noise" to denote any deviation from ideal conditions.

4.8.1 External Noise-sources

The present invention contains mechanisms for dealing with noises. External noise-sources are the easiest to deal with. In Section 1, it was mentioned that the usage of a metric suitable for making sense of the multi-dimensional noise that we. The noise has as many dimensions as the test pulses in $\mathcal{P}$ have parameters, to use the terminology of Section 1. But apart from this mathematical annoyance, noise margins in STAPL circuits are really of the same form as in synchronous circuits, and may be treated similarly.

Are the noise margins wide enough in the circuits that we have studied? This is a quantitative question, and there are several ways of answering it. First, we can flip back to Section 1.5, where we should see that the input pulse lengths can vary between 1.0 and 12 normal transition delays, and the circuit will still work as intended; this will probably satisfy most cases. Secondly, we note that we can build STAPL circuits with any desired noise margins by manipulating the delay in the feedback loops and the thresholds of the input logic; as long as the noise is smaller than the signals we are looking for, we can build a STAPL circuit that works. Lastly, we can rephrase the question thus: do STAPL circuits give higher performance for the same degree of noise immunity than implementation technology X? This question is harder to answer; it does seem that the STAPL circuits can be made almost as noise-immune as QDI circuits at much higher performance levels, and compared with the highest-performance synchronous logic-styles, STAPL circuits achieve the same or better performance.

4.8.2 Charge Sharing

The STAPL circuit family makes great use of dynamic (or at least pseudo-static) logic. Charge sharing (between internal parasitic capacitances in a domino block and the output node) is the bane of dynamic logic styles. The situation could be particularly bad in STAPL circuits because we cascade dynamic-logic stages.

Figure 32:
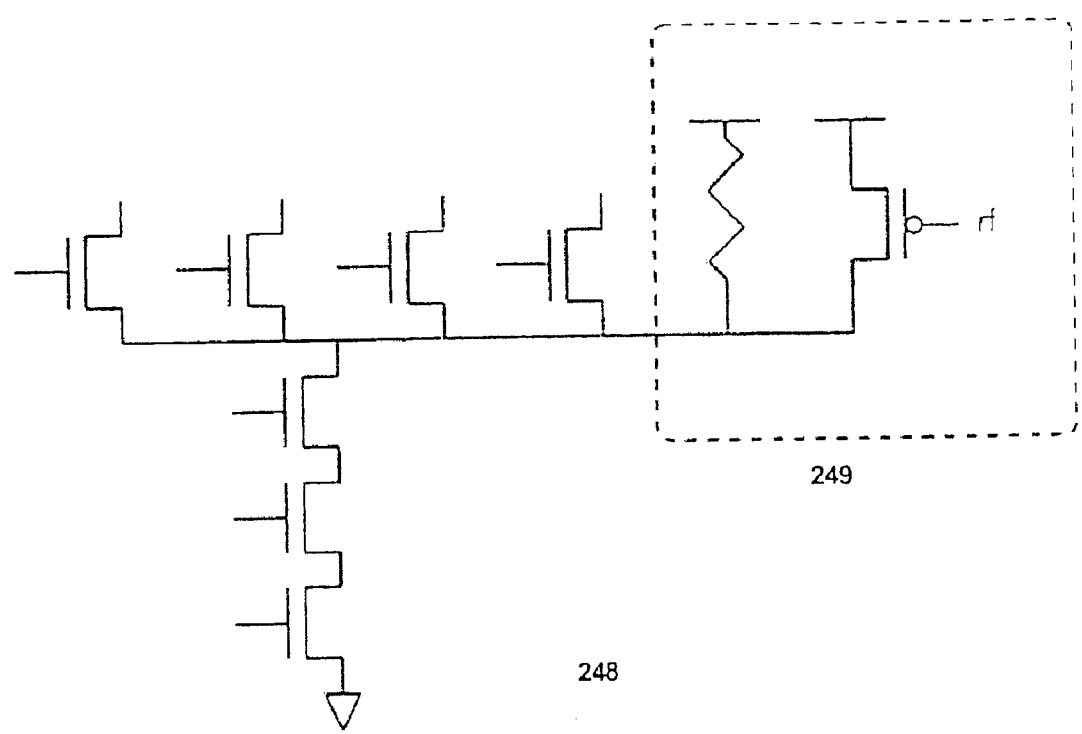
FIG. 32 shows an example circuit alleviating charge-sharing problem.

The good news is, first, that the STAPL circuit family never makes use of p-transistors in series driving dynamic nodes (the only p-transistors in series are in the circuitry that generates the re signals), and secondly, that the timing behavior of STAPL circuits is much simpler than it is for QDI circuits. For these reasons, we should not generalize all the bad experiences from high-speed QDI design and think that things are only going to be worse in STAPL. The simpler timing behavior, especially, allows using much simpler circuitry for avoiding problems with charge sharing. Since the domino block never has its outputs "floating low" except potentially for a very short period of time (because they are pulsed), we need not worry about sneak paths from Vdd to the output rails, as long as the transistors along these paths are weak. Concretely speaking, we can systematically use the circuit in the dashed box of FIG. 32 for reducing charge-sharing problems. (This circuit will not work in QDI circuits, because sneak paths from the resistor to the output could pull up the outputs out of sequence when they are left floating.) The costs of using such charge-sharing avoiders are that the circuits are a little slower and that static power dissipation is possible if some of the inputs arrive but not the others (so one has to be a bit careful when introducing these circuits if low power should be an important design objective).

4.8.3 Crosstalk

Aside from charge sharing (more properly "static" charge sharing), something that causes reliability problems in modern VLSI circuits is crosstalk (also variously called coupling noise or "dynamic" charge sharing). While arguments suggesting that crosstalk noise gets worse because of Vdd scaling should be eyed with suspicion, it is on the other hand true that the aspect ratio of minimum-size wiring on modern chips has made crosstalk worse: using wires that are tall and narrow means that most of a wire's capacitance is to its horizontal neighbors, not to the substrate.

The STAPL circuit family offers no special remedies for crosstalk noise; the dynamic nature of STAPL circuits indeed suggests that they are susceptible to it. At the same time, we should not exaggerate the problem: 1-of-4 encodings for instance allow signals to be routed so that a wire is never routed adjacent to two "aggressors" (i.e., circuit nodes that couple strongly to the wire in question). Furthermore, as we have stated elsewhere, a well-designed asynchronous circuit will have most of its capacitance in the transistor gates (see footnote on p. 145). Finally, we can use our circuits' being asynchronous by inserting extra buffering: this is easier than in synchronous systems, since our timing constraints are less rigid.

In practice, the avoiding of destructive crosstalk noise will have to be done with design tools: we shall have to map the noise margins that we have defined for STAPL circuits to specific circuit-design guidelines.

4.8.4 Design Inaccuracies

The most serious issue with STAPL circuits—the most serious way that the real world deviates from ideal conditions—is probably design errors or design uncertainties. The reader has probably guessed, for instance, that mis-sizing transistors in a STAPL circuit can cause the circuit to fail. Many designers will be reluctant to give up their "ratioless" CMOS logic. It would also be unsatisfactory if every instance of every circuit in a large STAPL system had to be sized specially just to keep things working.

We can phrase it thus: assume that we have a STAPL circuit designed to work well in a particular environment, and now it turns out that, e.g., the capacitance on its outputs is much higher than anticipated—this can happen because our extractor is inaccurate or because we are lazily trying to reuse a piece of layout that was designed for something else—what happens?

Figure 33:
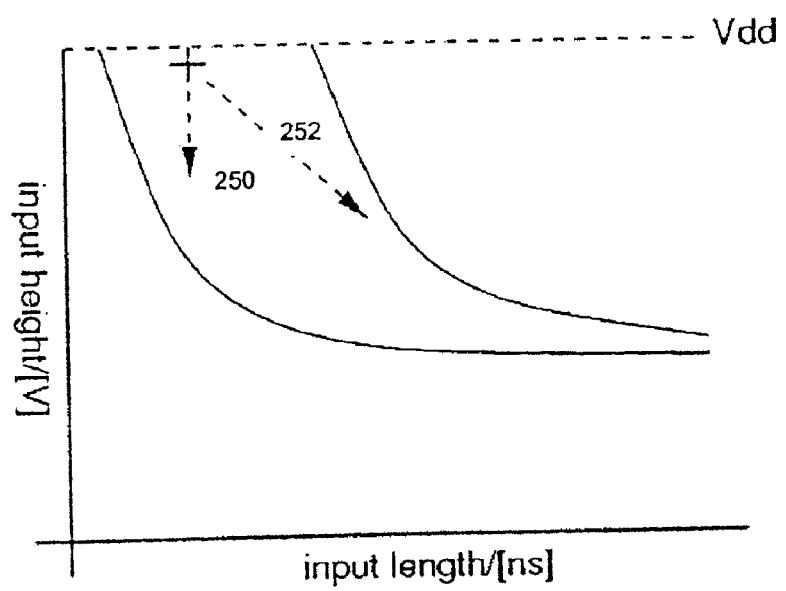
FIG. 33 shows the "load lines" of pulsed circuit.

If we overload one of the STAPL circuits presented in this chapter, then its internal pulse may not be quite enough for setting the output signal to Vdd; equivalently, we may consider the situation when the output p-transistor is sized very large and the internal pulse is too feeble to set the output to Vdd. We can think of this as moving the normal operating point of the circuit to one where the output pulse has a smaller height; in terms of the pipe diagrams, the operating point is moving more or less along the arrow marked "1" in FIG. 33. We can see that we shall have to overload the circuit considerably before it fails (until the pulse height is about one half of normal—this is more than double capacitance because the pulses have flat tops/bottoms; they are not normally triangle waves).

The ideal situation would be if the circuit could move along the arrow marked "2"; if it did that, then we should have the largest possible noise margin. The STAPL circuits naturally move their operating points somewhat to the right in the figure when they are overloaded by a too-large output transistor because the pulsed node drives that transistor directly; the transistor's being larger than expected causes the internal pulse to be wider than designed because it delays the rise and also the fall of the pulsed node. It is possible to add further feedback from the output node (i.e., we could add a transistor that senses that the output is being pulled up too slowly and then adds extra drive). By using these kinds of mechanisms, we could aim the load line down the pipe and thus achieve very good noise margins.

5 SPAM

This section describes a 32-bit microprocessor embodiment in the present invention. The SPAM (Simple Pulsed Asynchronous Microprocessor) architecture is defined in detail in Appendix A. 5.2.3.4 The SPAM architecture defines a simple 32-bit RISC instruction set. It defines eight registers and a number of integer operations, and it is generally intended to be easy to implement without making any real sacrifices of functionality. The instruction set is completely orthogonal; i.e., all instructions have the same addressing modes, always specified by the same bit fields in the instruction word.

5.1 SPAM Implementation

The sequential SPAM is specified by the remarkably simple program listed below. This program is a restatement of the English description in Appendix A of how the processor executes instructions.

```
SEQSPAM ≡
*[ i := imem[pc];
   opx := gpr[i.rx], opy := YMODE(i.ymode)(gpr[i.ry],i.imm);
   opz := OP(i.opcode)(opx,opy), pc := PCOP(i.opcode)(pc,opx,opy);
   gpr[i.rz] := opz
]
```

5.1.1 Decomposition

Figure 34:
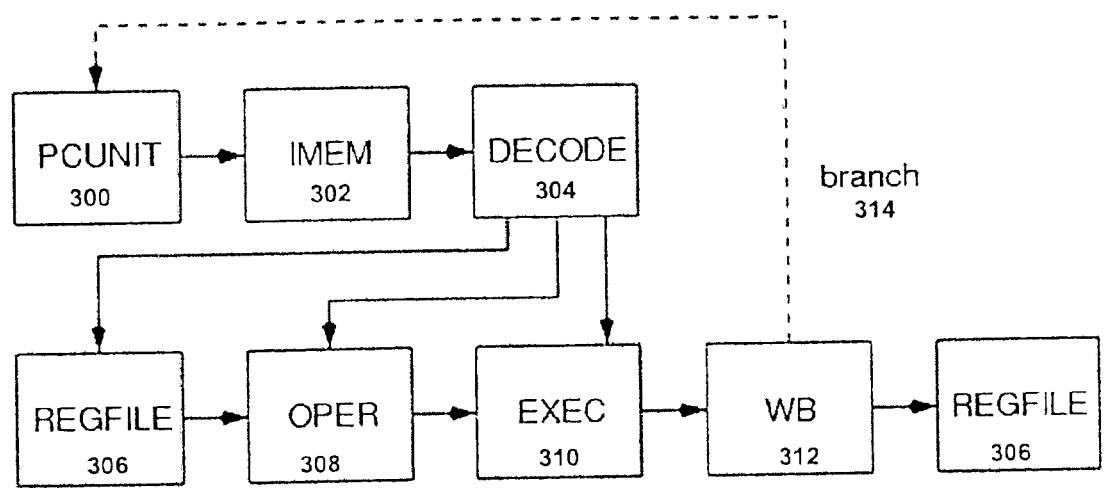
FIG. 34 is block diagram giving an overview of SPAM decomposition according to an embodiment of the present invention.

Shown in FIG. 34 is the decomposition of the SPAM processor processes according to one embodiment of the present invention. The decomposition is similar to but not identical to the one chosen for the MiniMIPS.

Seven units are identified in the figure:

PCUNIT 300, responsible for generating the program-counter values representing the addresses in the instruction memory of the instructions that are to be executed. PCUNIT corresponds to the operation pc:=PCOP (i.opcode)(pc, opx, opy) of SEQSPAM.

IMEM 302, the instruction memory. In the simple test-processor we are speaking of here, there is no off-chip memory; i.e., IMEM is a memory, not a cache. IMEM corresponds to i:=imem[pc].

DECODE 304, the instruction-decode unit. This unit generates the control signals for the units that are to execute the fetched instruction. DECODE corresponds to computing i.ymode, i.rx, i.ry, i.imm, i.opcode, and i.rz.

REGFILE 306, the register file. It contains eight registers. It appears twice in the figure, which signifies that it conceptually acts twice for each instruction that is executed: once to fetch the operands and once to write back the result. REGFILE corresponds to computing gpr[i.ry], opx:=gpr[i.rx] and performing gpr[i.rz]:=opz.

OPER 308, the operands-generation unit. This unit is responsible for computing opy in the program listing above; hence it contains a conditional shift-add combination. OPER corresponds to YMODE(i.ymode)(gpr[i.ry], i.imm).

EXEC 310, the instruction-execution unit. This unit internally consists of several sub-units: an arithmetic-logic unit (ALU), a shifter, and a data-memory unit. EXEC corresponds to OP(i.opcode)(opx, opy). In this decomposition, it also contains the part of PCOP (i.opcode)(pc, opx, opy) that uses the registers, i.e., the branch comparator.

WB 312, the writeback unit. This unit is responsible for canceling instructions whose results should not be written back (see Section 5.1.2); it also notifies the PCUNIT of taken branches. WB is not present in SEQSPAM, because it is used only for providing sequencing in the decomposed, concurrent version.

5.1.2 Arbitrated Branch-delay

Most programs that are run on general-purpose processors have unpredictable control-flow; they are not simple, straightline programs. The straightline program-flow is interrupted by branches or exceptions; it is well-known that programs for these processors execute on average only five to ten instructions for every branch that they execute. If we treat exceptions similarly to how we treat branches, the rate increases further: on some architectures nearly every instruction may raise an exception.

Especially if we treat exceptions and branches together, it is clear that processor performance can be improved by adding some sort of branch prediction mechanism. Such a mechanism has two fundamentally distinct parts: predicting whether a given instruction will branch, raise an exception, or do neither; and dealing with mispredictions. While the details of how we might predict whether a branch will be taken or an exception will be raised are outside the scope of the present invention, the mechanism for dealing with mispredictions is not.

A mechanism for arbitrated precise-exception-handling, used in the MiniMIPS processor, has been presented by Manohar, Martin and Nyström. Another similar one has been presented by Furber. The SPAM processor uses such an arbitrated mechanism for normal branches; since it does not have exceptions, there is no need for a precise-exception mechanism; but having handled branches in this way, adding exceptions should be easy.

The basic of SPAM is this as follows. The PCUNIT generates the sequence of program-counter values that we a priori believe to be the most likely. The corresponding instructions are fetched from instruction memory and executed. Results are written back to the register file and data memory in program order; if the control flow takes an unanticipated turn, the instructions that were fetched but should not be executed are yet executed, but the results of these executions are discarded. Finally, the PCUNIT is informed that the control flow has changed; it then begins fetching the instructions corresponding to the updated control flow.

As is easily understood from the preceding description, the arbitrated mechanism is flexible and could accommodate a wide variety of predicted control-flows. In practice, we have as yet only used it predicting a straightline control-flow. We should point out that the MiniMIPS processor has a second mechanism, different from the one described here, for performing branch prediction; this branch predictor uses the slightly more sophisticated backward-taken—forward-not-taken ("BTFN") predictor. In other words, the processor fetches instructions sequentially, assuming (in the MiniMIPS) no exceptions or (in the SPAM) no branches; if the assumption turns out to have been wrong, the unwanted instructions are discarded and fetching begins from the exception-handler address (in the MiniMIPS) or from the branch-target address (in the SPAM).

The arbitrated mechanism allows informing the PCUNIT of control-flow changes only when they occur; it becomes unnecessary to inform it, for each instruction that does not change the control flow, that they do not occur. This means that the fetching of instructions is effectively decoupled from the executing of them.

In the SPAM processor, the canceling of unwanted instructions and the informing of the PCUNIT of control-flow changes are handled by the writeback unit, WB. When a branch is executed and an impending control-flow change becomes apparent (in the EXEC), this information passes via the WB on a channel to the PCUNIT. As we noted, the communications on this channel are conditional. In FIG. 34, this is illustrated by the channel's being drawn dashed.

5.1.3 Byte Skewing

Classic QDI design-styles treat QDI-system design in a control-centric way: first, the control structures that are necessary for implementing bare, dataless handshakes are designed, and then the bare channels are widened to carry data; logic for computing can be inserted in appropriate places.

While this method of designing the circuits elegantly takes us from a collection of small processes that implement only the handshakes to processes that communicate (and compute) with data, the large drawback is that the slack of the system is fixed at the time that the control is designed, unless special measures are taken. For instance, handshakes between units (which for control circuitry consist only of bare wires but are much more complicated in the finished system) can limit the performance of a system.

One of the main innovations of the MiniMIPS processor project was the slack-elastic design-style. The slack-elastic style allows the introducing of slack gradually during the decomposition instead of all at once at the beginning; among other things, this allows our breaking the handshake cycles into smaller pieces, thus achieving higher system throughput.

In the MiniMIPS, we distributed the control to the datapath via a logarithrmic tree. In other words, if control information is required at the level of bit processes (or more commonly, at the level of 1-of-4 processes), this information is copied out in a pipelined tree. Normally, a four-way copy would copy the control information to each of the bytes, and the bytes would be designed as single, large processes, with the bit or 1-of-4 "processes" actually being fragments and not complete processes (i.e., the smallest part of the design that communicates with its environment entirely on channels is the byte-sized process).

The MiniMIPS logarithmic tree is not the only way of distributing the control. If throughput is the only concern and the latency of computation is a secondary issue (e.g., in DSP applications), each bit of the datapath can be made to copy the received control at the same time as it performs its data computation. This approach, called bit skewing, was used in the asynchronous filter designed by Lines and Cummings.

Figure 35:
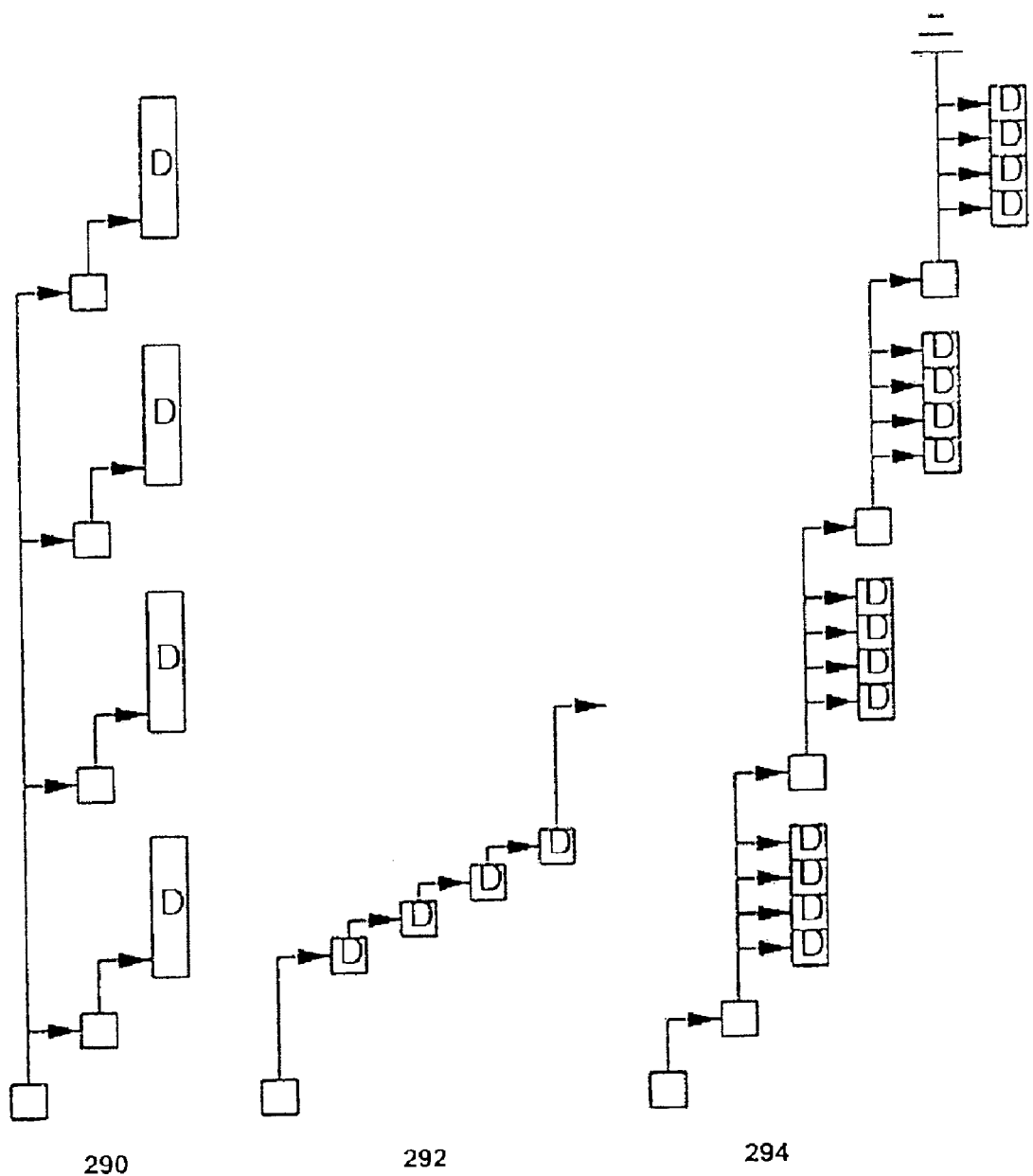
FIG. 35 shows three ways of distributing control, depicted on a hypothetical datapath operating on 32 bits encoded as 16 1-of-4 values.

FIG. 35 shows three ways of distributing the control. Importantly, in a slack-elastic system, which way we finally choose is not visible in the high-level description. Datapath processes are marked "D" in the figure; the remaining processes are simple copies, although the initial copy can sometimes be combined with the preceding process. Method 290 is the method used in the MiniMIPS, a two-stage copy to four byte-wide processes. Method 292 is the asynchronous-filter method, where a linear tree (list) of control copies to 16 processes operating on 1-of-4 data (bit skewing). Method 294 is the method used in SPAM—a linear tree of control copies to four four-way copies and thence to 16 processes operating on 1-of-4 data. This method combines aspects of both the logarithmic-tree method and the bit-skewing method. We call this byte skewing. We should note that the datapath operation's being implemented in eight-bit chunks in method 290 and in two-bit chunks in method 294 is an issue separate from that of byte skewing. The chief reason we choose to implement the operations in two-bit chunks in the SPAM processor is because many of the algorithms used for compiling PL1 programs (mainly the BDD code) require resources that are roughly exponential in the size of the process being compiled. The PL1 language is described in co-pending U.S. patent application titled "Pipeline Language 1", filed Oct. 11, 2002 (Ser. No. 10/xxx,xxx) and is hereby fully incorporated by reference. Hence, it is much easier to compile these smaller pieces automatically than it would be to compile the eight-bit MiniMIPS chunks. We should also note that the second stage of the control distribution tree in method 290 in many ways behaves electrically like a four-way copy, even though it may not do so logically. Finally, implementing the operations in this finer-grained way adds extra pipelining to the processor, the desire for which should be clear from our going from 18⅔ transitions per cycle in the MiniMIPS to 10–12 in the SPAM.

The reason we should avoid method 292 in a general-purpose processor design should be obvious: the latency penalty is simply not acceptable. But what is wrong with method 290, the MiniMIPS method? Compared with it, byte skewing as in method 294 has the following advantages:

The method is easily scalable; going from 32 bits to 64 bits is simply a matter of arraying more cells. This is why we have "grounded" the top of the figure: by using a bit bucket here, we pay a small penalty of unnecessary data-replication but gain the benefit of being able to array identical datapath-cells. Scaling the datapath for method 290 involves adding an additional level to the tree as well as new wires that cross the datapath (new wiring slots must be found for these).

The wires are shorter—no wires cross the entire width of the datapath.

There are fewer wires; instead of o(log n) sets of wires, each enough for crossing the entire width of the datapath, there is only one such set. In the limit of wide datapaths, method 294 will hence use less energy than method 290.

Byte skewing allows for simpler implementations of many arithmetic operations, e.g., addition.

The layout is far simpler.

The importance of the shorter wires and the simpler layout should not be underestimated.

Naysayers would retort that byte skewing adds to the latency of computing, which in itself is enough for them to say no; this is true, but only to an extent. FIG. 35 shows three ways of distributing control, depicted on a hypothetical datapath operating on 32 bits encoded as 16 1-of-4 values. Comparing scenarios method 290 and method 294 in FIG. 35, the latency difference for control to arrive at the top bit of the datapath is really only two stages (we should not count the extra pipelining that was added for other reasons); at the same time, we should realize that control, generally speaking, arrives sooner at the less-significant bits. In any case, the naysayers' argument is weak: the added latency matters only on branches, and the amount of added latency is insignificant compared with the average time between branches; it seems likely that the throughput advantage and simple design of the byte-skewed control distribution will outweigh it. In the SPAM processor, the only arithmetic operation that gets slower under byte skewing is shifting right. But of course shifting left becomes simpler and gets faster.

In the SPAM implementation, byte-skewing is used in many places where it might not at first seem obvious that it is a good idea. For instance, the bits of the instruction word are rearranged so that the register identifiers rx and ry come out of the memory before the other bits of the instruction word. This way, producing the instruction operands early is possible; indeed, earlier than would be possible using the logarithmic-tree control distribution of the MiniMIPS.

5.2 Design Examples

The two parts of the SPAM design in the present invention are now presented to show two different ways that large STAPL-based systems can be designed.

5.2.1 The PCUNIT

The sequential CHP of a non-arbitrated PCUNIT would be

```
pc := init_pc;
*[ IMEM_ADDR!pc; pc += 4;
   DOBRANCH?d;
   [ d → pc := branch_target [] ¬d → skip
   ]
];
``` the PCUNIT learns by reading DOBRANCH whether it has to branch. With the arbitrated mechanism, the program becomes instead

```
pc := init_pc, va := false;
*[ IMEM_ADDR!pc, VA!va; pc += 4, va := false;
   [ DOBRANCH → pc := branch_target − 4, va := true, DOBRANCH
   [] ¬DOBRANCH → skip
   ]
];
```

Manohar, Nyström, and Martin describe the purpose of the VA channel and the implementation of the negated probe¬DOBRANCH. We further add a channel, EXPC, for informing the EXEC of what it needs for computing the target of relative branches and another for reading the as yet unspecified branch-target, which gets us to

```
pc := init_pc, va := false;
*[ IMEM_ADDR!pc, EXPC!pc, VA!va; pc += 4, va := false;
   [ DOBRANCH → BRANCH_TARGET?pc, va := true, DOBRANCH
   ▯ ¬DOBRANCH   → skip
   ]
],
``` where we have assumed that the branch target is computed elsewhere.

5.2.1.1 Adding Slack

Originally, the implementation of the PCUNIT program used in the SPAM processor was designed with an amount of pipelining that could be chosen when the system is reset. This was accomplished by using a fixed datapath and a number of initial tokens that could be chosen at reset time. Considering only the pc-increment function of the PCUNIT, we could write this as the program:

*[L?oldpc; R!(oldpc+n*4)]‖SLACK(R,L), where the process SLACK implements a high-slack channel. At reset time, this channel is initialized with n tokens, init_pc, init_pc+4, init_pc+8, ..., init_pc+4(n−1), corresponding to the first n pc-values. init_pc=8 in the SPAM architecture.

It turns out, however, that a much simpler design is obtained if the number of tokens is fixed. In the program that we shall see, n=2.

5.2.1.2 CAST Decomposition

The top-level CAST decomposition of the PCUNIT (without the arbiter—the arbitrated branch-mechanism is handled outside this program) is listed below. This program corresponds exactly to the CHP above, except that two pc-operations are in progress at the same time. The transformations used for getting hither are described by Pénzes.

```
define pcunit_noarb( ) (1of(2) d; 1of(4)[16] branchto; 1of(4)[16] expc;
         1of(4)[16] imem_addr; 1of(2) va)
{
 1of(2) bc, dup_ctrl;
 1of(4)[16] incpc, incpc2, genpc, newpc, pc2;
 1of(2)[32] addend, aug, genpc2;
 pc_sel32( ) psel(bc, incpc2, genpc, newpc);
 pc_copy( ) pcopy(newpc, imem_addr, expc, pc2);
 pc_incr( ) pinc(pc2, incpc); /* INCPC <- PC2 + 8 */
 /* initialize tokens: output of incrementer gets 8, input gets 4 */
 <i:16: [ i != 1 -> reset1of(4,0) r_pc2[i](pc2[i]),
   r_incpc[i](incpc[i]);] >
 reset1of(4,1) r_pc2_1(pc2[1]); reset1of(4,2) r_incpc_1(incpc[1]);
 slack(4,16,3) sm_incpc(incpc,incpc2); /* slack match common case */
 /* branch path */
 addend_dup( ) pdup(dup_ctrl, branchto, addend);
 <i:32: [ i!=2 -> zero_gen(2) a[i](aug[i]);]
  [ i==2 -> alternator( ) a2(aug[2]);]>
 pc_adder( ) padd(addend, aug, genpc2);
 <i:16: buf_2to4 b24_pc[i]({genpc2[2*i],genpc2[2*i+1]},genpc[i]); >
 1of(2) p_ns, p_s;
 singlewidth_slack(2,4) p_s_slack( p_ns , p_s );
  reset1of(2,0) r_s_slack(p_s);
 pcunitctrl( ) p(d, bc, dup_ctrl, va, p_s, p_ns);
}
```

5.2.1.3 Subprocesses

Figure 36:
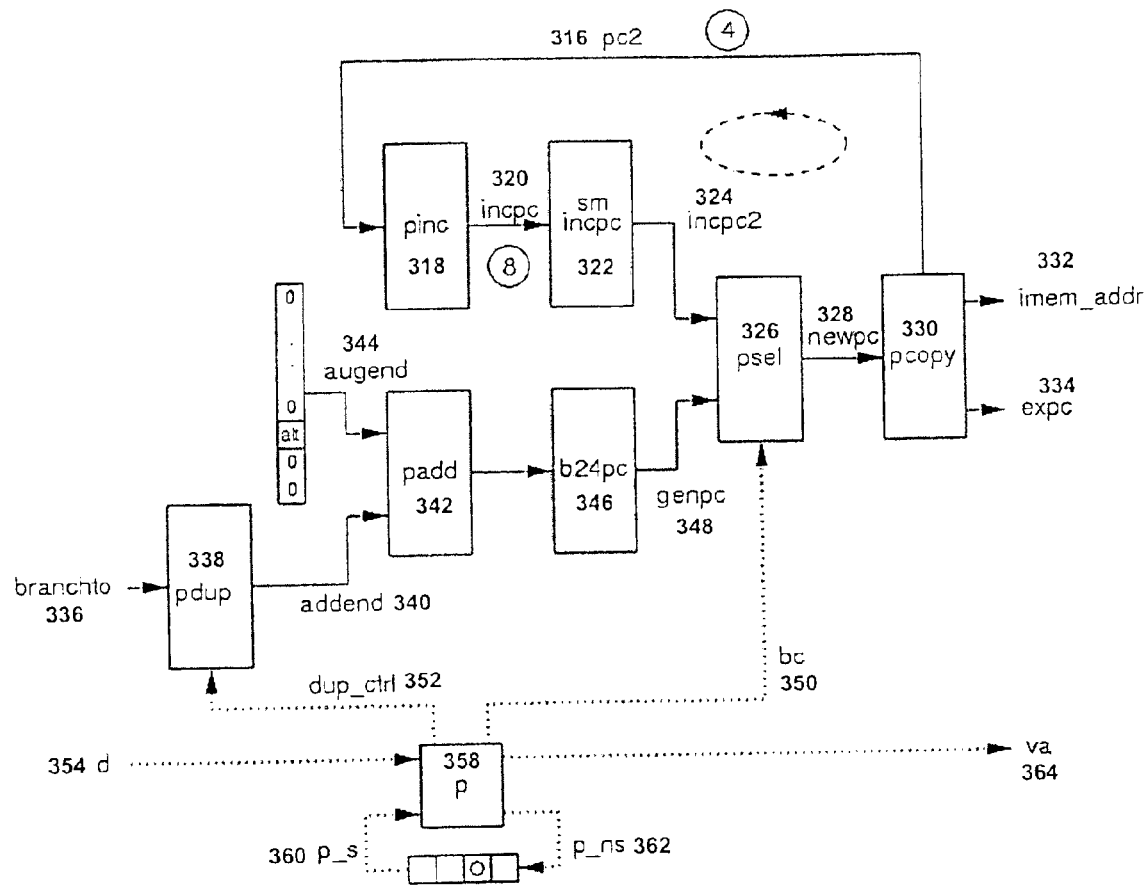
FIG. 36 is a process graph of PCUNIT.

The process graph is illustrated in FIG. 36. In the figure, data channels are drawn solid; control channels are drawn as dotted; initial tokens are shown as circles.

The top cycle in the listing is the one usually exercised: an old pc appears on pc2 316; pinc 318 increments it by eight (since two tokens are in the pc-increment loop, this is the right amount to increment by); sm_incpc 322 slack-matches it so that all the processes are given enough time to reset their handshakes; psel 326 selects it (as long as there has been no branch); pcopy 330 copies it to the various places it is needed. The bottom path, from branchto 336 to newpc 328, is only used during branches. This allows a simple ripple-carry adder's being used for padd 342. The unit that follows padd 342, b24_pc 346, converts the result of the addition from 32 1-of-2 codes (bits) to the 16 1-of-4 codes usually used for representing the pc value. All the processes are byte skewed; for instance, the lower bits of an operation in pcopy 330 in time overlap the higher bits in psel 326.

Branches are handled by discarding the two tokens in the pc loop and regenerating them. When a branch has been detected, pdup 338 sends the branch target address received on branchto 336 twice on the addend channel 340. The augend channel 344 meanwhile carries the two tokens 0 and 4. (The alternator process driving bit 2 of augend channel 344 accomplishes *[augend!0; augend!4].)

As is clear from the above, psel 326 is what we can call an "asymmetric select" process. It either simply reads and copies incpc2 324 to newpc 328 or else it reads and discards the value on incpc2 324 and reads and copies the value on genpc 348 to newpc 328 (on branches). The PL1 code for a single bit of psel 326 is listed as follows.

```
define pc_sel(e1of2 c; e1of4 incpc, genpc, newpc)
{
  communicate {
    true -> c?, incpc?;
    c == 0 -> newpc!incpc;
    c == 1 -> newpc!genpc, genpc?;
  }
}
```

The most complex of the PCUNIT processes is the control process pcunitctrl; this was implemented with a single PL1 program below:

```
define pcunitctrl(e1of2 d, selctl, dctl, wbva, s, ns)
{
  /* EVENTUALLY c(d) = c(wbva) = c(selctl) */
  invariant { s == 1 #> d != 1 }
  communicate {
    true -> s?, d?;
    /* normal op */
    s == 0 && d == 0 -> ns!0, wbva!0, selctl!0;
    /* start branching */
    s == 0 && d == 1 -> ns!1, wbva!1, selctl!1, dctl!1 /* copy */;
    /* stop branching */
    s == 1 -> ns!0, wbva!0, selctl!1, dctl!0 /* pass */;
  }
}
```

The only reason that the state variable s in this program was implemented using a feedback loop is that the PL1 compiler as yet does not handle state variables properly; making the replacement manually would save a few transistors, but it would also make modifying the program more difficult.

The reason that slack-matching is required (sm_incpc 322) is that the PCUNIT needs to produce a new pc every ten transitions, so the loop pinc 318—sm_incpc 322—psel 326—pcopy 330— ... should take twenty transitions, but pinc 318 takes only ten transitions; hence there are six transitions left (psel 326 and pcopy 330 only take two each)

that need to be absorbed if we want the system to be able to run at full speed.

5.2.1.4 32-Bit Incrementer

The most interesting of the datapath units is the incrementer. This unit computes, on 1-of-4 data, pc2:=pc+8. As mentioned above, it does this in ten transitions (i.e., five stages). However, it is still a very simple unit—the byte skewing allows this. The incrementer consists of three types of cells: a bottom adder cell for adding the actual increment, a carry cell that is specialized for adding zero plus a carry in, and a buffer for slack-matching.

Figure 37:
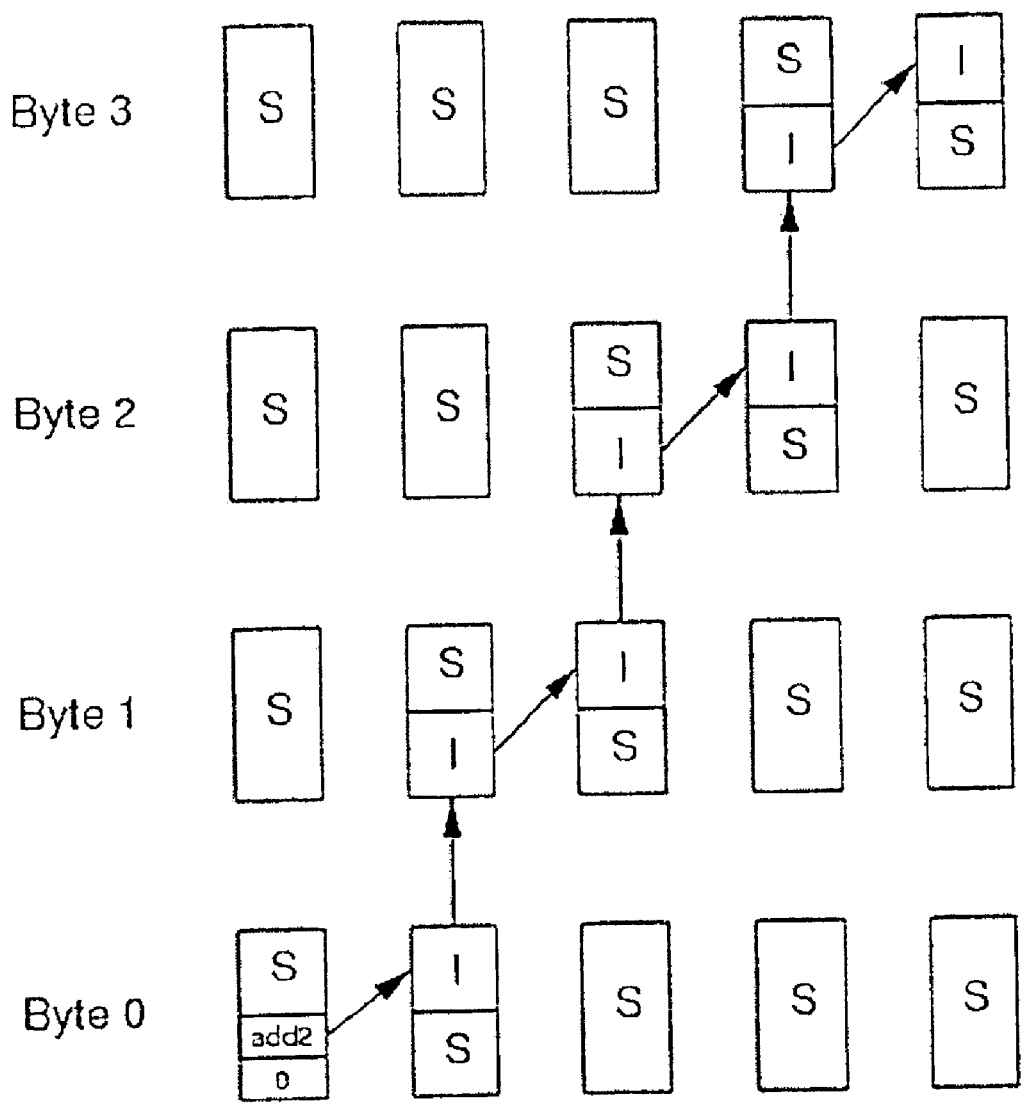
FIG. 37 is a block diagram of pc incrementer in the layout alignment, showing the flow of data from left to right.
Figure 38:
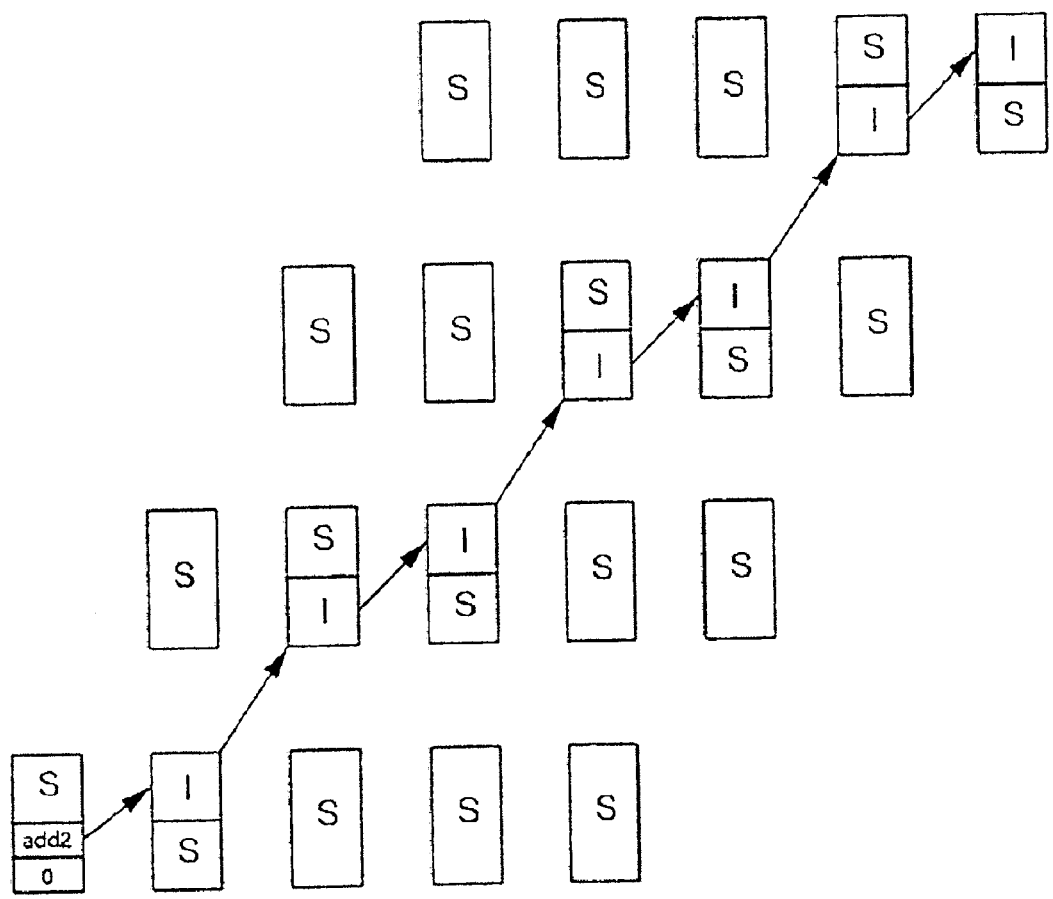
FIG. 38 is a block diagram of pc incrementer in the time alignment.

Because of the byte skewing, carrying across a byte boundary costs no extra latency; however, carrying within a byte does cost. Hence, carrying across byte boundaries is done with a rippling carry, and carrying within bytes is done with a carry forwarded to the next pipeline stage. By increasing the number of bits that can be incremented at the same time, we can minimize the number of carries that need to be done within bytes, which will thus minimize the number of stages required for the increment. It appears to be practical to increment pairs of 1-of-4 codes. Hence, the incrementer overall gets the structure seen in FIG. 37, which is a block diagram of pc incrementer in the layout alignment. The data flows from left to right in the figure. Also, in the figure only the carry paths have been drawn; "S" signifies a slack-matching stage (i.e., a buffer), and "I" signifies an incrementer stage. FIG. 37 has been redrawn in FIG. 38 in the time alignment. The beneficial effects of the byte skewing are here clear: the structure behaves in time as a pure carry-forward incrementer.

5.2.1.5 Implementation and Simulation

The PCUNIT layout as described here was produced using the magic layout tool, using design rules for the HP/MOSIS 0.6-$\mu$m process. Most of the layout was "quick and dirty"; the transistors were sized by hand to avoid bad cases of static charge-sharing (the circuits included charge-sharing avoidance measures, as well) and for reasonable performance.

Shared-transistor networks were used where performance was an issue.

The complete PCUNIT contains 54,786 transistors (this includes weak transistors in staticizers/bleeders and the transistors used for charge-sharing avoidance). The simulation results we shall see were obtained using the aspice circuit simulator without considering wiring resistance or capacitance. Because of the byte-skewed design-style and its relatively short wires, it seems likely that wiring resistance would not be an issue, even in more recent deep-submicron technologies; the extra wiring capacitance would cause a performance loss of from 20–40 percent, depending on how much the designer cares about speed relative to energy. It is fairly easy to show that if a circuit is well-balanced in the sense that its different parts run all at about the same speed and respond to sizing in about the same way and we are sizing the circuit for minimum $Et^n$, where n is some constant, then we should expect the optimal transistor-sizing to yield a speed that is roughly n/(n+1) of the simulated speed without parasitics. For many applications, n=2 is a reasonable choice; this choice can also be justified on theoretical grounds, as long as we are allowed to vary the supply voltage of the system being designed. For n=2 we should expect the optimally sized circuit to run about 70 percent as fast as the ones we are presenting here. (Note that the circuits we present here are not entirely unloaded—some wires are present, and some transistor parasitics, e.g. edge capacitances, are also present.)

Spice simulations show that the STAPL PCUNIT runs at about 1 GHz in its unwired state; this is about three times as fast as the QDI unit used in the MiniMIPS. Given that the MiniMIPS would be capable of operating at about 220 MHz if a layout bug were fixed, we should expect a fabricated STAPL PC UNIT to run at 650–700 MHz in the same technology.

Figure 39:
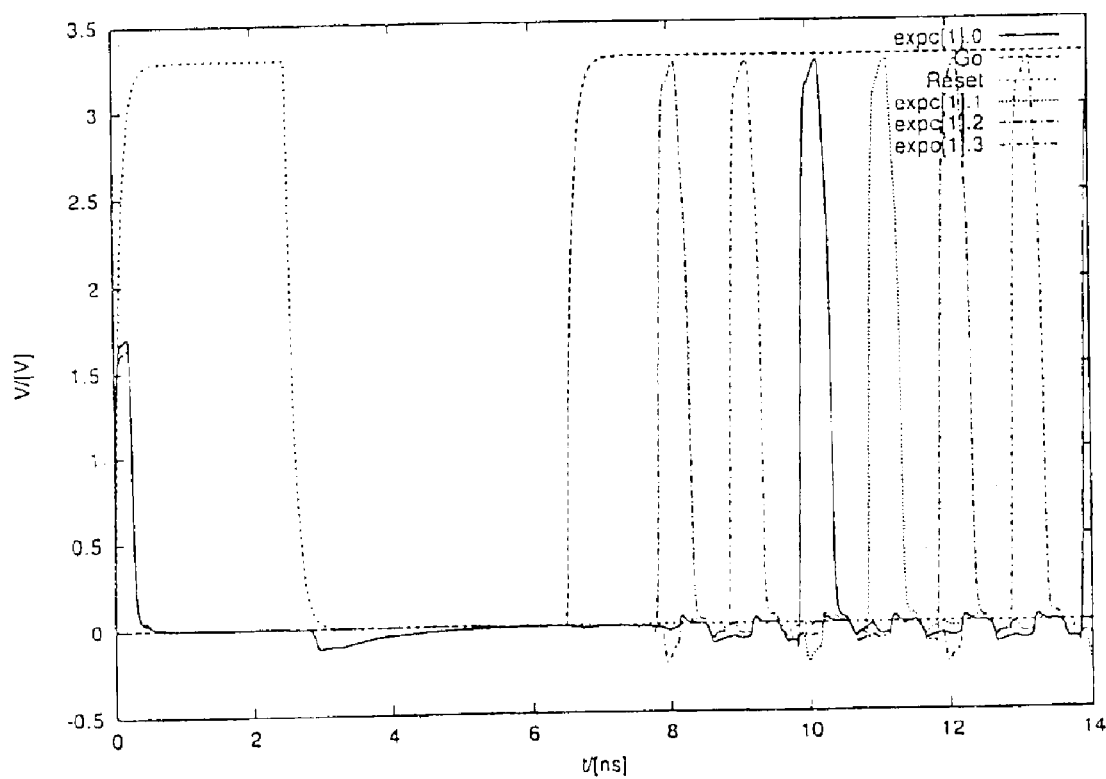
FIG. 39 is a plot showing the behavior of expc[1] after reset with no branches.
Figure 40:
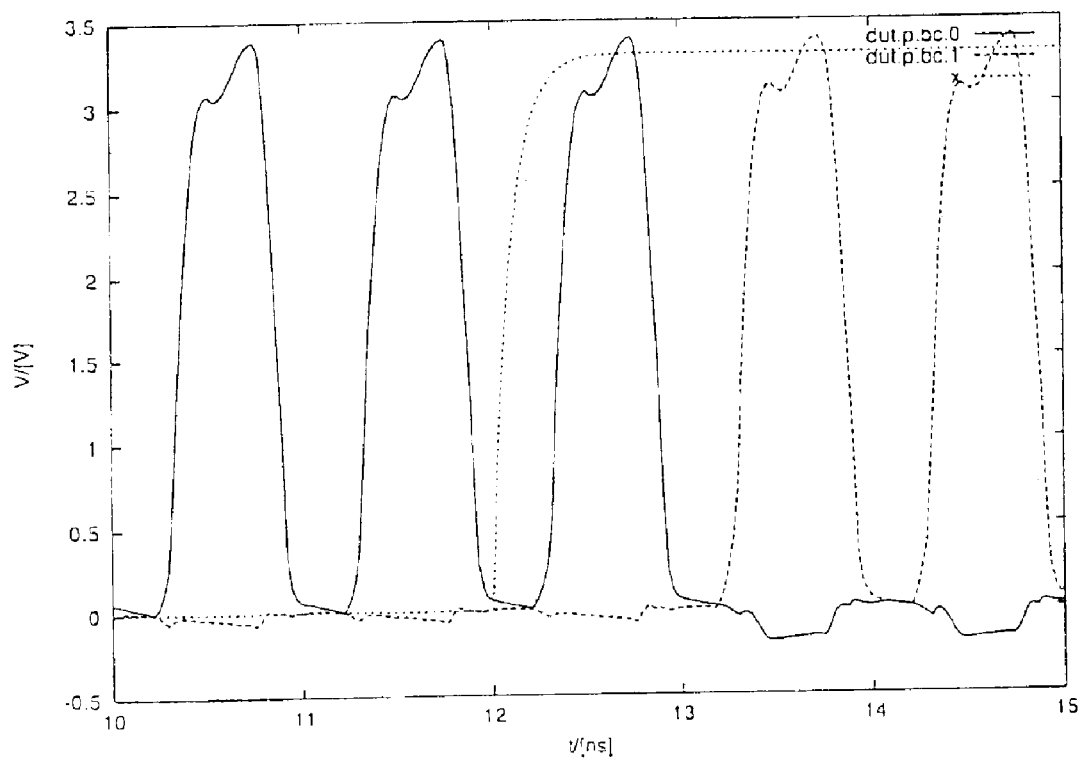
FIG. 40 is a plot showing the behavior of control for pc-selector psel where a branch is reported at t=12 ns.

Some simulation results are shown in FIG. 39 and FIG. 40. FIG. 39 is a plot that shows the behavior of expc[1], i.e., bits 2 and 3 of the pc, just after reset. FIG. 40 illustrates the latency of detecting a branch from the arbiter input's rising at t=12 ns to the control for psel's being produced at t≈13.3 ns; the datapath's producing the first branched-to pc value takes 2–5 more stages, so the total latency is about 2 ns. Each 40-ns simulation takes about four hours to run on a 1 GHz single-processor Intel Pentium III Xeon computer with 512 megabytes of memory, running FreeBSD 4.2.

Figure 41:
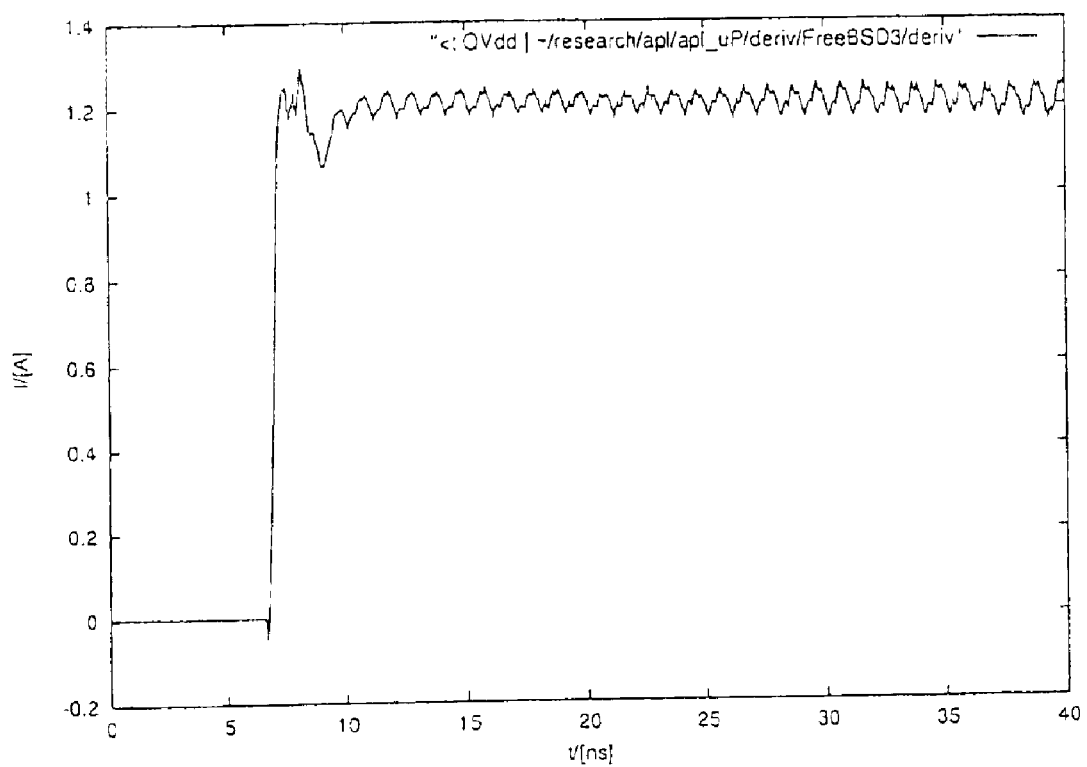
FIG. 41 is a plot showing the current draw of PCUNIT in amperes with no branching and the signal Go is active at t=6.5 ns.
Figure 42:
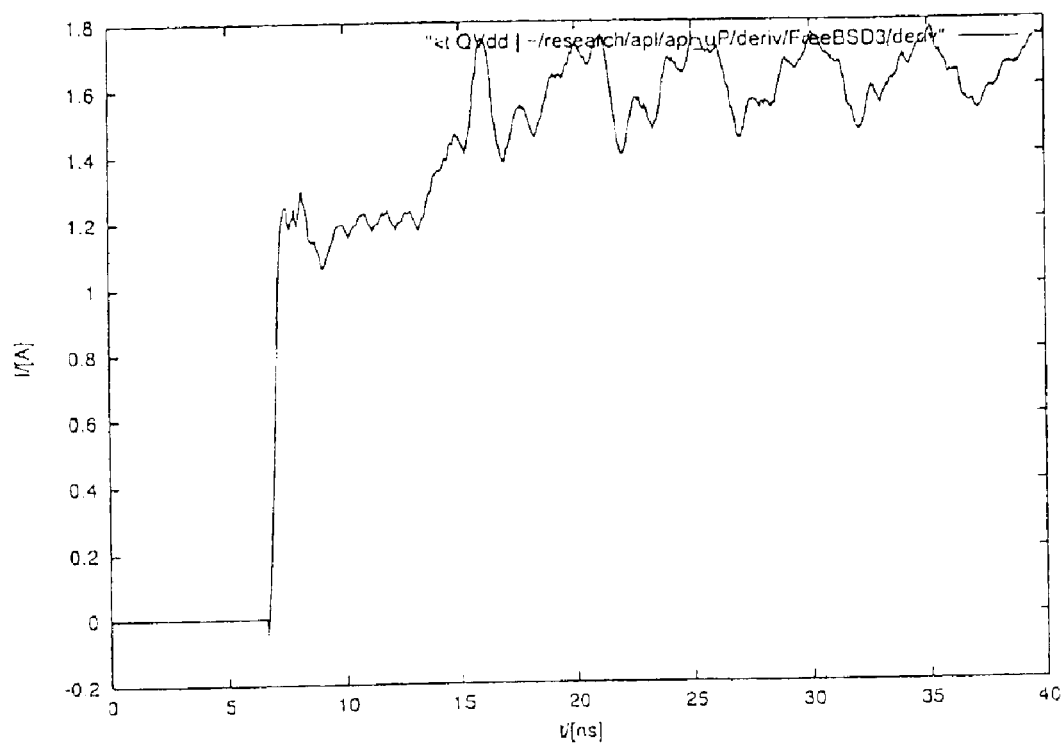
FIG. 42 is a plot showing the current draw of PCUNIT in amperes with constant branching after t=12 ns and the signal Go is active at t=6.5 ns.
Figure 43:
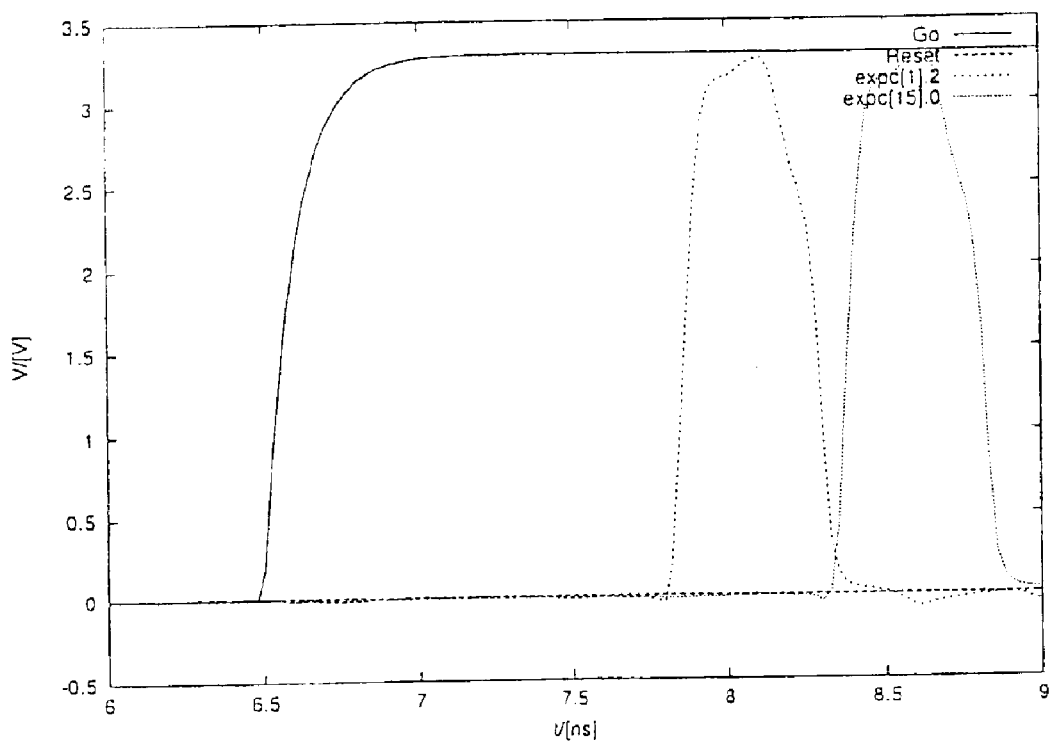
FIG. 43 is a plot showing the arrival of least and most significant 1-of-4 codes of pc.

The current consumption of the PCUNIT is shown in FIG. 41 and in FIG. 42; FIG. 41 shows the current consumption when there is no branching, whereas FIG. 42 shows it for constant branching. For the no-branching case, the power consumption is about 1.2 A×3.3 V≈4 W, or about 4 nJ per operation. While this may seem a high number (the MiniMIPS fetch unit uses about 2.6 nJ per instruction), we must remember that the circuits were not carefully designed at the analog, level, that they run at 1 GHz, and that whereas the power consumption is high, at least the noise-inducing dI/dt is very low. Finally, the latency due to byte skewing is illustrated in FIG. 43; in this figure, we can see that expc[15] is produced about 0.5 ns later than expc[1].

We should point out that the circuit is a simplistic one: the slack-matching of the incrementer is done with standard left-right buffers. Since the number of tokens is known at compile time, we could easily use higher-slack buffers that use less energy and fewer transistors for the same amount of slack. It seems likely that nearly half the energy could thus be saved. A little less easily, the PCUNIT could be redesigned to have the same input-output specification but to use an algorithm optimized for the average case; studies of the MiniMIPS have shown that even greater savings would be possible in this way.

The most difficult part of the PCUNIT for the circuit designer is the pc incrementer. In our decomposition, this unit is used on every instruction fetch; hence the number of 1-of-4 codes that can be incremented in a single stage of logic to a large extent determines how fast the whole processor can run, for a given degree of speculation. For this reason, carefully designing the pc-incrementer stage so it achieves the highest possible throughput and the smallest possible latency becomes necessary.

Figure 44:
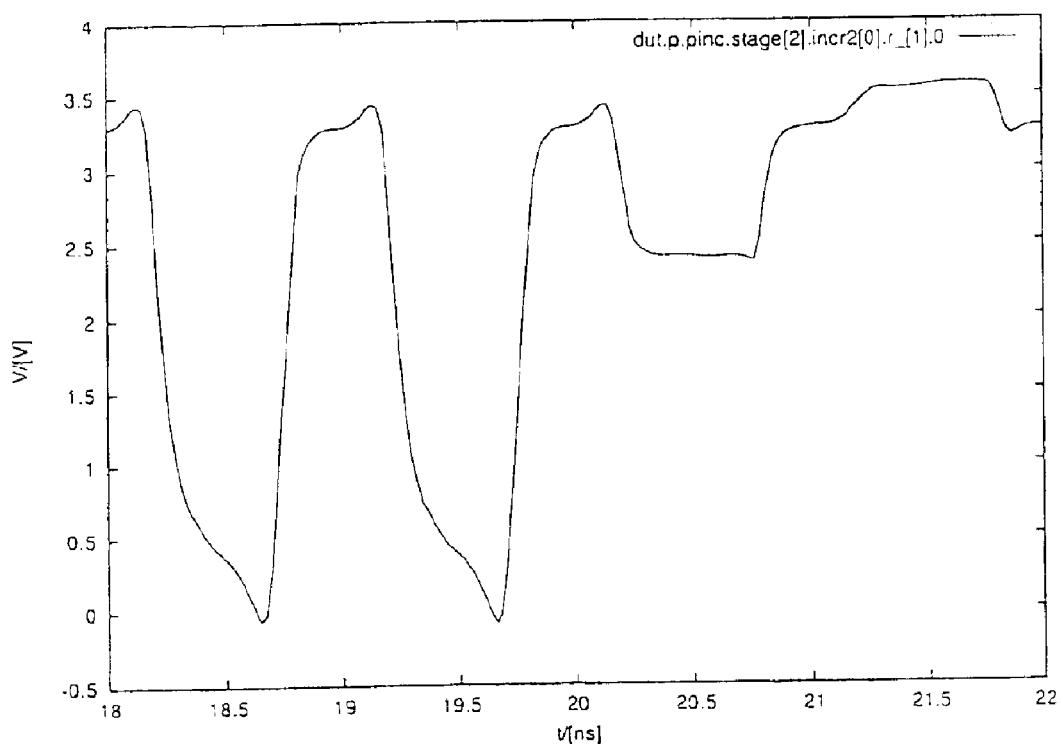
FIG. 44 is a plot showing the charge sharing in the pcincrementer.

In the domino-logic design-style that we use, the circuits perform fastest if transistors are shared in the pulldown paths; in the pc incrementer this sharing is necessary if we want to get acceptable performance. The sharing leads to large internal parasitic capacitances and hence to difficulties with charge sharing. An example of the bad effects of charge sharing is seen in FIG. 44. The figure shows one of the output-logic nodes of the more-significant incrementer-domino as the carry-in changes (the output goes from zero to one); because the incrementer computed a result of zero on the previous cycle, the internal nodes are charged up, and hence the figure shows almost the worst-case charge-sharing possible in this circuit.

Figure 45:
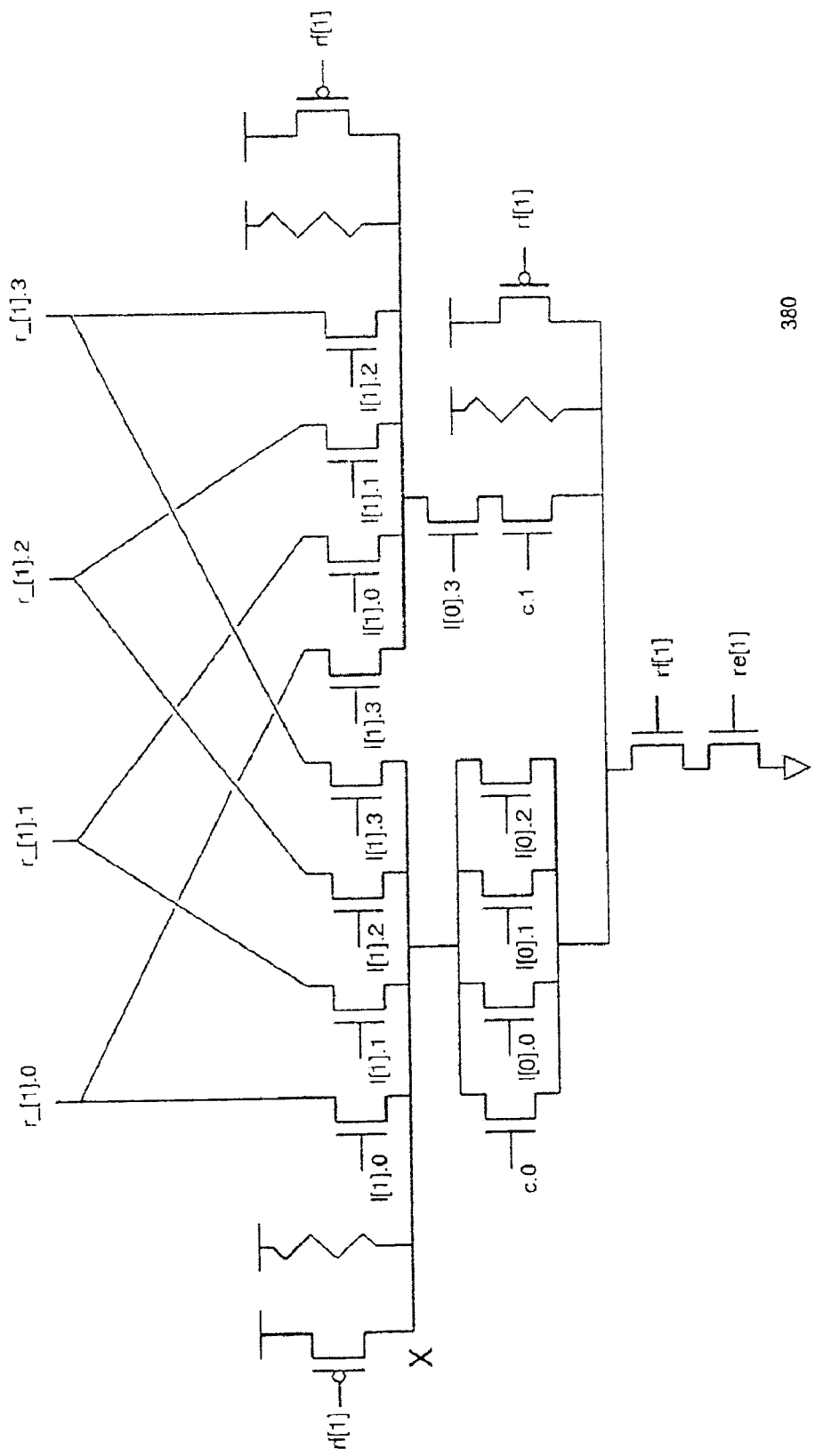
FIG. 45 is a circuit diagram of compute logic for the upper 1-of-4 code in pc-incrementer.

The compute logic for the upper 1-of-4 code (pull-down logic) in pc-incrementer is shown in FIG. 45. Compute logic circuit 380 has a node that is marked by the "X" as the source of our charge-sharing troubles. The p-transistors to Vdd and the parallel resistors (implemented by weak p-transistors to Vdd with their gates grounded) are used for reducing the effects of charge sharing by charging the internal nodes away from GND when the circuit resets. By sizing them larger, we can reduce or eliminate the charge-sharing problem, at the cost of a slower, more power-hungry circuit.

The PCUNIT was implemented mainly with PL1 processes. Those things that were not designed as PL1 processes either already existed (they were simple, hand-compiled processes like the copy processes and merge processes required in any STAPL design of moderate complexity) or they were hand-designed for flexibility (e.g., the 2×1-of-4 code incrementer cell was parameterized to allow easy experimenting with different arrangements; the result of compiling a PL1 program implementing the finally chosen design would have been similar if not identical to the hand-designed circuit with the finally chosen parameters).

5.2.2 The REGFILE

In the PCUNIT design that we have just seen, we were able to decompose the large-scale unit into a collection of PL1 processes, i.e., into a collection of processes whose implementation exactly followed the rules of STAPL implementation. This already suggests that the STAPL technique and the PL1 language let us build digital logic systems.

The SPAM processor implementation has three array structures: an instruction memory, a data memory, and a register file. As a first step in applying APL techniques to the design of such circuits, the register file is a ten-transition-per-cycle APL circuit, using single-track handshaking. The instruction memory and data memory are simplified versions of the register file: the instruction memory has one read port and no write port; the data memory has one read port and one write port. The register file itself of course has two read ports and one write port. The design that we shall see here uses an additional timing assumption for the purpose of reducing the transistor count; it implements an 8×8-bit register array in a single process, which would not be possible if we were to strictly follow the rules of section 4. It also uses a higher-level design-trick inherited from the MiniMIPS design for the purpose of increasing the slack: a special type of buffer is used for distributing the register control to the register file in such a way that conflicting register accesses (i.e., reads and writes, or writes and writes, referring to the same register) are properly sequenced, but other accesses can be performed out of order.

5.2.2.1 REGFILE Specification

The SPAM REGFILE has 8 registers numbered 0–7, of which register 0 is always zero (it may be written, but such writes will be ignored); it has two read ports, x and y, and one write port, z.

Because of the SPAM architecture's orthogonal instruction set, there is nothing very mysterious about the REGFILE: it is simply consulted for the execution of every instruction. Hence, its CHP specification is

```
REGFILE ≡
gpr[0] := 0;
*[ I?i;
   X!gpr[i.rx], Y!gpr[i.ry];
   [ i.rz = 0 → Z?_
   ▯ i.rz ≠ 0 → Z?gpr[i.rz]
   ]
]
```

We should like to implement the REGFILE in a way that allows the reading and writing of registers in the core to be performed concurrently; the register core will then be specified as:

```
REGCORE ≡
gpr[0] := 0;
*[ I?i; X!gpr[i.rx], Y!gpr[i.ry], Z?gpr[i.rz] ]
```

If we can implement the REGCORE thus, we shall be able to use simpler circuit realizations of the register bits than the general state-bit described in Section 4.4.3.1 (the general state-bit can be read and written at the same time, whence it is necessary to copy the value between iterations so that the reading does not result in the new value or confusion).

The main thing that raises concern here is that a register may be read and written on the same iteration of REGFILE, but this is not true of the REGCORE program. A register-bypass mechanism solves this problem: we copy the input value three ways, delay the write to the register file by one iteration, and if the same register is read on the iteration following the one it was written on, the value is read from the bypass unit rather than from the register core. The bypass mechanism also reduces the read latency for reads of registers that have lately been written. The mechanism is essentially identical to the one used in the MiniMIPS.

5.2.2.2 REGFILE Decomposition

The REGFILE is decomposed into three main pieces: the bypass unit, the register core, and the register control; the decomposition is listed below.

```
define regfile( )(1of(2) [3] rx, ry, rz; 1of(4) [16] x, y;
    1of(4) [16] z0, z1, z2; 1of(2) reg_wb)
{
    1of(4) [16] corex, corey, corez0;
    1of(8) cx, cy, cz; 1of(2) bx, by, bxs, bys;
    regctrl( ) rct(rx,ry,rz, reg_wb, cx, cy, cz, bx, by);
    slack(2,1,3) s_bx({bx},{bxs}), s_by({by},{bys});
    bypass( ) b(bxs, bys, x, y, z0, z1, z2, corex, corey, corez0);
    reg_core(true) rco({ cx,cy }, cz, , corez0);
    rco.r[0..15,0] = corex[0..15]; rco.r[0..15,1] = corey[0..15];
}
```

Figure 46:
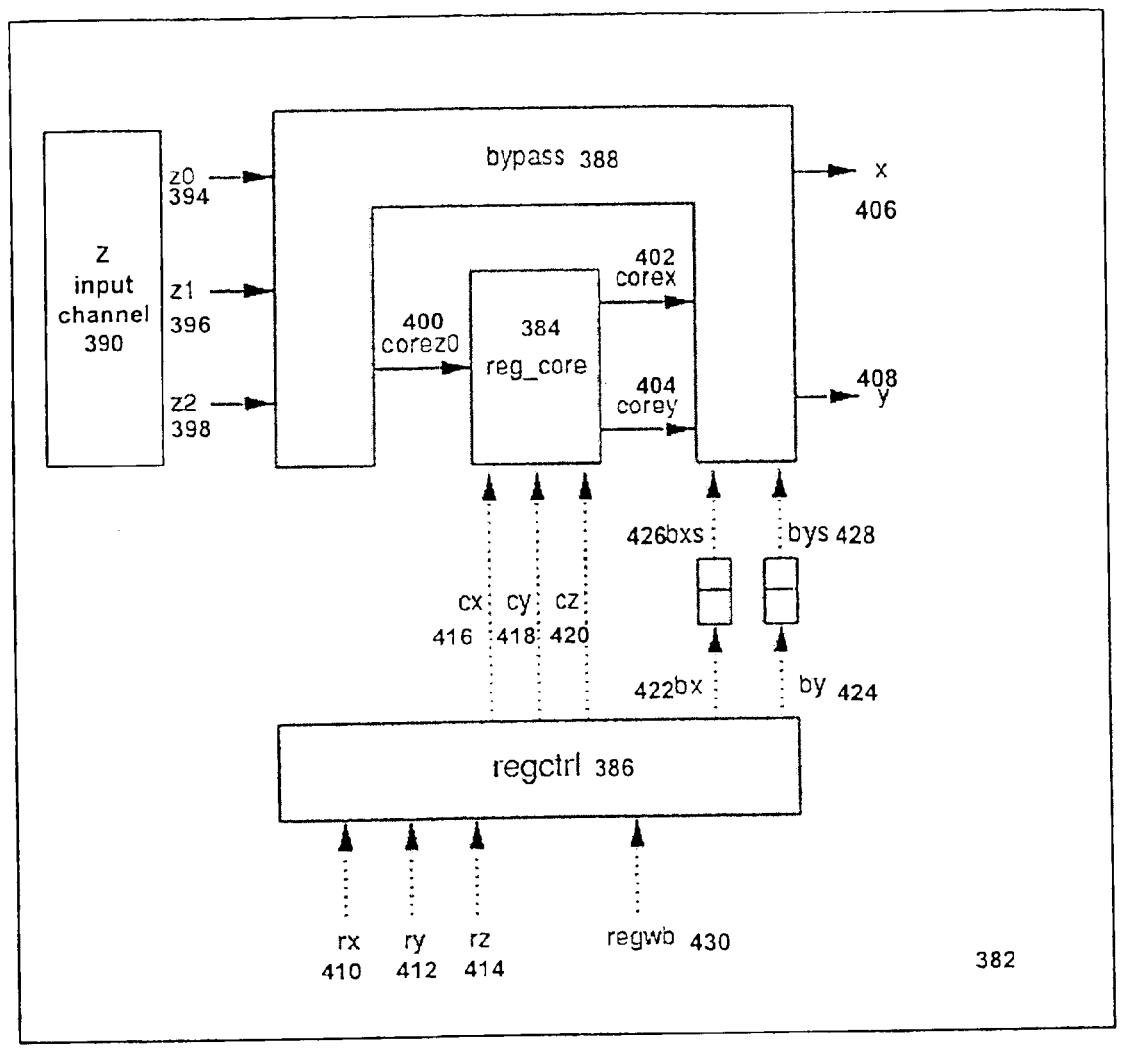
FIG. 46 is a process graph of REGFILE. where data channels are drawn solid and control channels dotted.

The process graph of REGFILE 382 is depicted in FIG. 46. In the figure, data channels are drawn solid while control channels are drawn dotted. Register control 386 and bypass 388 are further decomposed into sets of PL1 processes, which are then compiled into STAPL circuits. The register core is a hand-compiled circuit that obeys the STAPL timing constraints.

Note that we have split the input channel Z 390 into three: Z0 394, Z1 396, and Z2 398. It turned out that the unit merging the results from the different execution units (arithmetic, function block, shifter, and so on) was a simple one and could easily take on additional functions. By combining the copying of Z that would normally have to occur in REGFILE with the merging function, we are able to remove one stage of pipelining from the execution loop, at the cost of this minor cluttering of the REGFILE interface.

Core data input 400 serves data to the register core 384 and two channels core x 402 and core y 404 serve as output. There are also two outputs, x 406 and y 408, for bypass 308. Register control 386 is controlled by control channels rx 410, ry 412, rz 414. In turn, register control 386 controls register core 384 through control channels cx 416, cy 418 and cz 420. cx 416 and cy 418 are channels to control reads while cz 420 control writes from Z input 390. All three channels are buffered to ensure correct operation. The buffer prevents concurrent read and write to the same register in the same cycle.

Register control 386 controls bypass 388 through bx 422, by 424, bxs 426 and bys 428.

5.2.2.3 Register-core Cell

The register-core cell holds eight bits in eight registers (64 state bits) in a single process. The read and write ports may be treated as separate units; this is possible because the register control issues only non-conflicting reads and writes to the core (recall that this was the purpose of introducing the bypass).

Figure 47:
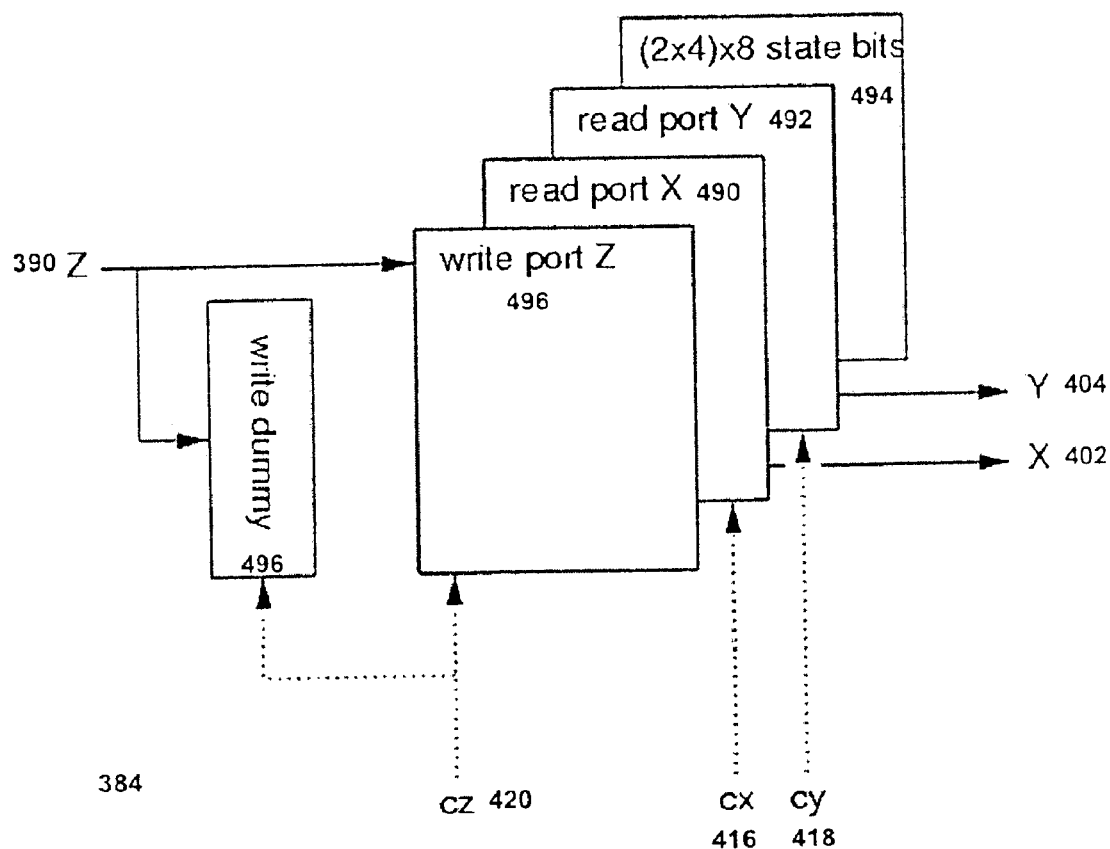
FIG. 47 is a block diagram of 8×8 register-core cell where input and output channels are each four 1-of-4 codes.

A block diagram of the 8×8 register-core cell 384 is shown in FIG. 47. The (two-read-port, one-write-port) core cell consists of five distinct parts: two read-port subcells X 490 and Y 492, one write-port subcell Z 496, one dummy-write subcell 496, and the state bits themselves (494). The input and output channels are each four 1-of-4 codes. The control channels cz 420, cx 416 and cy 418 are as before in the previous figure. The core cell has two outputs, X 404 and Y 402, and one input channel Z 390.

Figure 48:
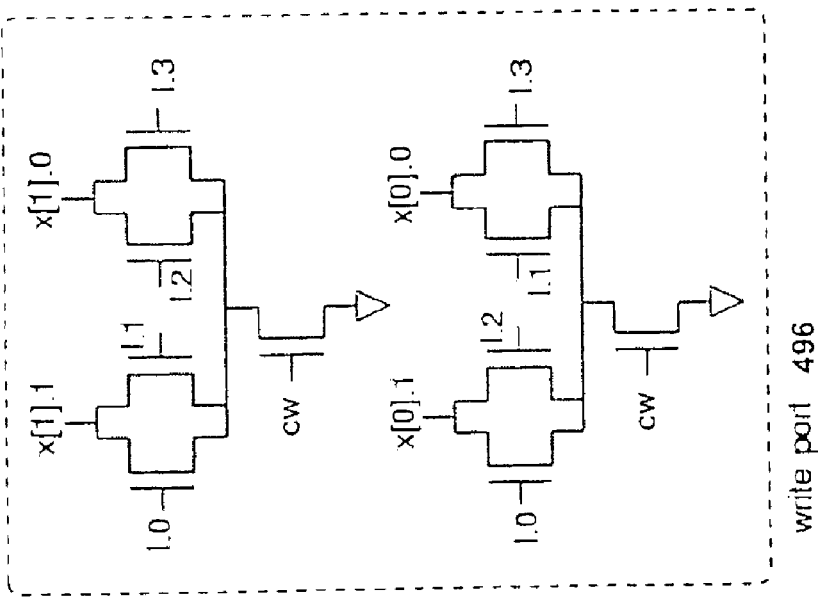
FIG. 48 is a diagram showing the circuitry associated with each pair of state bits in register core.
Figure 48:
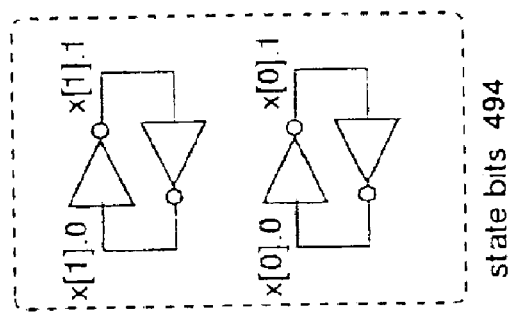
Figure 48:
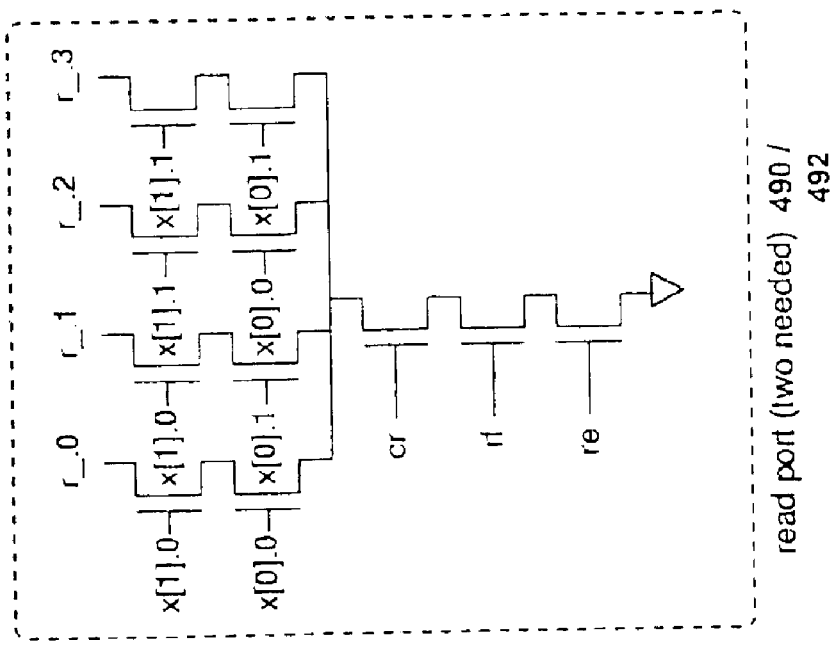

The state bits are organized in pairs; this allows generating the read outputs directly as 1-of-4 codes in the core. The circuitry used for each pair of state bits is shown in FIG. 48. There is a representative read port (490). Two are needed in the implementation, so read port 492 is not shown. There are also state bits component 494 and write port 496.

Figure 49:
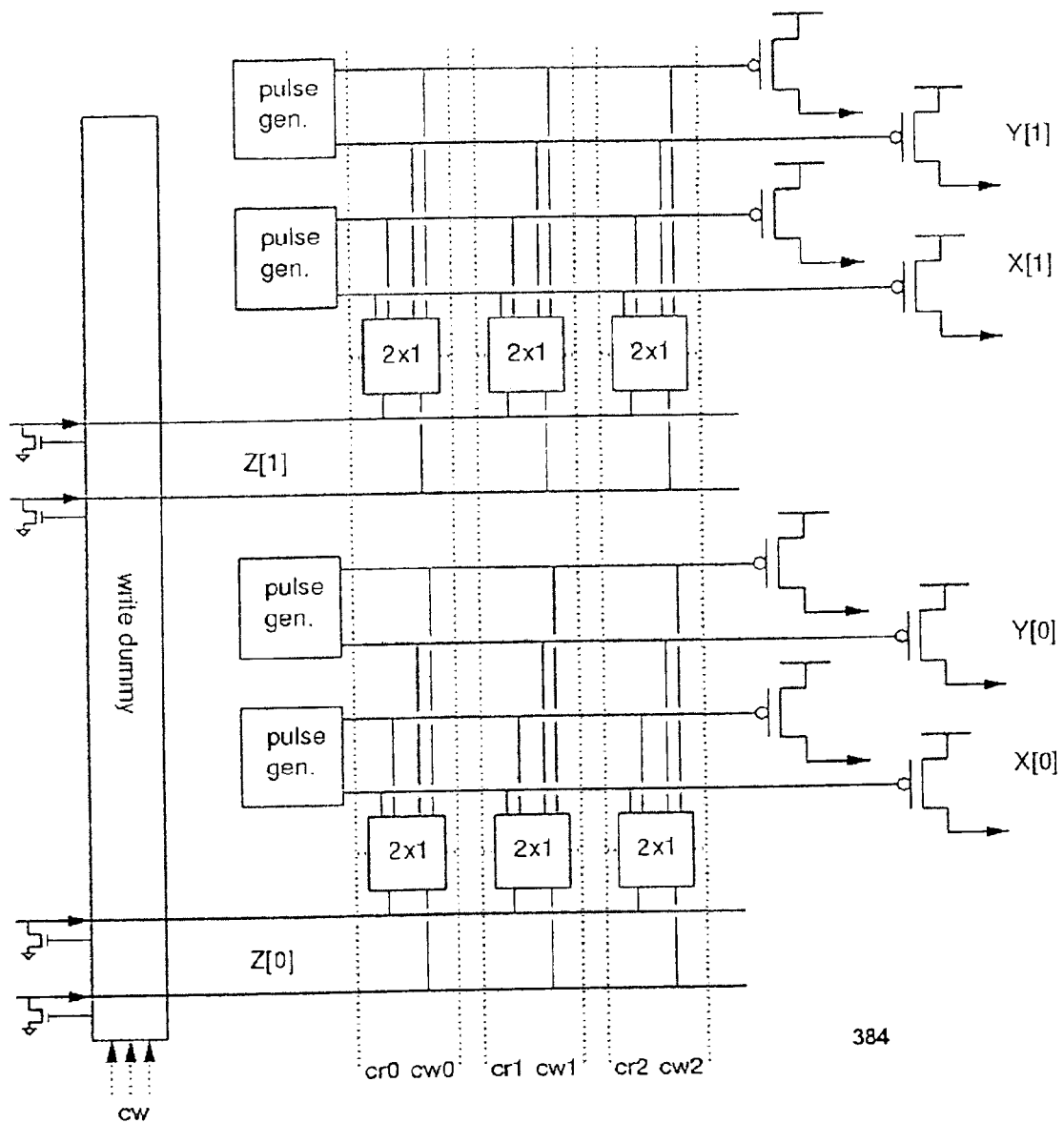
FIG. 49 is a diagram showing the overall arrangement of register-core cell where a two 1-of-4-code tall, three-register wide chunk is shown.

The overall arrangement of the register-core cell consisting of the state bits, the word (i.e., byte) lines, bit lines, pulse generators, etc. is shown in FIG. 49. José Tierno has kindly pointed out that this register file could easily be extended to 32 registers while maintaining almost the same performance by making four of the 8×8 bit cores we have here but then ganging them together simply by putting the output p-transistors in parallel (some modifications to the control circuitry would also be needed). This would allow a MIPS- or Alpha-style 32-entry register file in a single pipeline stage, operating at ten transitions per cycle. As usual, the control wires have been drawn dotted. There are in reality four data wires for each of X, Y, and Z.

Simulations show that this register file operates at about the same speed as the logic circuitry we have seen before, i.e., about 1 GHz in 0.6-$\mu$m CMOS without wiring, according to our simulations; this indicates that the speed for fabricated parts would be 650–700 MHz.

5.2.3 Comparison with QDI

We have now seen the design of a large, concurrent system using the STAPL circuit family. The speed and energy advantages of QDI design have been established before.

There are four chief dimensions of interest in comparing STAPL to QDI: ease of design, speed, energy consumption, and reliability; reliability may include tolerance to design errors and noise, and the ability of operating over a wide range of environmental conditions.

5.2.3.1 Ease of Design

The PL1 language shows that it is easy to design STAPL circuits, so easy a computer can do it well. But given the similarities between STAPL and QDI circuits, it would be easy to write the same software tools for QDI circuits (indeed the work is already in progress). And QDI circuits are easier to generalize: there is a compilation technique that will take us from CHP all the way to PRS. We must also remember that STAPL circuits are more sensitive to sizing; it is not clear how important this is for the designer, since QDI sizing must also be verified before fabrication.

5.2.3.2 Speed

STAPL circuits run faster than QDI circuits. The SPAM example shows that something as large as a microprocessor can be designed with circuits that all run at ten transitions per cycle, whereas it would be very difficult to do so in less than 18 with only QDI circuits. The reason for the difference is that STAPL circuits remove many waits that are necessary for maintaining QDI protocols and replace them with timing assumptions. Furthermore, STAPL circuits load their inputs less than do QDI circuits, because they generally do not need the completion circuitry that is needed in QDI circuits. The SPAM processor parts that we have simulated run three times as fast as similar parts from the MiniMIPS.

It should be noted that STAPL circuits do not offer a magic bullet for dealing with latency issues. The latency through a STAPL stage is somewhat smaller than through the same stage of QDI computation, because of the lesser loading of the inputs; but the difference is minor. Some might say that STAPL circuits make the job harder for the microarchitect, much as the faster improvement in processor speed compared with the improvement in DRAM access-time has made his job harder.

5.2.3.3 Energy

To first order, there is no reason to believe that QDI and STAPL should use very different amounts of energy. The reason is that STAPL circuits have most of the paths that are present in QDI circuits: the logic is the same, much of the output completion is the same. There is no input completion, nor are there acknowledge wires, but on the other hand, the QDI circuits do not have pulse generators. Estimating the energy lost to interference is difficult, but so is estimating the energy lost to "shoot-through" current in the combinational completion-networks in QDI circuits.

A circuit carrying out the STAPL handshake uses the same wires for receiving data as it does for acknowledging it; hence in the limit of single one-hot codes, there are only half as many transitions on the interface nodes of STAPL circuits as there are for QDI circuits. But in QDI circuits, one can combine the acknowledges by synchronizing at a slightly larger grain-size: e.g., in the MiniMIPS, most "elementary" processes (meaning those that communicate with their environment entirely on channels) are eight-bit processes, thus amortizing the cost of the acknowledge across all eight bits. But in STAPL circuits, little would be gained by this. Hence the STAPL circuits invite deeper pipelining.

In short, this means that while STAPL and QDI circuits can be built that look nearly identical, that may be an artificial thing to do. And hence we cannot say that, given a high-level specification, its well-designed STAPL and QDI implementations will dissipate the same amount of energy per operation. We cannot, for instance, say that STAPL circuits will run three times faster and use the same amount of energy as QDI circuits: the higher degree of pipelining in STAPL circuits will use a little more energy than that.

Let us evaluate STAPL and QDI circuits using the $Et^2$ metric; this metric captures the fact that by our varying the supply voltage of a CMOS circuit, any speed improvement can be traded for roughly twice that improvement in energy. The 1:2 tradeoff is reasonably accurate for a wide range of operating voltages. The $Et^2$ metric was introduced in the context of the MiniMIPS by Martin et al. STAPL circuits are about three times faster for the circuits we have studied; the transistor count is about twice as high, and there is an extra handshake for each 1-of-4 code that is not present for the QDI implementations that we compared with. Hence, conservatively estimating (E→2E, t→t/3) the improvement in $Et^2$ gives that STAPL circuits improve by a factor of about five; to first order, the change in $At^2$ would be about the same. How this comparison would turn out if we compared PL1-described STAPL with similarly generated QDI circuits is less clear, because some part of the higher transistor-count of the STAPL circuits is due to our using higher-level design tools rather than to the circuit family itself. (The MiniMIPS processor, whence come the QDI circuits we are comparing with, was designed entirely by hand.)

5.2.3.4 Reliability

The STAPL circuits could be engineered to be more tolerant to supply-voltage changes by making sure that a decreases and (increases as the supply voltage changes instead of the other way around. Recall that the single-track handshake involves four timing constraints; these are captured by $\sigma_{true}$, $\sigma_{false}$, $\xi_{true}$, and $\xi_{false}$ (see FIG. 22).

As for injected noise, it does not seem that either STAPL circuits or QDI circuits are particularly trustworthy. Both design styles make much use of dynamic logic; both design styles achieve high performance when gate sharing is used, which leads to charge sharing and thence to problems with the dynamic nodes. The STAPL circuits do use more dynamic stages than do the QDI circuits, but on the other hand, charge-sharing-avoiding circuits are easier to design in STAPL circuits.

Conclusion

Thus, an asynchronous pulse logic circuit is described in conjunction with one or more specific embodiments. The invention is defined by the claims and their full scope of equivalents.

Appendix A: SPAM Processor Architecture Definition

A Introduction

This appendix describes the Simple Pulsed Asynchronous Microprocessor (SPAM) architecture. SPAM is a simple 32-bit RISC architecture intended for hardware demonstration projects. Its design reflects a desire of making a high-performance implementation as easy as possible. This is not without merit on the software level; for instance, as a result of the desire of keeping the hardware as simple as possible, the instruction set of the SPAM processor is completely orthogonal; i.e., all instructions use the same addressing mode and instruction format.

A.2 SPAM Overview

The SPAM architecture defines eight general-purpose registers, gpr[0] through gpr[7], of which gpr[0] is always read as zero, although it may be written by any instruction. Apart from these, the processor state consists only of the program counter, pc. The instructions provided are arithmetic instructions, load-store instructions, and pc-changing instructions. Changes to pc take effect immediately—there is no "branch delay slot." The architecture does not define floating-point operations, interrupts, or exceptions.

A.3 SPAM Instruction Format

All SPAM instructions have the same format. The instruction format is a four-operand RISC format with three register operands and a single immediate operand. The opcode format has two fields, which are also the same across all instructions. These fields are the operation unit and the operation function. The operation "Y-mode," which determines the addressing mode used for conjuring operand opy, is further defined in a fixed position in the instruction.

SPAM instructions are 32 bits wide. Considering a SPAM instruction i as a 32-bit array of bits, we identify the fields of the instruction:

1. The opcode=i[31 . . . 27], further grouped into:
    (a) The unit number unit=i[31 . . . 30].
    (b) The function fxn=i[29 . . . 27].
2. The Y-mode ymode=i[26 . . . 25].
3. The result register number rz=i[24 . . . 22].
4. The X-operand register number rx=i[21 . . . 19].
5. The Y-operand register number ry=i[18 . . . 16].
6. The immediate field imm=i[15 . . . 0].

A.4 SPAM Instruction Semantics

Because the SPAM instruction set is orthogonal, we may define the semantics of instructions in a modular way. An instruction execution consists of the following steps:

1. Generating the operands:

$opx:=gpr[i.rx]$ and $opy:=\text{YMODE}(i.\text{ymode})(gpr[i.ry],i.imm)$

2. Computing the result:

$opz:=OP(i.\text{opcode})(opx,opy)$ (a) Computing the next pc:

$pc:PCOP(i.\text{opcode})(pc,opx,opy)$

3. Writing back opz:

$gpr[i.rz]:=opz$

All instructions are executed in these three steps. Hence, all instructions produce a result that is written back in the register file; if the value is not needed for further computation, it should be discarded by setting i.tz to zero (in the assembly language, this can be accomplished by leaving out the target register). In what follows, we shall mainly deal with how opz is computed (i.e., the part above denoted by OP), since all else is the same for all instructions, except that branches also need to compute pc (denoted by PCOP).

A.4.1 Operand Generation

The first operand, opx, is always the contents of gpr[i.rx]. The second operand, opy, is computed from the contents of gpr[i.ry] and the immediate field, depending on i.ymode.

Allowable values for i.ymode are as follows, where sext signifies sign extension:

| i.ymode Mnemonic | Decimal value | Operand generated |
|---|---|---|
| YMODE_REG | 0 | opy := gpr[i.ry] |
| YMODE_IMM | 1 | opy := sext(i.imm) |
| YMODE_IMMSHIFT | 2 | opy := i.imm << 16 |
| YMODE_REGIMM | 3 | opy := gpr[i.ry] + sext(i.imm) |

A.4.2 Operation Definitions

Operations are defined on two's-complement numbers. There are no flags or condition codes. We group the operations by unit:

A.4.2.1 ALU Operations i.unit=UNIT_ALU=0

All ALU operations take two operands and produce one result. The bitwise_NOR is included in the instruction set for the express purpose of computing the bitwise inverse of opx using a zero operand for opy.

| Mnemonic | Name | i.fxn | Operation |
|---|---|---|---|
| add | Add | 0 | opz := $(opx + opy)_{31\ldots0}$ |
| sub | Subtract | 1 | opz := $(opx - opy)_{31\ldots0}$ |
| nor | NOR | 4 | opz := bitwise_NOR(opx,opy) |
| and | AND | 5 | opz := bitwise_AND(opx,opy) |
| or | OR | 6 | opz := bitwise_OR(opx,opy) |
| xor | Exclusive OR | 7 | opz := bitwise_XOR(opx,opy) |

A.4.2.2 Branch Operations i.unit=UNIT_BRCH=1

Branch operations include unconditional jumps (jmp) and the halt instruction (hlt). All branch operations unconditionally produce the same result, namely the value of pc, right-shifted by two; this value is used for opz. Likewise, a branch taken will branch to the address denoted by opy incremented by one and left-shifted by two. The shifting avoids having to define the behavior of alignment errors and allows larger immediate branch-offsets.

Note that the mechanism described for branch addresses allows a simple compilation of function call-return linkage. The function-call jump saves the current PC, and then the function-return jump calls back through the saved address. Coroutine linkage is compiled similarly. (The SPAM architecture leaves unspecified function-parameter-linkage conventions and register-save masks, etc.)

The hit instruction halts the machine. An external action, not defined within the architecture, is required for restarting it.

Conditional branches branch on the value of opx.

| Mnemonic | Name | i.fxn | Branch if | Target |
|---|---|---|---|---|
| hlt | Halt | 0 | true | $\perp$ |
| beq | Branch on Equal | 1 | opx = 0 | $(opy_{29...0} + 1)\|00$ |
| bne | Branch on Not Equal | 2 | opx ≠ 0 | $(opy_{29...0} + 1)\|00$ |
| bgt | Branch on Greater Than | 3 | opx > 0 | $(opy_{29...0} + 1)\|00$ |
| blt | Branch on Less Than | 4 | opx < 0 | $(opy_{29...0} + 1)\|00$ |
| ble | Branch on Less or Equal | 5 | opx ≤ 0 | $(opy_{29...0} + 1)\|00$ |
| bge | Branch on Greater or Equal | 6 | opx ≥ 0 | $(opy_{29...0} + 1)\|00$ |
| jmp | Jump | 7 | true | $(opy_{29...0} + 1)\|00$ |

A.4.2.3 Memory Operations i.unit=UNIT_DMEM=2

Only two memory operations are defined: load word, lw; and store word, sw. The address of the memory access is determined by opy. On a memory load, opx is ignored; whereas on a store, it becomes the value stored. A store returns opy (the computed address) as opz; this allows coding postincrement and postdecrement addressing-modes in a single instruction.

| Mnemonic | Name | i.fxn | Operation |
|---|---|---|---|
| lw | Load Word | 0 | opz := dmem[opy] |
| sw | Store Word | 1 | dmem[opy] := opx, opz := opy |

A.4.2.4 Shifter Operations i.unit=UNIT_SHFT=3

The SPAM architecture defines a restricted shifter that is capable only of logical shifts. Arithmetic shifts must be simulated using blt. The SPAM shifter can shift by one or eight. Shifts-by-eight are provided so that byte memory-operations can proceed at a reasonable speed.

| Mnemonic | Name | i.fxn | Operation |
|---|---|---|---|
| sr1 | Shift Right by One | 0 | opz := $0\|opy_{31...1}$ |
| sr8 | Shift Right by Eight | 1 | opz := $00000000\|opy_{31...8}$ |
| sl1 | Shift Left by One | 2 | opz := $opy_{30...0}\|0$ |
| sl8 | Shift Left by Eight | 3 | opz := $opy_{23...0}\|00000000$ |

A.4.2.5 Undefined Operations

Operations not yet defined are reserved for future expansion and must not be used. The behavior of the undefined operations is UNDEFINED (the machine may take any action, which includes the possibility of its hanging).

A.4.2.6 System Reset

The mechanism for causing a system reset is implementation-dependent. On system reset, the processor starts execution with pc=8 and arbitrary data in all general-purpose registers except gpr[0].

A.5 Assembly-language Conventions

The SPAM architecture uses a simple, understandable assembly-language syntax that is free from the traditional confusion about which register identifier names the operand and which names the result.

A.5.1 The SPAM Assembly Format

The SPAM assembly format is best illustrated with an example:

```
;;; Compute sum of 100 first integers
;;; Do some other things to test the processor
.=0x8
           jmp Start              ; comment
.=0x100
Start:
           li r1=100
           li r2=0U               ; upper immediate
           jmp r3=Detour          ; comment
Label:                            ; comment
           add r2=r1,r2
           sw r2,(100)
           lw r2=(r1+0xff)
           lw r2=(100)
           sub r1=r1,1
           bne r1,Label
           hlt
           jmp zero               ; shouldnt get executed
           nop
.=0x200                           ; test comment
Detour:    jmp r3
```

A.5.1.1 Assembly Instruction Syntax

In the example, we see the use of some standard assembler conventions, such as the use of "." for setting the desired memory location of the current instruction. We also see that the syntax of the instructions is <mnemonic><result register>=<operands>. Register indirect and indexed register-indirect memory-instructions are written with parentheses, similarly to the MIPS assembly format.

Labels can be used directly by the branches. Any field not specified will be assembled as zero; this has several benefits—e.g., not specifying the target register of an operation makes the target gpr[0], which means that the result shall be discarded.

A.5.1.2 Specification of Immediates

Immediates are specified either in decimal or in hexadecimal. Hexadecimal numbers must be preceded with the string 0x to flag their base. Following an immediate with the roman capital U flags it as being an "upper" immediate; i.e., it will be shifted 16 bits left before it is used.

A.5.1.3 Pseudo-instructions

There are also several pseudo-instructions in the example program that are understood by the assembler and mapped to the machine-language instructions presented earlier. The pseudo-instructions understood by the assembler are as follows:

| Pseudo-instruction | Name | Operation |
|---|---|---|
| li rz = opy | Load immediate | or rz = r0, opy |
| nop | No operation | add r0 = r0, r0 |
| not rz = opy | NOT | nor rz = 0, opy |

Notice that the nop pseudo-instruction conveniently assembles to an all-zeros instruction word.

What is claimed is:

1. An asynchronous pulse logic circuit comprising:
   a first pulse generating component for generating a sending pulse;
   a first converting component for catching and holding said sending pulse and converting said sending pulses to a first level voltage connected to said first pulse generating component;
   a second pulse generating component for generating a resetting pulse;
   a second converting component for converting said resetting pulse to a second level voltage connected to said second pulse generating component;
   a checking component for ensuring no old output is still pending;
   an N-input component connected to said first pulse generating component; and
   an N-output component connected to said first converting component whereby a STAPL left-right buffer is formed.

2. An asynchronous pulse logic circuit comprising:
   a first pulse generating component for generating a sending pulse;
   a first converting component for catching and holding said sending pulse and converting said sending pulses to a first level voltage connected to said first pulse generating component; and
   a checking component for ensuring no old output is still pending whereby said checking component is connected to said first pulse generating component and said first converting component to form a first input-output block.

3. The asynchronous pulse logic circuit of claim 2 further comprises:
   a plurality of said input-output blocks.

4. The asynchronous pulse logic circuit of claim 3 further comprises:
   an input-clearing block comprising a second converting component for converting pulses.

5. The asynchronous pulse logic circuit of claim 4 further comprises:
   an acknowledgment block comprising a second pulse generating component for generating a resetting pulse.

6. The asynchronous pulse logic circuit of claim 5 further comprises:
   a conditions block whereby said second pulse generating component is controlled by said conditions block to conditionally reset each of said plurality of input-output blocks and input clearing block.

7. The asynchronous pulse logic circuit of claim 6 wherein said conditions block further comprises:
   a third pulse generating component for generating a sending pulse; and
   a third converting component for converting said sending pulses to said first level voltage connected to said third pulse generating component.

8. The asynchronous pulse logic circuit of claim 1 wherein said first converting component is modified to store states.

9. The asynchronous pulse logic circuit of claim 8 further comprises:
   an updating component comprising an interlock component wherein an updating pulse is generated to update the input state in said first pulse generating component, whereby a state-storing circuit is formed.

10. The asynchronous pulse generating circuit of claim 1 further comprises:
    an arbiter-filter, wherein said checking component and said arbiter-filter are connected to said first pulse generating component and said first converting component to form a STAPL arbiter.

11. The asynchronous pulse generating circuit of claim 10 wherein said first pulse generating component generates a reset pulse for the input.

12. The asynchronous pulse generating circuit of claim 10 wherein said first pulse generating component further comprises an interlock component.

13. The asynchronous pulse generating circuit of claim 1 further comprises:
    a QDI buffer connected to said STAPL left-right buffer whereby STAPL-to-QDI converter is formed.

14. The asynchronous pulse generating circuit of claim 1 further comprises:
    a QDI buffer connected to said STAPL left-right buffer whereby QDI-to-STAPL converter is formed.

15. An asynchronous pulse logic circuit comprising:
    a first pulse generating component for generating a sending pulse;
    a first converting component for converting pulses to a first level voltage connected to said first pulse generating component;
    a second pulse generating component for generating a resetting pulse;
    a second converting component for converting pulses to a second level voltage connected to said second pulse generating component;
    a checking component for ensuring no old output is still pending;
    an N-input component connected to said first pulse generating component; and
    an N-output component connected to said first converting component whereby a STAPL left-right buffer is formed.

16. The asynchronous pulse logic circuit of claim 15 wherein said checking component is connected to said first pulse generating component and said first converting component to form a first input-output block.

17. The asynchronous pulse logic circuit of claim 16 further comprises:
    a plurality of said input-output blocks.

18. The asynchronous pulse logic circuit of claim 17 further comprises:
    an input-clearing block comprising a second converting component for converting pulses.

19. The asynchronous pulse logic circuit of claim 18 further comprises:
    an acknowledgment block comprising a second pulse generating component for generating a resetting pulse.

20. The asynchronous pulse logic circuit of claim 19 further comprises:
    a conditions block whereby said second pulse generating component is controlled by said conditions block to conditionally reset each of said plurality of input-output blocks and input clearing block.

21. The asynchronous pulse logic circuit of claim 20 wherein said conditions block further comprises:
    a third pulse generating component for generating a sending pulse; and
    a third converting component for converting pulses to said first level voltage connected to said third pulse generating component.

22. An asynchronous pulse logic circuit comprising:
- a first pulse generating component for generating a sending pulse;
- a first converting component for converting pulses to a first level voltage connected to said first pulse generating component wherein said first converting component is modified to store states; and
- an updating component comprising an interlock component wherein an updating pulse is generated to update the input state in said first pulse generating component, whereby a state storing circuit is formed.

23. The asynchronous pulse generating circuit of claim 22 further comprises:
- an arbiter-filter and
- a checking component for ensuring no old output is still pending whereby said checking component and said arbiter-filter are connected to said first pulse generating component and said first converting component to form a STAPL arbiter.

24. The asynchronous pulse generating circuit of claim 23 wherein said first pulse generating component generates a reset pulse for the input.

25. The asynchronous pulse generating circuit of claim 23 wherein said first pulse generating component further comprises an interlock component.

26. The asynchronous pulse generating circuit of claim 15 further comprises:
- a QDI buffer connected to said STAPL left-right buffer whereby STAPL-to-QDI converter is formed.

27. The asynchronous pulse generating circuit of claim 15 further comprises:
- a QDI buffer connected to said STAPL left-right buffer whereby QDI-to-STAPL converter is formed.

* * * * *